(12) United States Patent
Snider et al.

(10) Patent No.: US 8,457,325 B2
(45) Date of Patent: Jun. 4, 2013

(54) ACOUSTICAL WINDOW ASSEMBLY FOR VEHICLE

(75) Inventors: Darin J. Snider, Holland, MI (US); Greg Rizzo, Bruce, MI (US); Mats Olle Gustavsson, Helsingborg (SE)

(73) Assignee: Magna International, Inc. (CA)

( * ) Notice: Subject to any disclaimer, the term of this patent is extended or adjusted under 35 U.S.C. 154(b) by 225 days.

(21) Appl. No.: 12/741,676

(22) PCT Filed: Nov. 6, 2008

(86) PCT No.: PCT/US2008/082583
§ 371 (c)(1),
(2), (4) Date: May 6, 2010

(87) PCT Pub. No.: WO2009/061885
PCT Pub. Date: May 14, 2009

(65) Prior Publication Data
US 2010/0290639 A1    Nov. 18, 2010

Related U.S. Application Data

(60) Provisional application No. 60/985,801, filed on Nov. 6, 2007.

(51) Int. Cl.
*H04B 1/00* (2006.01)
*H04R 25/00* (2006.01)
*A61F 11/06* (2006.01)

(52) U.S. Cl.
USPC .... 381/86; 381/152; 296/146.15; 296/146.16

(58) Field of Classification Search
USPC ............... 381/86, 190, 191, 152; 310/334, 310/316.01, 322, 324, 326; 296/146.1, 146.2, 296/146.15, 146.16
See application file for complete search history.

(56) References Cited

U.S. PATENT DOCUMENTS 4,514,599 A * 4/1985 Yanagishima et al. ........ 381/152
5,923,765 A * 7/1999 Elliott ............................. 381/86
(Continued)

FOREIGN PATENT DOCUMENTS

JP   2004-343453   12/2004
WO   WO9716817    5/1997

OTHER PUBLICATIONS

European Search Report dated Sep. 12, 2012 from corresponding European patent application No. 08847921.7.

*Primary Examiner* — Xu Mei
(74) *Attorney, Agent, or Firm* — Gardner, Linn, Burkhart & Flory, LLP

(57) ABSTRACT

An acoustical window assembly for a vehicle includes a window panel and mounting portions for mounting respective perimeter regions of the window panel to a vehicle structure. A first mounting portion substantially fixedly mounts a first perimeter region of the window panel relative to the vehicle structure, while a second mounting portion mounts a second perimeter region of the window panel to the vehicle structure and includes a flexible element to allow for movement of the second perimeter region of the window panel toward and away from the vehicle structure. An actuating assembly is positioned at an actuating region of the window panel and has a substantially rigid interface element that engages the actuating region of the window panel. The actuating assembly is operable to vibrate the window panel via vibration of the substantially rigid interface element relative to the vehicle structure.

20 Claims, 42 Drawing Sheets

U.S. PATENT DOCUMENTS

| | | |
|---|---|---|
| 6,023,123 A | 2/2000 | Petiel |
| 7,236,602 B2 | 6/2007 | Gustavsson |
| 7,247,976 B2 | 7/2007 | Sashida et al. |
| 2006/0048452 A1 | 3/2006 | Sweeney et al. |
| 2006/0106500 A1 | 5/2006 | Allaei |
| 2007/0057601 A1 | 3/2007 | Kawase et al. |
| 2007/0242844 A1 | 10/2007 | Harman |
| 2010/0290639 A1* | 11/2010 | Snider et al. .................... 381/86 |

* cited by examiner

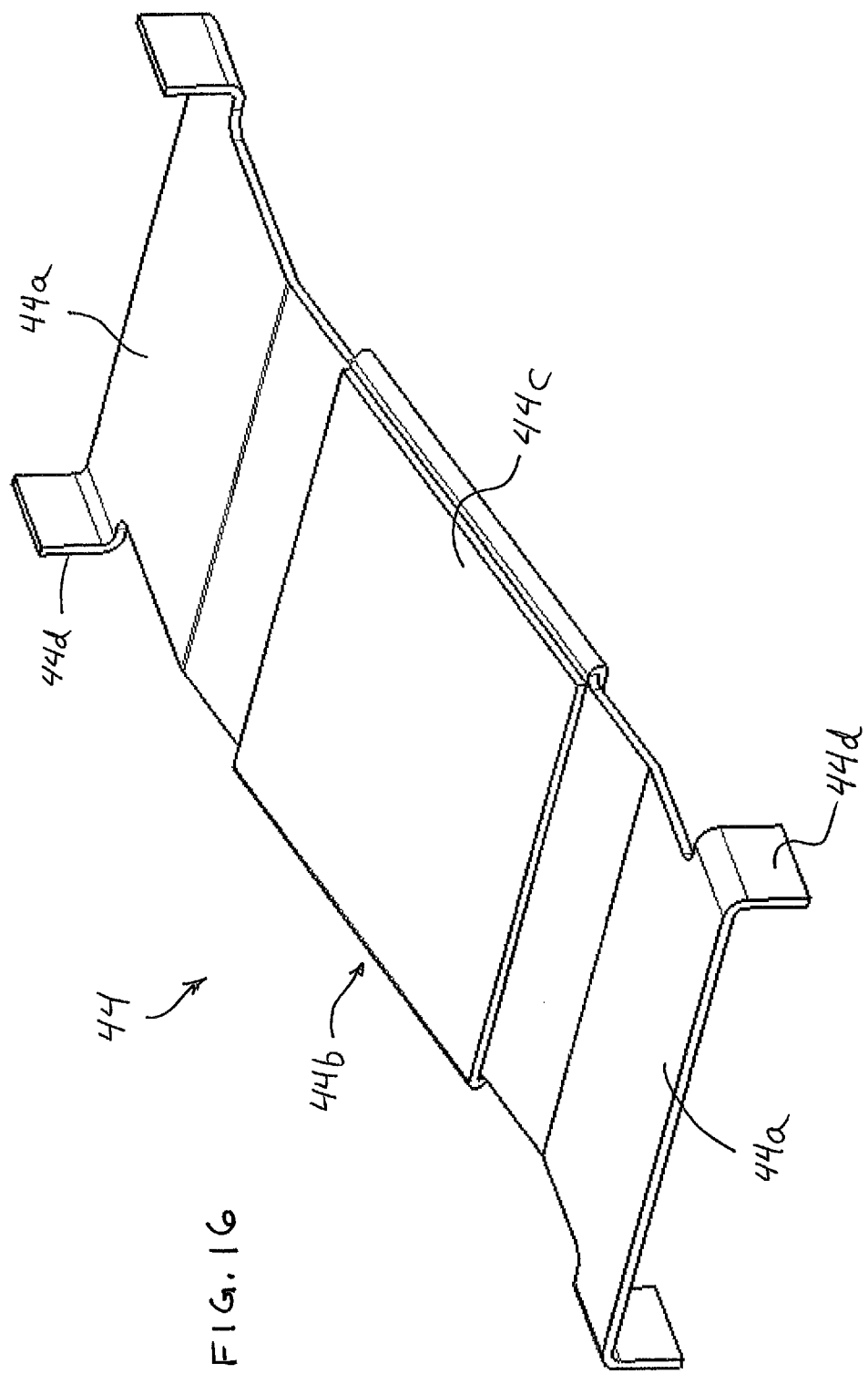

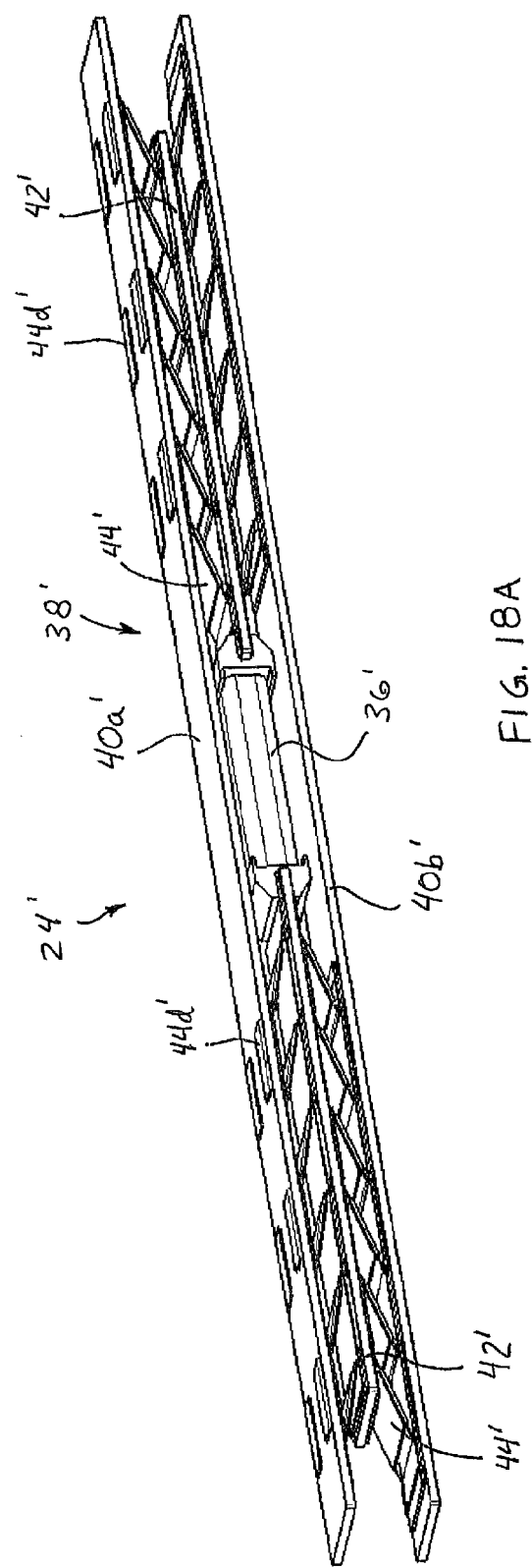

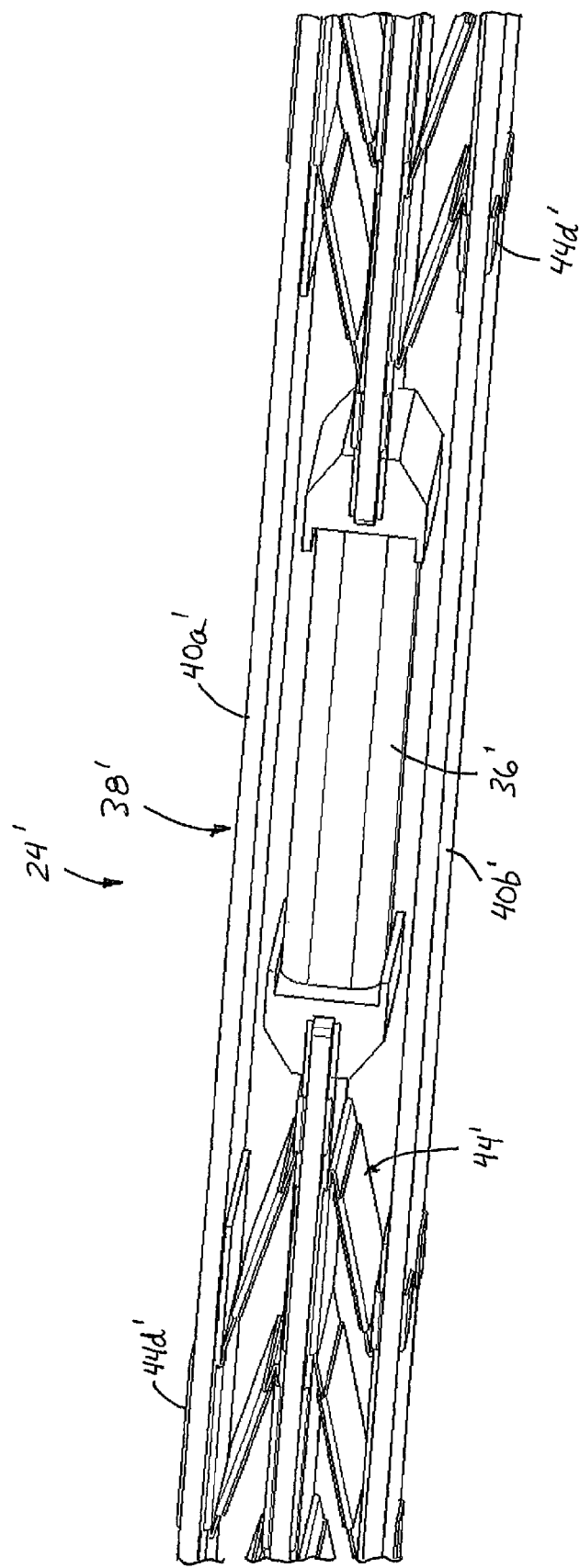

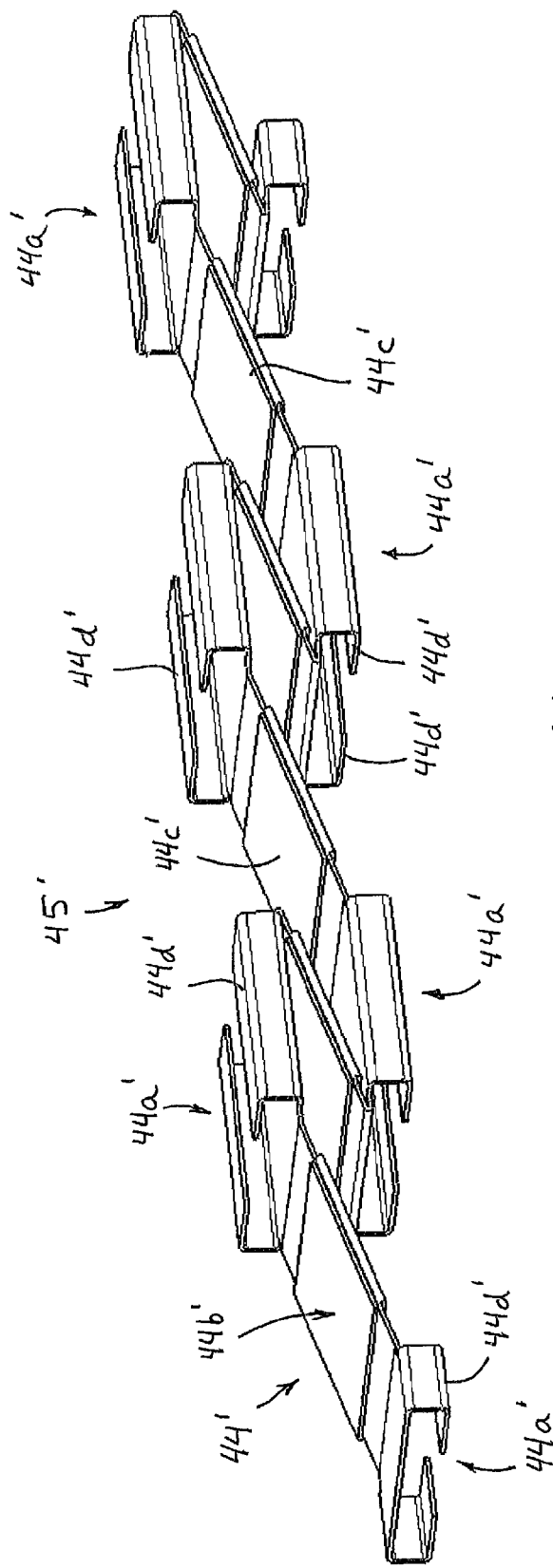

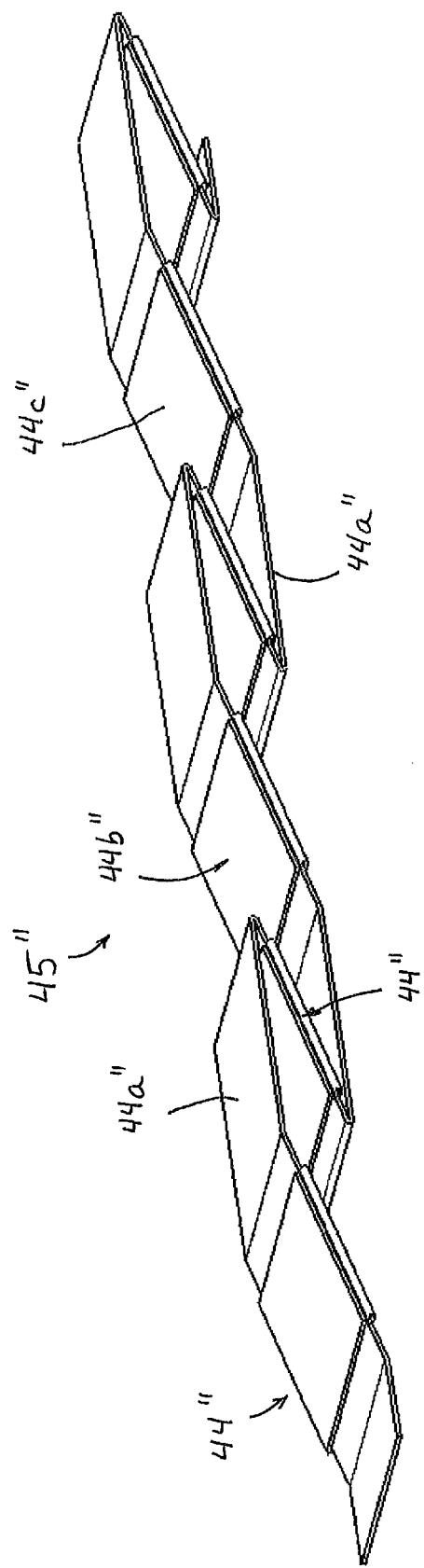

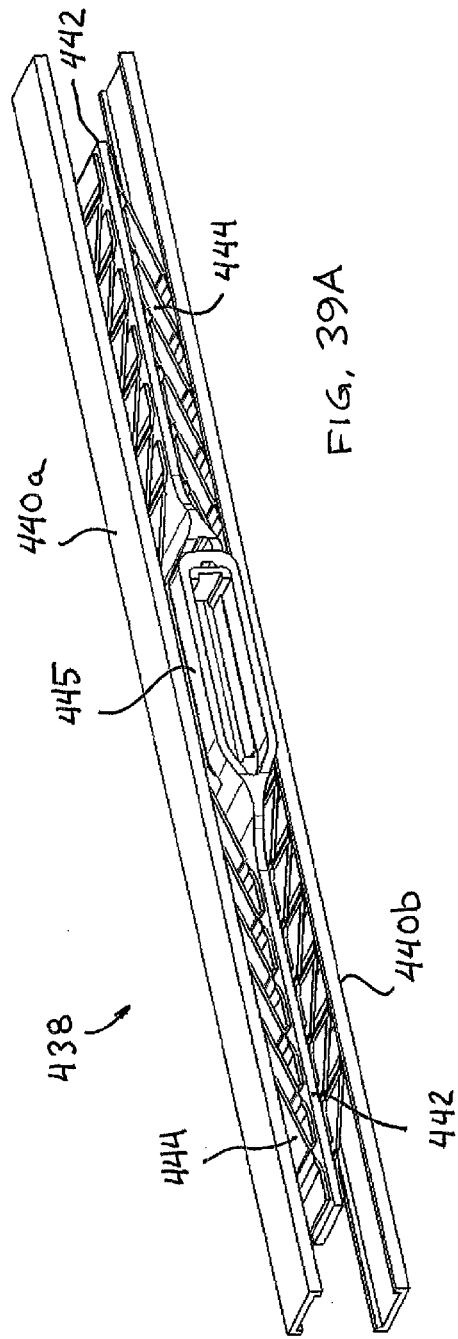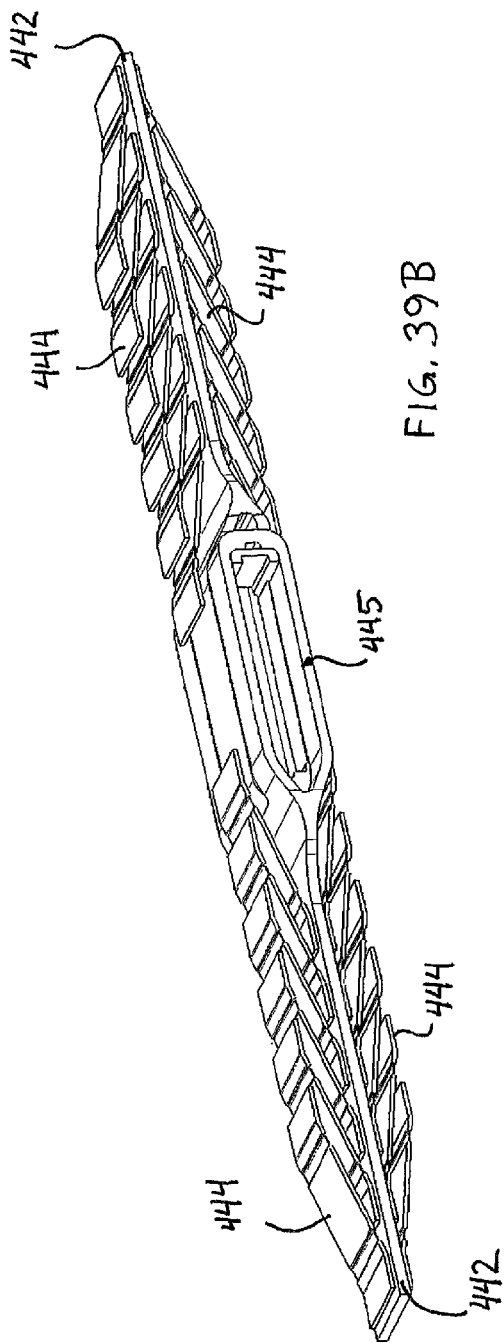

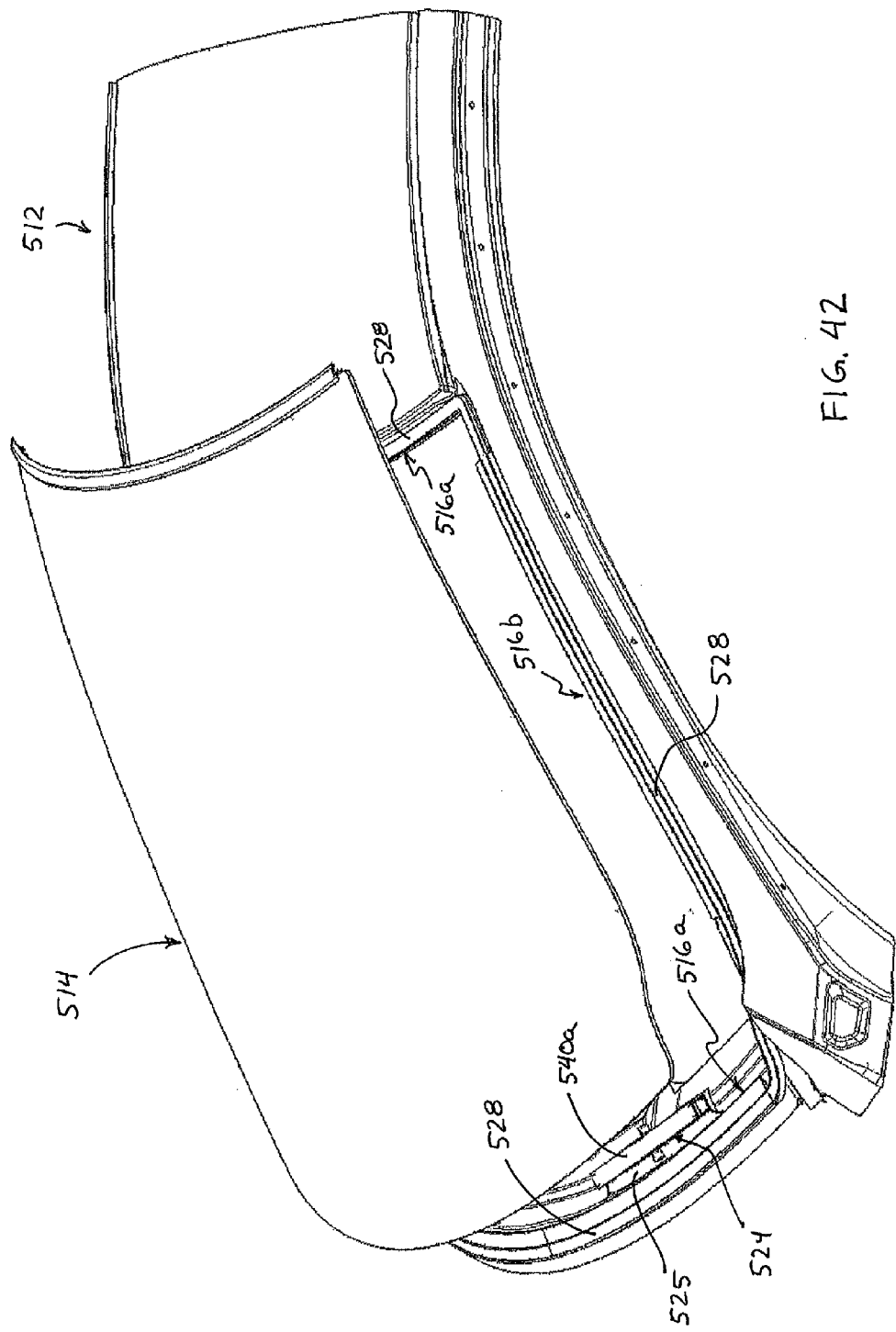

ACOUSTICAL WINDOW ASSEMBLY FOR VEHICLE

CROSS REFERENCE TO RELATED APPLICATIONS

The present application claims the benefit of U.S. provisional application Ser. No. 60/985,801, filed Nov. 6, 2007, which is hereby incorporated herein by reference in its entirety.

FIELD OF THE INVENTION

The present invention relates to a window assembly for a vehicle and, more particularly, a window assembly that includes a perimeter frame and a window panel and that may be installed in a vehicle as a unit or as separate components.

BACKGROUND OF THE INVENTION

It is known to provide a window assembly in a vehicle that includes a perimeter frame that is mounted or attached to a vehicle in a variety of ways, such as by adhesive or fasteners or the like. The window assembly is substantially sealed to the vehicle and around its perimeter edge regions to limit leakage at the window.

Sound systems for vehicles have become increasingly complicated and sophisticated as vehicle owners desire enhanced sound quality in their vehicles. However, vehicle manufacturers often encounter packaging difficulties when attempting to, fit large speakers, such as sub-woofers or the like, within the vehicle to provide the desired enhanced sound quality. It has been proposed to provide an audio speaker for a vehicle sound system by vibrating a panel of the vehicle, such as a window or trim panel or the like of the vehicle. Such audio devices have had the vibrating device or actuator disposed directly at the panel, and thus are highly dependant on the precise location of the actuator at the glass, typically at a central region of the panel or panel portion that is to be vibrated, and are highly dependent on the resonant frequencies of the panel.

SUMMARY OF THE INVENTION

The present invention provides a window assembly that includes a transparent glass window panel (or at least partially transparent or translucent, such as a tinted glass window panel or the like, or other type of window panel, such as a polycarbonate or plastic or laminate window panel or the like) and an actuating device or actuating assembly operable to vibrate the window panel to produce audible sound for a vehicle sound system, such as for a vehicle radio or CD player or a telematics system of the vehicle. The window assembly includes a frame that partially encompasses the perimeter of the window panel, whereby the actuating assembly is positioned at or near a perimeter edge or region of the window panel and functions to vibrate the window panel to produce the desired acoustics or audible sound.

According to an aspect of the present invention, an acoustical window assembly or glass panel speaker or window speaker includes a window panel or transparent panel, a first mounting portion for mounting a first perimeter region of the window panel to a vehicle structure, a second mounting portion for mounting a second perimeter region of the window panel to the vehicle structure, and an actuating assembly. The first mounting portion substantially fixedly mounts the first perimeter region of the window panel relative to the vehicle structure and the second mounting portion includes a flexible element to allow for movement of the second perimeter region of the window panel toward and away from the vehicle structure. The actuating assembly is positioned at an actuating region of the window panel and has a substantially rigid interface element engaging the actuating region of the window panel. The actuating assembly is operable to vibrate the window panel via vibration of the interface element relative to the vehicle structure.

Vibration of the window panel generates audible sounds when the actuating assembly is operated, so as to function as a speaker for the vehicle audio system or telematics system or the like. The window panel may be vibrated at a frequency between about 20 Hz and about 200 Hz or thereabouts when the actuating assembly is operated to generate the desired range of sounds. Optionally, the window panel may comprise any window of the vehicle, such as, for example, a rear window or backlite of a vehicle, a windshield of a vehicle, a side window of a vehicle, a side door window of a vehicle, a moonroof of a vehicle or a sunroof of a vehicle. The present invention is particularly suitable for application at a fixed window of a vehicle, such as a windshield, rear backlite, side window, moonroof or the like. However, it is envisioned that aspects of the present invention may be suited for application at movable windows as well, such as, for example, in liftgate window applications (such as, for example, conventional liftgates and/or glass liftgates with the hinges and latches and other hardware bonded to the glass or polycarbonate or laminate window panel) and sunroof applications and/or the like.

The actuating assembly or actuator may comprise a piezoelectric actuator that functions to vibrate at or near the perimeter portion of the window panel. The piezoelectric actuator may function to excite an exciter device that converts the vibration of the actuator to the desired vibration or movement at the window panel (such as a movement toward and away from the window panel to impart the inward/outward movement or vibration of the window panel at the perimeter portion of the window panel). A perimeter seal along the frame portion or mounting portion of the window panel substantially seals the window panel at the vehicle during the movement or vibration of the window panel.

The exciter device provides a substantially rigid interface at the window panel and at the vehicle frame or sheet metal to limit or substantially preclude flexing of the interface portions of the exciter. Thus, the actuator and exciter device function to provide substantially uniform or non-bending movement or vibration of the window panel with minimal flexing of the exciter and/or the perimeter portion of the window panel during operation of the actuator. Thus, the present invention avoids bending motion of the window panel during operation of the actuator.

According to another aspect of the present invention, a window assembly for a vehicle comprises:

a window panel having a first perimeter region and a second perimeter region;

a first mounting portion for mounting said first perimeter region of said window panel to a vehicle structure, said first mounting portion substantially fixedly mounting said first perimeter region of said window panel relative to the vehicle structure;

a second mounting portion for mounting said second perimeter region of said window panel to the vehicle structure, said second mounting portion including a flexible element to allow for movement of said second perimeter region of said window panel toward and away from the vehicle structure;

an actuating assembly, said actuating assembly positioned at an actuating region of said window panel, said actuating assembly operable to vibrate said window panel via vibration of an interface element relative to the vehicle structure; and wherein said vibration of said window panel generates audible sounds when said actuating assembly is operated, and wherein said window panel is vibrated at a frequency between about 20 Hz and 200 Hz when said actuating assembly is operated.

According to another aspect of the present invention, a window assembly for a vehicle comprises:

a window panel having a first perimeter region and a second perimeter region;

a first mounting portion for mounting said first perimeter region of said window panel to a vehicle structure, said first mounting portion substantially fixedly mounting said first perimeter region of said window panel relative to the vehicle structure;

a second mounting portion for mounting said second perimeter region of said window panel to the vehicle structure, said second mounting portion including a flexible element to allow for movement of said second perimeter region of said window panel toward and away from the vehicle structure;

an actuating assembly, said actuating assembly being positioned at an actuating region of said window panel, said actuating assembly comprising an actuating device and an exciter device, said exciter device comprising an interface element engaging said actuating region of said window panel and a mounting element substantially fixedly securing a base portion of said exciter device to the vehicle structure;

wherein said actuating device is oriented to impart movement in a direction generally along a surface of said actuating region of said window panel and said exciter device imparts movement in a direction generally normal to said surface of said actuating region of said window panel in response to actuation of said actuating device;

wherein said exciter device includes at least one biasing element that exerts a preload force at opposite ends of said actuating device; and wherein said actuating assembly is operable to vibrate said window panel via vibration of said interface element relative to the vehicle structure.

Optionally, the actuating assembly may comprise a piezoelectric actuator that is operable to vibrate said actuating region of said window panel. The exciter device may include at least one biasing element that exerts a preload force at opposite ends of said piezoelectric actuator.

According to another aspect of the present invention, a window assembly for a vehicle comprises:

a window panel having a first perimeter region and a second perimeter region;

a first mounting portion for mounting said first perimeter region of said window panel to a vehicle structure, said first mounting portion substantially fixedly mounting said first perimeter region of said window panel relative to the vehicle structure;

a second mounting portion for mounting said second perimeter region of said window panel to the vehicle structure, said second mounting portion including a flexible element to allow for movement of said second perimeter region of said window panel toward and away from the vehicle structure;

an actuating assembly, said actuating assembly being positioned at an actuating region of said window panel, said actuating assembly comprising an actuating device and an exciter device, said exciter device comprising an interface element engaging said actuating region of said window panel and a mounting element substantially fixedly securing a base portion of said exciter device to the vehicle structure;

wherein said exciter device comprises a movable rod interconnected with said mounting element and said interface element via a plurality of ribs arranged diagonally between said movable rod and said interface element and said mounting element;

wherein said ribs have end sections generally parallel to said movable rod and said interface element and said mounting element, and wherein said ribs have bend portions at a junction between said end sections and a center section of said ribs that is diagonal to said movable rod and said interface element and said mounting element, and wherein said center section of said ribs comprise at least one narrowed section established at said center section and remote from said bend portions, wherein said narrowed section facilitates flexing of said rib during operation of said actuating device;

wherein said actuating device is oriented to impart movement in a direction generally along said surface of said actuating region of said window panel and said exciter device imparts movement in a direction generally normal to said surface of said actuating region of said window panel in response to actuation of said actuating device; and wherein said actuating assembly is operable to vibrate said window panel via vibration of said interface element relative to the vehicle structure.

Optionally, said actuating assembly may comprise a piezoelectric actuator that is operable to vibrate said actuating region of said window panel.

According to another aspect of the present invention, a method of manufacturing a vibrating device for vibrating a window panel of a vehicle comprises:

providing a first mounting portion for substantially fixedly mounting a first perimeter region of said window panel to a vehicle structure, and providing a second mounting portion for mounting a second perimeter region of the window panel to the vehicle structure, said second mounting portion including a flexible element to allow for movement of the second perimeter region of the window panel toward and away from the vehicle structure; and providing an actuating assembly, said actuating assembly comprising an actuating device and an exciter device, said exciter device comprising a window interface element for engaging an actuating region of a window panel when said actuating assembly is installed at a window panel of a vehicle and a mounting element substantially fixedly securing a base portion of said exciter device to the vehicle structure when said actuating assembly is installed at a window panel of a vehicle;

forming a plurality of ribs for said exciter device by forming generally parallel end sections and a center section between two bend portions of said ribs, said center section being angled or diagonal to said generally parallel end sections;

wherein forming said plurality of ribs for said exciter device comprises establishing narrowed sections at said center sections of said ribs to facilitate flexing of said ribs during operation of said actuating device, wherein said narrowed sections are established via at least one of (a) chemical milling and (b) photo etching; and forming said exciter device by interconnecting a movable rod with said mounting element and said interface element via said plurality of ribs, and wherein said center sections of said plurality of ribs are arranged diagonally between said movable rod and said interface element and said mounting element, and wherein said narrowed sections facilitate flexing of said ribs during operation of said actuating device.

Optionally, said narrowed sections of said center sections may be established remote from said bend portions at the junction between said end portions and said center section. Optionally, said narrowed sections of said center sections are established by chemical etching or photo etching of those sections for a predetermined period of time to establish the desired or appropriate or predetermined material thickness of said narrowed sections (where the material at the narrowed sections is dissolved or chemically removed until the narrowed sections are at a desired or appropriate or predetermined thickness while the center section and end portions otherwise remain at the initial material thickness). Optionally, said actuating device may be oriented to impart movement in a direction generally along the surface of the actuating region of the window panel when said actuating assembly is installed at a window panel of a vehicle and said exciter device imparts movement in a direction generally normal to the surface of the actuating region of the window panel in response to actuation of said actuating device when said actuating assembly is installed at a window panel of a vehicle.

Therefore, the present invention provides an acoustic window assembly for a vehicle that vibrates the window panel while substantially sealing the window panel at the vehicle. The present invention thus provides an enhanced acoustical device for a vehicle sound system that utilizes a panel or window of a vehicle and thus does not interfere with the interior space of the vehicle cabin and/or other space at the cabin that may be utilized for other vehicle components or the like. Because the acoustic window assembly of the present invention may replace or supplement one or more speakers and/or subwoofers of the vehicle sound system, the acoustic window assembly may achieve substantial weight reduction over typical or conventional audio or sound systems for vehicles. The actuating assembly of the acoustic window assembly of the present invention includes an actuating device, such as a piezoelectric actuating device or the like, and an exciter or amplifying device, which engages the window panel and transfers the pulse of the actuating device along a region of the window panel to spread out the forces and movements/pulses at the window panel. The performance of the acoustic window assembly thus may not be so highly dependent on the precise location of the actuating assembly at the window panel as the acoustic devices of the prior art. The present invention thus allows for placement of the actuator and exciter device at a perimeter region of a window panel and avoids placement of an actuator at a central region of the vibrating panel. The present invention provides a speaker that provides space savings or space reduction and/or weight reduction to the sound system of the vehicle and may include a power system that provides power savings to the sound system of the vehicle. Also, the present invention provides a vibratable window panel that is sufficiently sealed around its perimeter to limit or preclude leaking around the window panel. Thus, the present invention is highly suitable for use at a window panel of a vehicle and overcomes the shortcomings of the prior art devices.

These and other objects, advantages, purposes and features of the present invention will become apparent upon review of the following specification in conjunction with the drawings.

BRIEF DESCRIPTION OF THE DRAWINGS

FIG. 16 is an enlarged perspective view of a rib element suitable for the exciter of FIGS. 13 and 14;

FIG. 18A is a perspective view of another actuating device and exciter suitable for use with the acoustic window assembly of the present invention;

FIG. 19 is an enlarged perspective view of the actuating device at the central portion of the exciter of FIGS. 18A and 18B;

FIG. 20 is an enlarged perspective view of a rib element suitable for the exciter of FIGS. 18A and 18B;

FIG. 21 is an enlarged perspective view of another rib element suitable for the exciter of FIGS. 18A and 18B;

FIGS. 39A and 39B are perspective views of a pull-type actuating device and exciter assembly suitable for use with the acoustic window assembly in accordance with the present invention;

FIG. 42 is a perspective view of the installed actuating assembly and seal module with a windshield being installed to the actuating assembly and seal module as a separate component.

DESCRIPTION OF THE PREFERRED EMBODIMENTS

Figure 1:
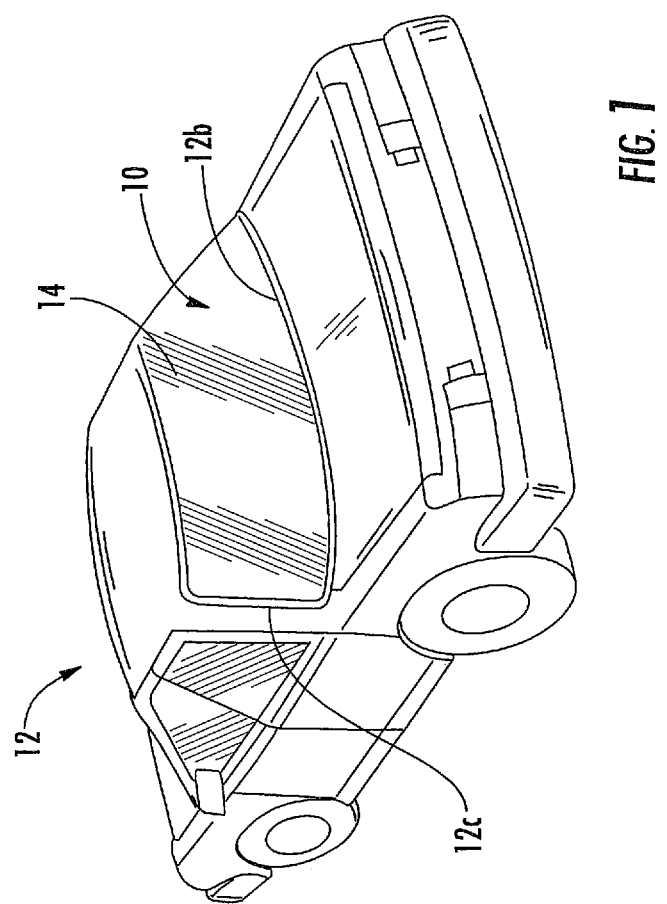
FIG. 1 is a perspective view of a vehicle with an acoustic window assembly in accordance with the present invention.
Figure 2:
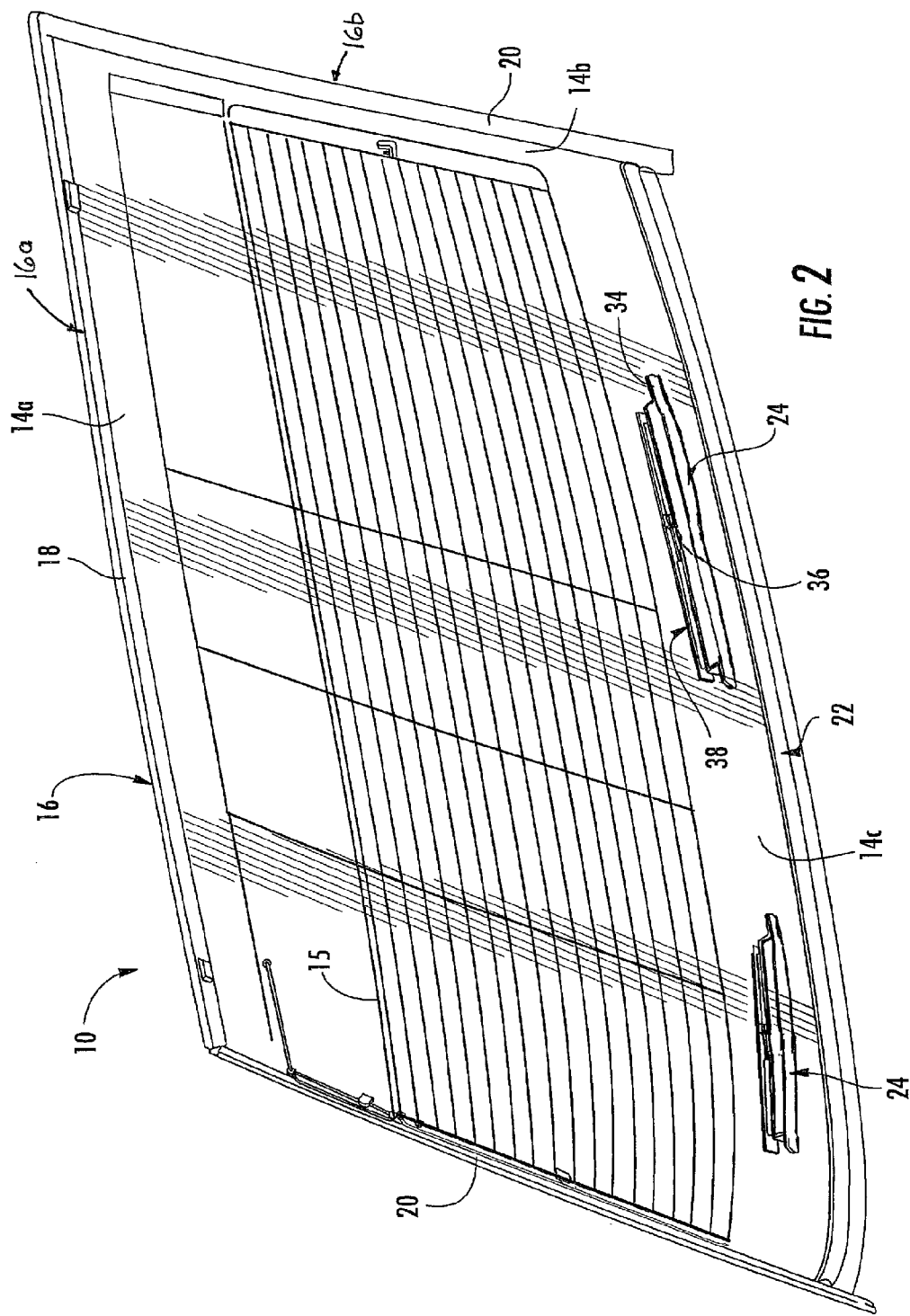
FIG. 2 is a perspective view of an acoustic window assembly of the present invention.

Referring now to the drawings and the illustrative embodiments depicted therein, an acoustic window assembly or module or panel loudspeaker 10 is mounted to or attached to a vehicle 12 and is operable to vibrate or move a window panel or glass panel or transparent panel 14 (such as a transparent window panel or an at least partially transparent or translucent window panel, such as a tinted glass window panel or the like) of the window assembly 10 to generate sound within the vehicle cabin (FIG. 1). As shown in FIG. 2, window assembly 10 includes a frame portion 16 that includes an upper frame portion or mounting portion 16a along an upper or fixed perimeter portion 14a of window panel 14 for mounting the upper perimeter portion of the window panel to the vehicle sheet metal and a lower frame portion or mounting portion 16b along the sides and lower perimeter portions 14b, 14c of window panel 14 for movably or vibratably mounting the side and lower portions of the window panel to the vehicle sheet metal. Window assembly 10 thus is attachable or mountable to a vehicle and sealed relative to the vehicle about its perimeter, while still allowing movement or vibration at least one of the perimeter portions of the window in response to an output of an actuating assembly 24 so as to vibrate the window panel at a desired frequency as may be dictated or driven by the vehicle sound or audio system. Window assembly 10 may utilize aspects of the window assemblies described in PCT Application No. PCT/US2006/040100, filed Oct. 12, 2006, which is hereby incorporated herein by reference in its entirety.

Prior audio devices typically make use of the bending resonances of the panel or membrane by exciting the membrane in a controlled manner using vibrating devices or actuators. The acoustic window assembly of the present invention is designed to control the surface vibration to achieve a motion of the substantially rigid window panel that is principally the motion of a rigid surface or substrate. The targeted motion may be substantially uniform over the surface or substrate, and the panel may have one side or perimeter region of the panel substantially fixed and the opposite side or opposite perimeter region actuated or vibrated or moved, in order to achieve an essentially linear variation of the vibration amplitude between the fixed side or fixed perimeter region and the actuated side or actuated perimeter region. The vibrating device or actuator of the acoustic window panel is disposed directly at the panel but at or near a perimeter region of the panel so as to avoid interference with the ability of a person to view through the transparent or substantially transparent window panel. The vibrating device or actuator of the acoustic window panel is thus disposed at and substantially hidden at a perimeter region of a window panel and utilizes a structural surface of the vehicle to react against to provide the desired vibrational frequency and amplitudes to achieve the desired range of audible sound.

In the illustrated embodiment, window assembly 10 is a rear window assembly or backlite assembly. Optionally, the window panel 14 may include heater elements 15 or the like disposed or established over at least a portion of the window panel for defogging or defrosting the window panel, as is known in the automotive window arts. One or more actuating assemblies 24 may be positioned at the window panel, such as generally at or near the bottom or lower perimeter portion 14c of window panel 14, to excite or vibrate the window panel at or near the lower perimeter region of the window panel and remote from the generally central portion of the window panel through which a driver or occupant looks to view rearward of the vehicle. For example, and as shown in FIG. 2, two actuating assemblies 24 may be spaced apart along a lower region of the window panel and may be cooperatively operable (such as in the manner discussed below) to vibrate or move the window panel to produce or generate the desired vibration and/or acoustics and audible sounds. Optionally, the window panel may include a frit layer or darkened layer or area 14d at the location of the actuating assemblies 24 so that the actuating assemblies are not readily viewable through the window panel by a person outside of the vehicle.

The actuating assemblies 24 include an actuating device 36 and an exciter device or assembly 38. The actuating device is operable to pulse or vibrate while the exciter device translates the vibration of the actuating device into a high force at the window panel and with a greater stroke than the stroke of the actuating device, as discussed below. The exciter device provides a substantially rigid, non-bending engagement with the window panel so as to vibrate the window panel in a uniform manner without flexing of the exciter interface and/or the window panel. In applications with two actuating assemblies, the actuating devices are preferably synchronized and operable substantially in unison to provide a uniform movement of the lower perimeter region of the window panel to provide a uniform, non-bending or non-flexing movement of the window panel. The window panel may comprise a substantially stiff glass panel (or other suitable material) to reduce or limit flexing of the window panel during operation of the actuating assembly or assemblies. The non-bending vibration or motion or single mode wave motion of the window panel of the acoustic window assembly of the present invention provides enhanced sound quality and thus provides an enhanced sound system over prior art panel vibrating mechanisms, which typically vibrate plastic flexible panels at a central region of the panel.

In the illustrated embodiment, window assembly 10 includes a generally rectangular and curved window panel that is mounted to a vehicle frame or sheet metal at a rear portion of the vehicle. The window frame portion 16 encapsulates the perimeter portions of window panel 14 around the perimeter portions or edges of the generally rectangular window panel. The window frame portion may substantially restrain or secure the upper perimeter edge portion of the window panel and may partially restrain the side perimeter edge portions and lower perimeter edge portion of the window panel.

Although shown and described as having the upper perimeter portion of the window panel fixed and the sides and lower perimeter portions movably sealed with the actuating device at the lower perimeter portion of the window panel, clearly, the frame portion may substantially fix other perimeter portions while leaving other portions partially restricted, without affecting the scope of the present invention. Optionally, the actuating device may be at any perimeter portion of the window. Also, although shown and described as being a rear window or backlite of a vehicle, it is envisioned that the acoustic window assembly of the present invention is suited for applications at any window of the vehicle, such as a side window or side door window or sunroof or moonroof or windshield or the like of the vehicle. The window panel may also be any shape, such as a generally rectangular shape or a generally triangular shape (whereby a portion of one or more perimeter edge portions may be substantially fixed, while a portion of one or more other perimeter edge portions may be partially restricted), without affecting the scope of the present invention. Also, although described above as a glass window panel, the window panel may comprise any suitable material, such as glass, polycarbonate, glass/laminate combinations, and/or the like, while remaining within the spirit and scope of the present invention. The window panel may comprise a transparent material that may comprise a substantially clear material and/or may be tinted or otherwise made partially transparent or translucent (such as for a sunroof application where the window panel may be substantially tinted to reduce transmission of light therethrough), while remaining within the spirit and scope of the present invention. Thus, it is envisioned that the acoustic window assembly of the present invention may be applicable at any window of a vehicle, irrespective of the materials of the window panel and/or degree of transparency of the window panel and/or the like.

Frame portion 16 may comprise a polymeric or plastic frame portion, such as a PVC frame portion or TPE frame portion or rubber or elastomeric frame portion (or a frame portion comprising any other suitable material, such as, for example, an ionomer, such as CLARIX® ionomer material commercially available from A. Schulman of Akron, Ohio, or the like) that attaches and seals the perimeter portions of the window panel relative to the vehicle sheet metal. Optionally, the frame portion may provide an encapsulation of the perimeter portions of the window panel or may be bonded or adhered to the inner surface of the window panel along the perimeter portions of the window panel to provide a generally flush mounting of the window panel relative to the vehicle body, such that an outer surface of the window panel is substantially flush or co-planar with the adjacent body panels of the vehicle. Frame portion 16 may be formed utilizing aspects of the frame portions or encapsulated window modules of the types described in U.S. Pat. Nos. 6,669,267; 6,729,674; 6,572,176; 6,394,529; 6,299,235; 6,220,650, which are hereby incorporated herein by reference in their entireties. The window panel 14 is attached to or bonded or adhered to the frame portions along the respective perimeter portions (such as via any suitable adhesive or bonding material, such as, for example, a one component urethane adhesive), and the frame portions may be bonded or adhered or fastened or otherwise attached (such as via any suitable adhesive or bonding material and/or fasteners) to a metallic frame or sheet metal of the vehicle, so as to secure and seal the frame portions relative to the vehicle.

The upper frame portion 16a includes an upper sealing and mounting member 18 that substantially seals against the upper perimeter portion 14a of the window panel to limit leakage between the window panel and the upper frame portion. The upper portion of the window panel may be sealed or adhered or affixed to the frame portion via any suitable adhesive or bonding material, such as a urethane adhesive, such as, for example, a one component urethane adhesive or other suitable adhesive or bonding material, while remaining within the spirit and scope of the present invention. Similarly, the upper sealing and mounting member 18 of the frame portion may be attached or affixed to the vehicle frame or sheet metal via any suitable adhesive or bonding material, while remaining within the spirit and scope of the present invention.

The lower frame portion 16b includes a pair of side frame portions 20 extending along the opposite side perimeter portions 14b of window panel 14 and a lower frame portion 22 along a lower or free perimeter portion 14c of window panel 14 to seal the side perimeter portions 14b and lower perimeter portion 14c of window panel 14 against the vehicle while allowing the window panel 14 to vibrate or move during vibration of a vibrating or actuating device or actuating assembly 24, as discussed below. Thus, the upper perimeter portion 14a of window panel 14 may be substantially fixedly secured and sealed relative to the vehicle frame, while the side frame portions 20 and lower portion 22 of window frame 16 partially retain or restrain the respective perimeter portions of the window panel along the vehicle frame.

Figure 3:
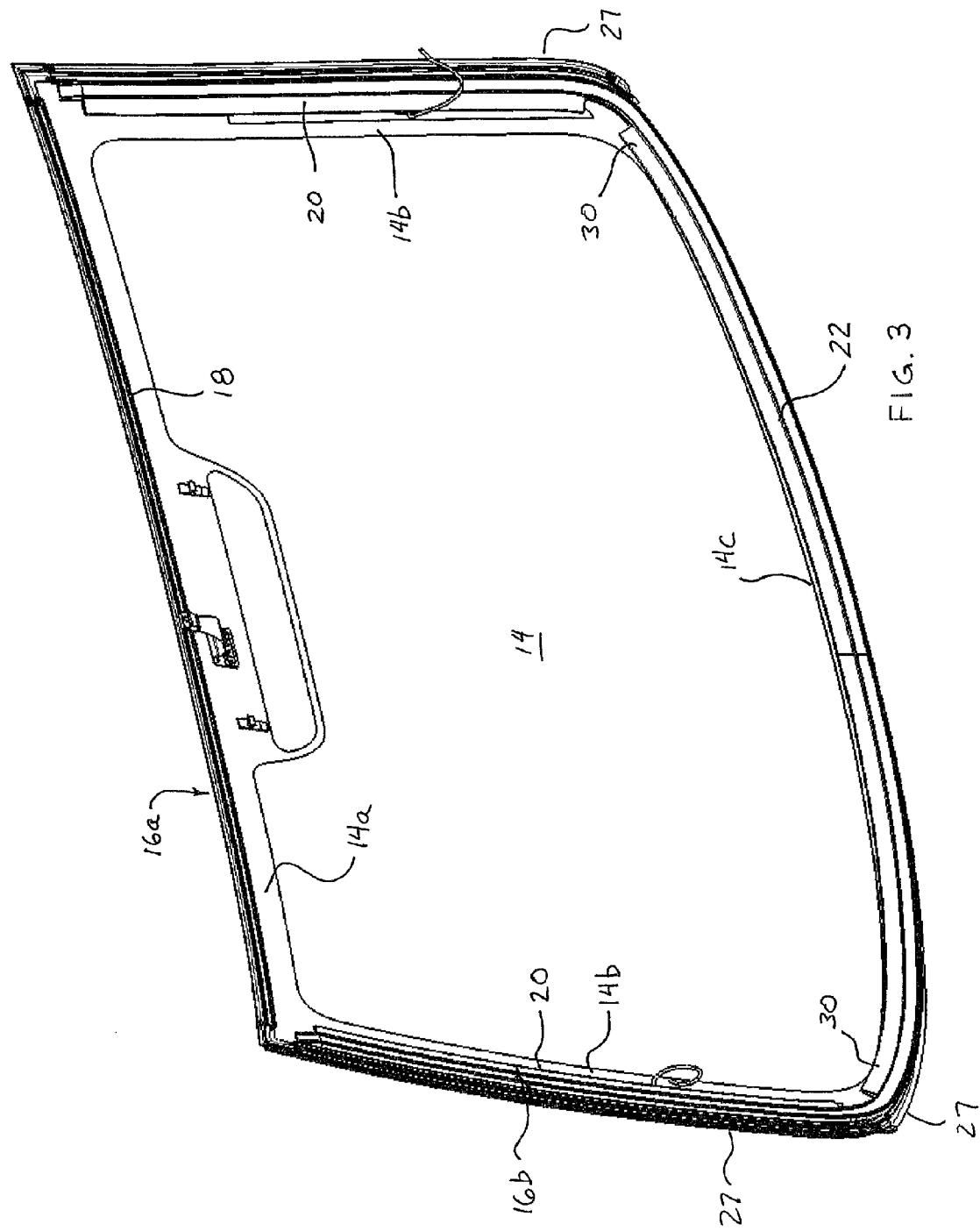
FIG. 3 is an interior perspective view of a window panel suitable for use with the acoustic window assembly of the present invention, shown with a perimeter mounting element in accordance with the present invention.
Figure 4:
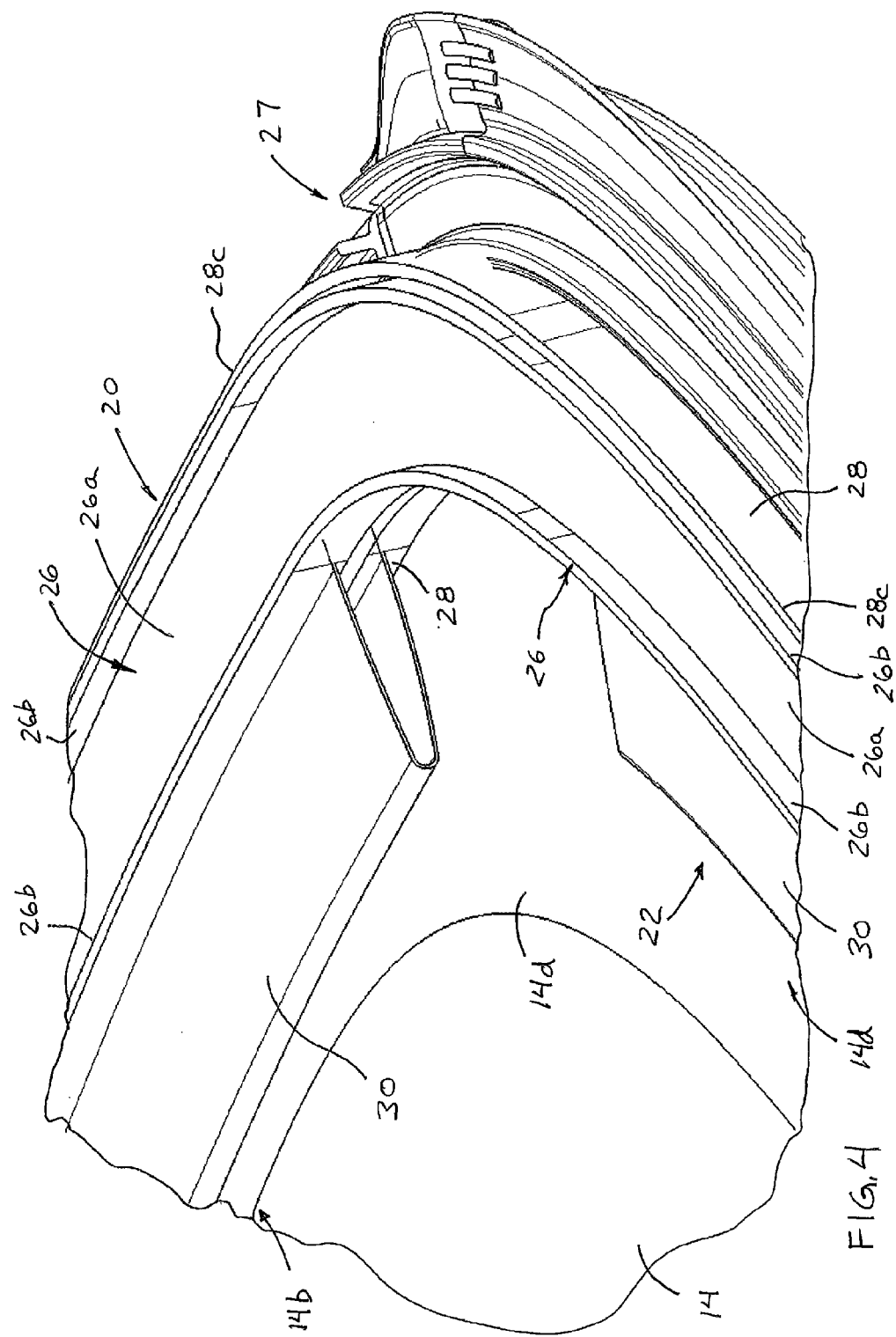
FIG. 4 is a perspective view of the perimeter mounting element of FIG. 3, shown at a corner region of the window panel.
Figure 6:
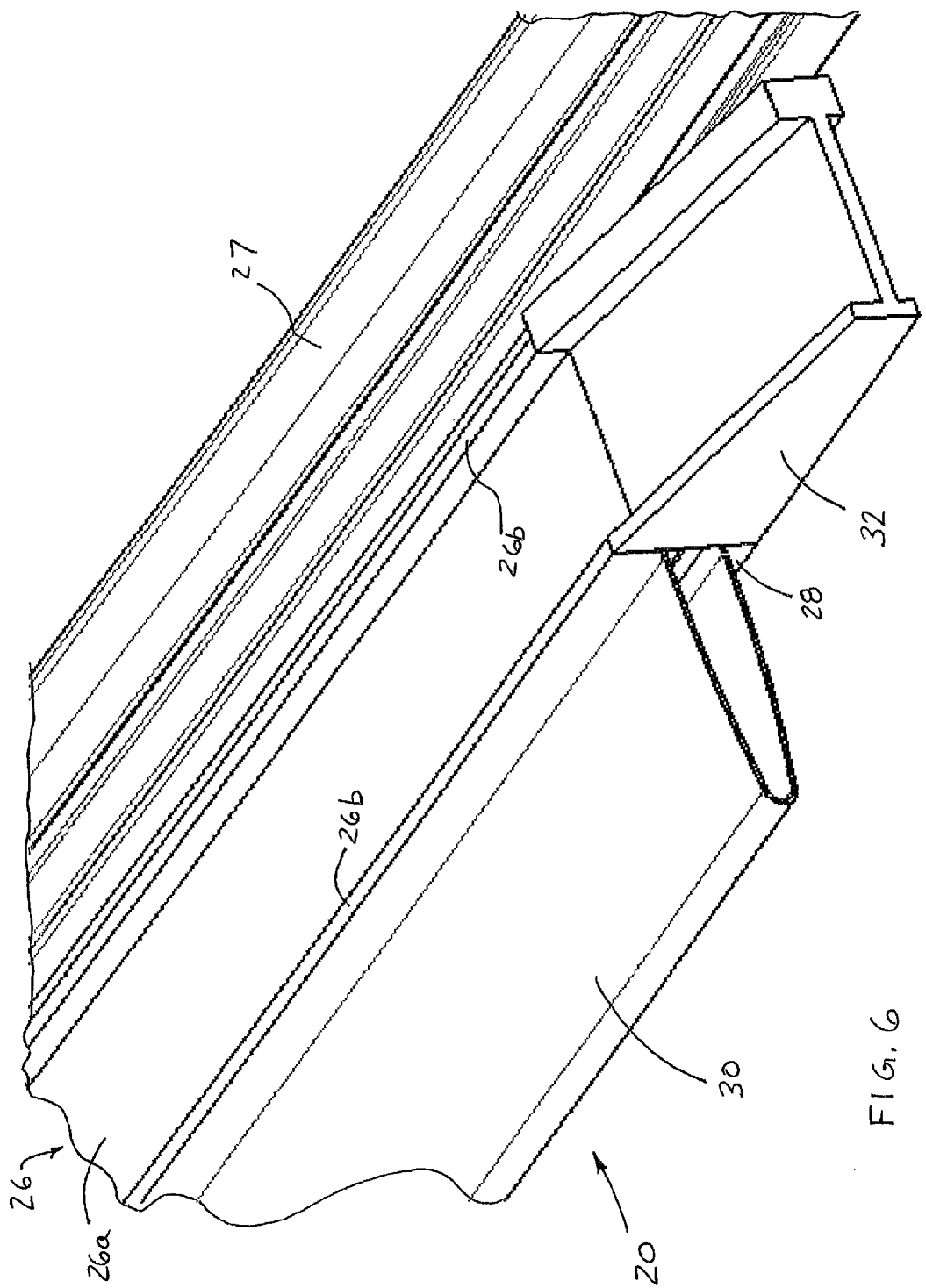
FIG. 6 is a perspective view of an end region of the perimeter mounting element of the present invention.

Side frame portions 20 receive and/or are bonded or adhered to the respective side perimeter portions of the window panel and extend along or at least partially along the respective side perimeter portions 14b of window panel 14, while lower frame portion 22 is bonded or adhered to and along or partially along the lower perimeter portion 14c of window panel 14. Optionally, and as can be seen in FIGS. 3 and 4, side frame portions 20 and lower frame portion 22 of lower frame 16b may be unitarily formed and/or are joined together at the lower perimeter corner regions of the window panel 14. Side frame portions 20 and lower frame portion 22 may comprise a suitably flexible material or structure or construction to provide a flexible characteristic along the side and lower perimeter portions 14b, 14c of window panel 14 so as to allow flexing or vibration or movement of the window panel when the lower perimeter portion 14c of window panel 14 is vibrated by the vibrating device. Optionally, and as can be seen in FIG. 6, the upper ends of the side frame portions may have tapered or ramped elements 32 to provide a ramped change in thickness of the side frame portions 20 at their upper ends, such as for applications where the upper frame member or sealing member or element 18 has a lower profile than the side frame portions 20.

In the illustrated embodiment, the side frame portions 20 and lower frame portion 22 each include a sheet metal attaching member or element 26 and a window panel attaching member or element 28, which are attached or connected together via a flexible member or element 30. The sheet metal attaching element 26 comprises an elongated member, such as a plastic or polymeric molded or extruded member or the like, that has a channel 26a and a pair of extensions or legs 26b along opposite sides of and defining the sidewalls of channel 26a, whereby the legs 26b may engage the sheet metal of the vehicle, while a suitable adhesive may be disposed along and within the channel 26a to bond or adhere or affix the sheet metal attaching element 26 to the vehicle sheet metal.

Likewise, the window panel attaching element 28 comprises an elongated member, such as a plastic or polymeric molded or extruded member or the like, that has a channel 28a and a pair of extensions or legs 28b along opposite sides of and defining the sidewalls of channel 28a, whereby the legs 28b may engage the inner surface of the window panel, while a suitable adhesive may be disposed along and within the channel 28a to bond or adhere or affix the window panel attaching element 28 to the inner surface of the respective perimeter regions of the window panel.

Attaching elements 26 and 28 are joined together or interconnected via flexible element 30, which, in the illustrated embodiment of FIGS. 3-6, comprises a curved or generally U-shaped metallic element that flexes to allow for relative movement between the attaching elements 26, 28 during vibration of the window panel 14. The flexible elements 30 extend along the respective attaching elements 26, 28 and may extend substantially continuously along the respective perimeter portions of the window panel when the frame is attached or bonded to the window panel. As can be seen in FIGS. 3 and 4, the flexible elements 30 may be spaced apart at the corner regions of the window panel, while the attaching elements extend substantially continuously along the perimeter regions of the window panel.

Figure 5:
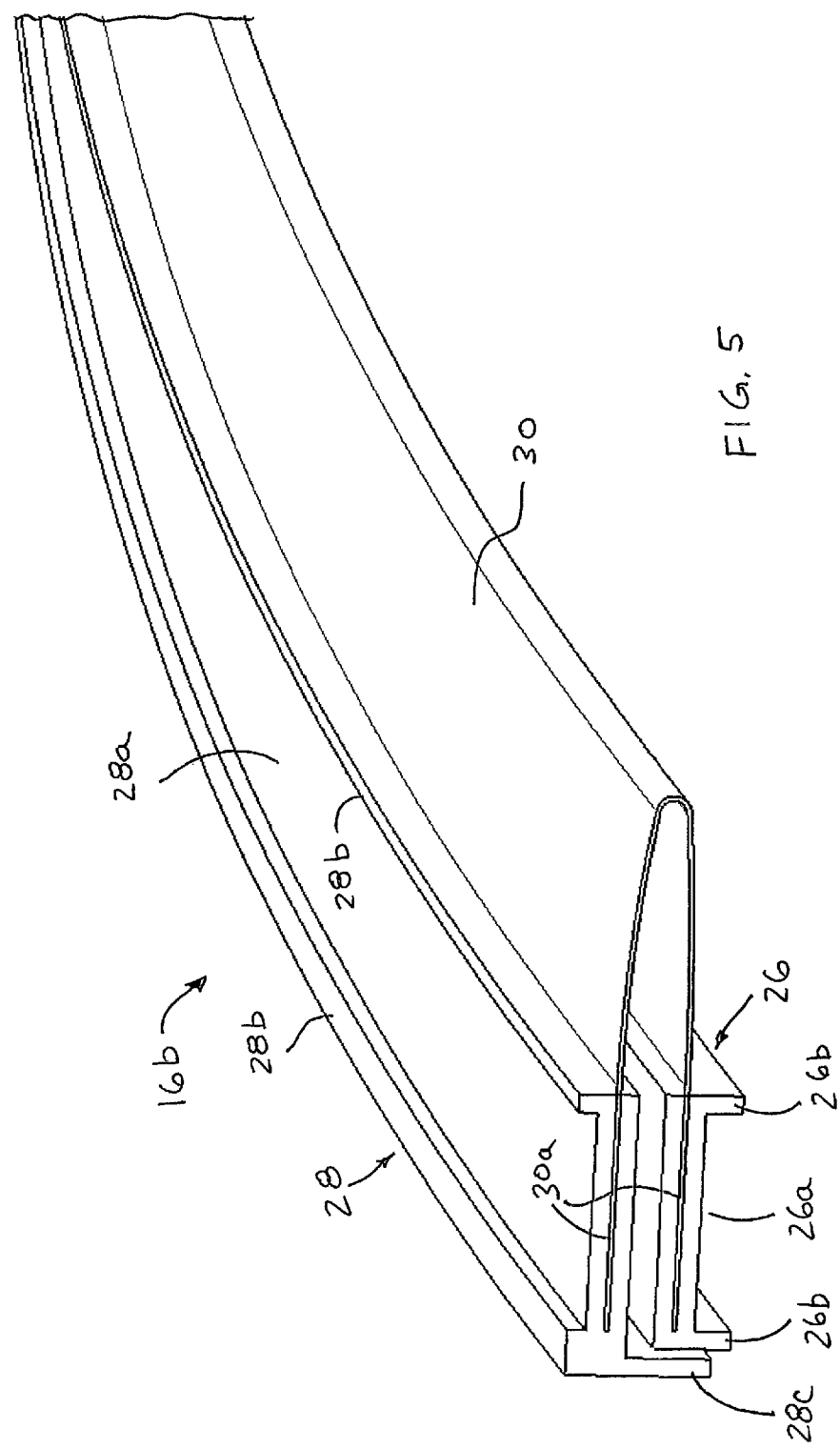
FIG. 5 is a perspective view of the perimeter mounting element of the acoustic window assembly of the present invention.

As shown in FIG. 5, the ends 30a of flexible element 30 may be attached to (such as via insert molding or the like) the respective ones of the attaching elements 26, 28. As best shown in FIG. 5, the U-shaped flexible element 30 functions to space the opposed surfaces of the attaching elements 26, 28 from one another and flexes during vibration of the window panel (and thus during vibration of the window attaching element 28) to allow for vibration of the window panel relative to the vehicle sheet metal and relative to the sheet metal attaching element 26. In the illustrated embodiment, the window attaching element 28 overlaps the sheet metal attaching element and includes a leg or extension 28c that extends partially along the outer perimeter edge of the sheet metal attaching element. The leg or extension 28c may maintain alignment of the window attaching element relative to the sheet metal attaching element and/or may limit movement of the window panel toward the vehicle body or sheet metal during operation of the actuating device and/or in response to a force pushing the window panel toward the vehicle body.

Thus, the lower frame portion 16b functions to mount the window panel the vehicle body or sheet metal while allowing for vibration of the window panel relative to the vehicle body or sheet metal. The flexible element is formed to provide a desired degree of resistance to movement of the window panel, while allowing the vibration of the window panel during operation of the actuating device. The flexible element also provides the desired shear and torsional rigidity to the window frame to limit or substantially preclude movement of the window panel relative to the vehicle body or frame or sheet metal except in the direction toward and away from the vehicle body or frame or sheet metal, as discussed below. A flexible sealing element or seal 27 may be disposed around the perimeter edge region of the window panel and outboard of the frame portions 20, 22 to substantially seal the side and lower perimeter portions of the window panel relative to the vehicle to limit or substantially preclude water and/or air leakage between the window panel and vehicle body.

Figure 7:
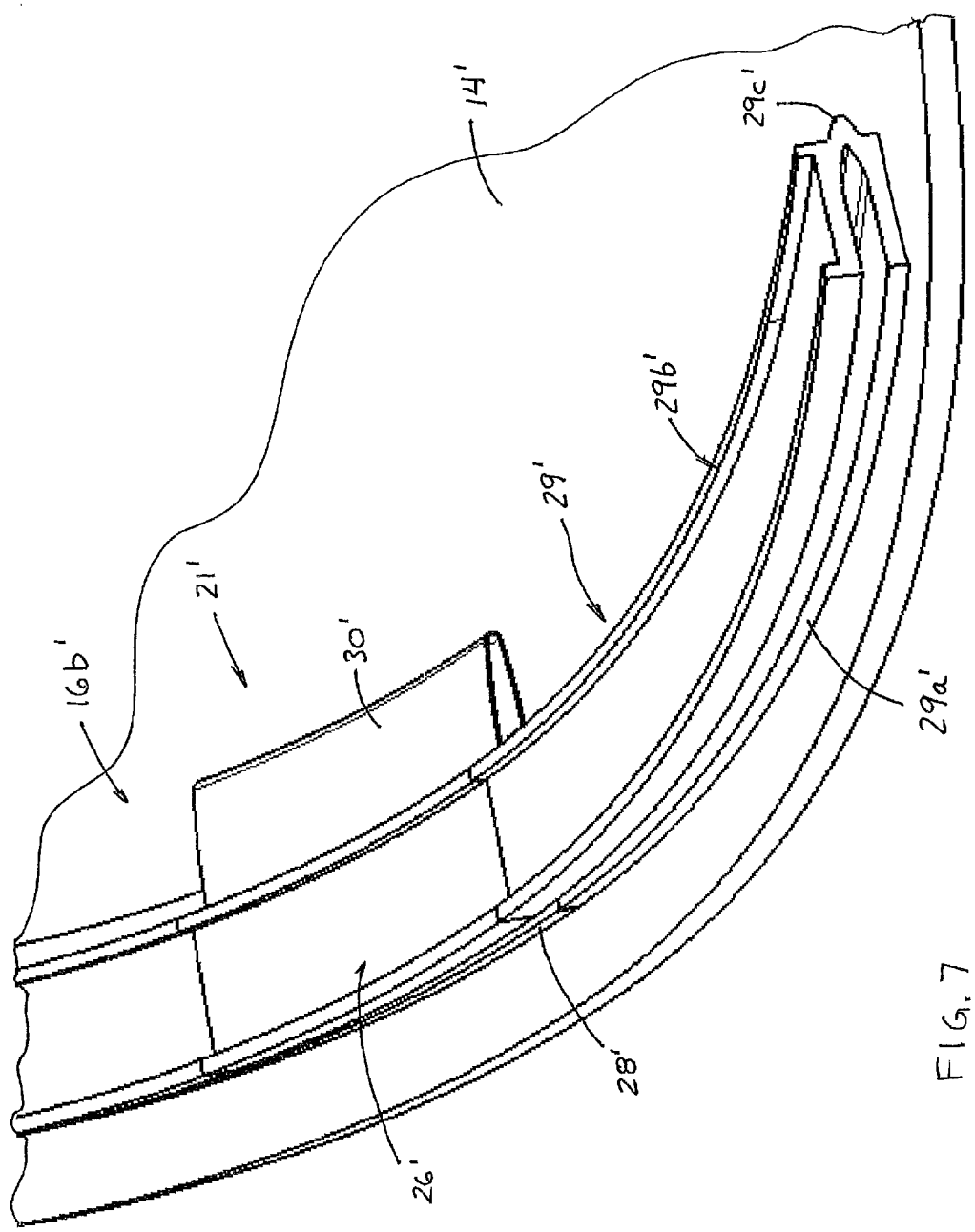
FIG. 7 is a perspective view of another perimeter mounting element for the acoustic window assembly of the present invention.

Optionally, and with reference to FIG. 7, a lower frame portion 16b' of a window mounting frame may have a plurality of sections or portions 21' (one shown in FIG. 7), which includes a flexible element 30' connecting a window attaching element 28' to a sheet metal attaching element 26', such as in a similar manner as described above, spaced apart or separated by other frame portions 29'. Frame portions 29' include a window attaching element 29a' for attaching to the window panel 14 and a sheet metal attaching element 29b', which may be integrally formed together or joined together via a plastic or polymeric (or metallic) connecting element 29c'. The lower frame portion 16W thus includes the flexible elements 30' to provide the desired resistance to movement or vibration of the window panel, while providing other degrees of flexibility elsewhere around the perimeter regions of the window panel. The portions 21', 29' may abut one another to provide continuous support around the perimeter region of the window panel.

Figure 8:
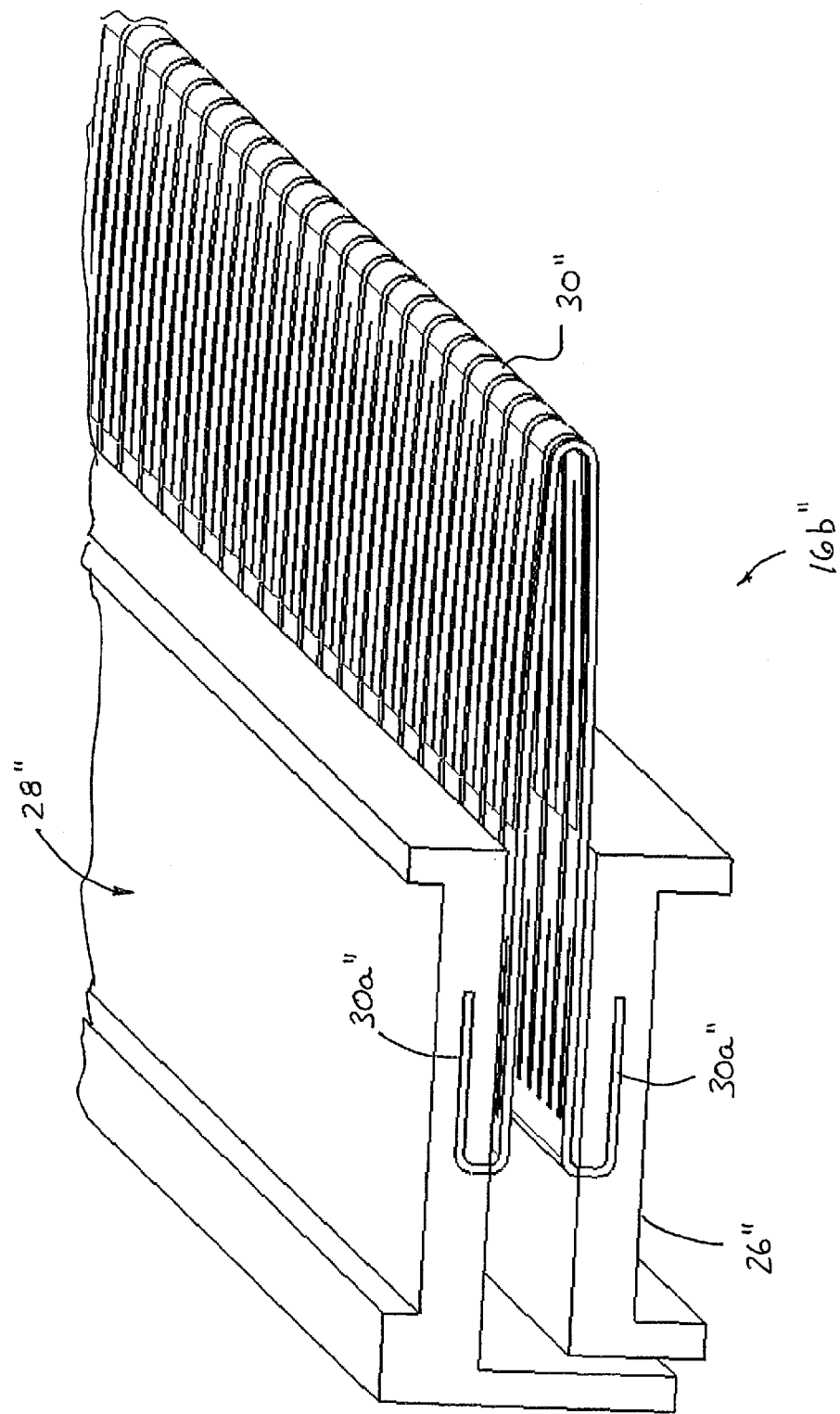
FIG. 8 is a perspective view of another perimeter mounting element for the acoustic window assembly of the present invention.
Figure 9:
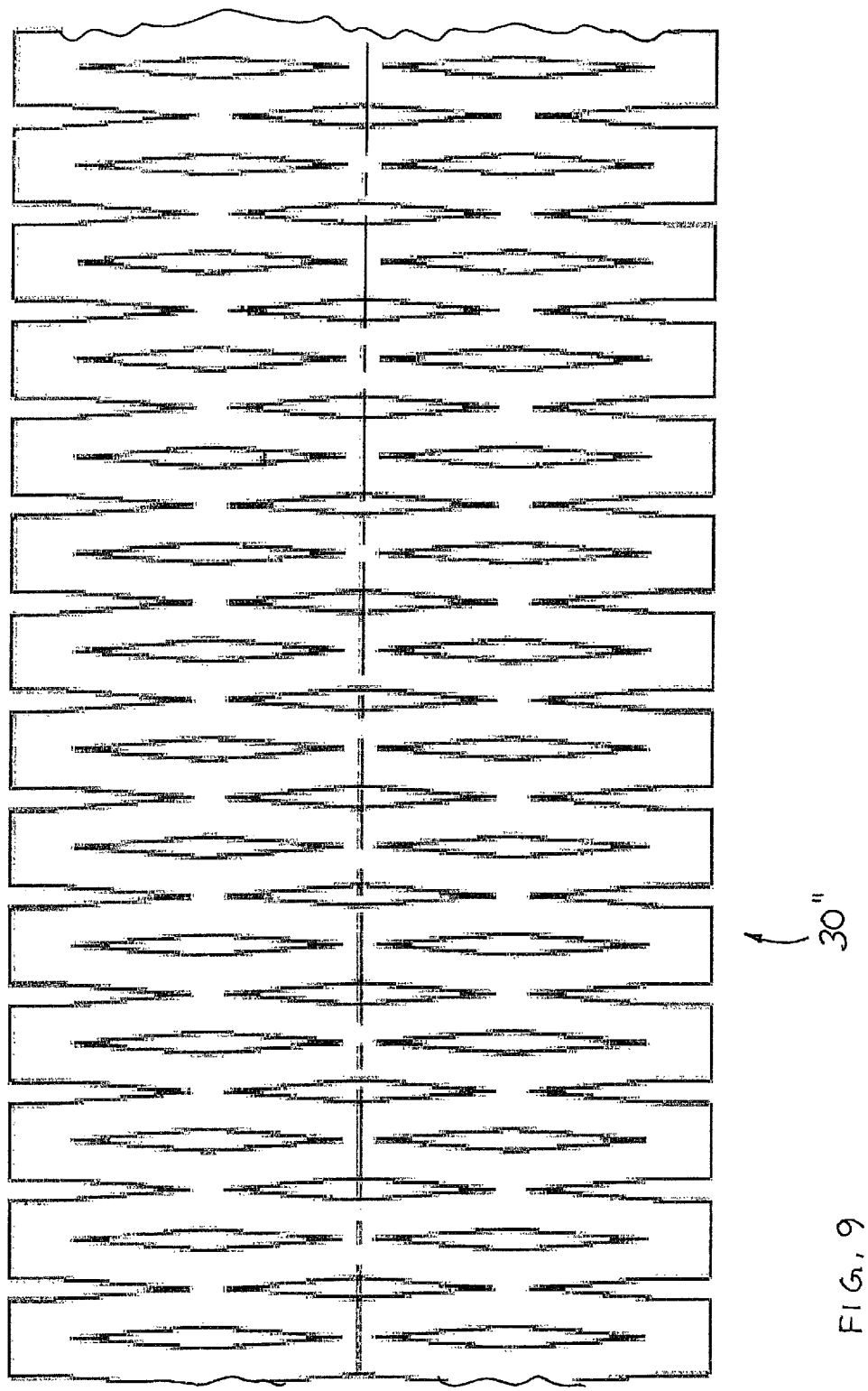
FIG. 9 is a plan view of a stamped flexible element of the perimeter mounting element of FIG. 8.
Figure 10:
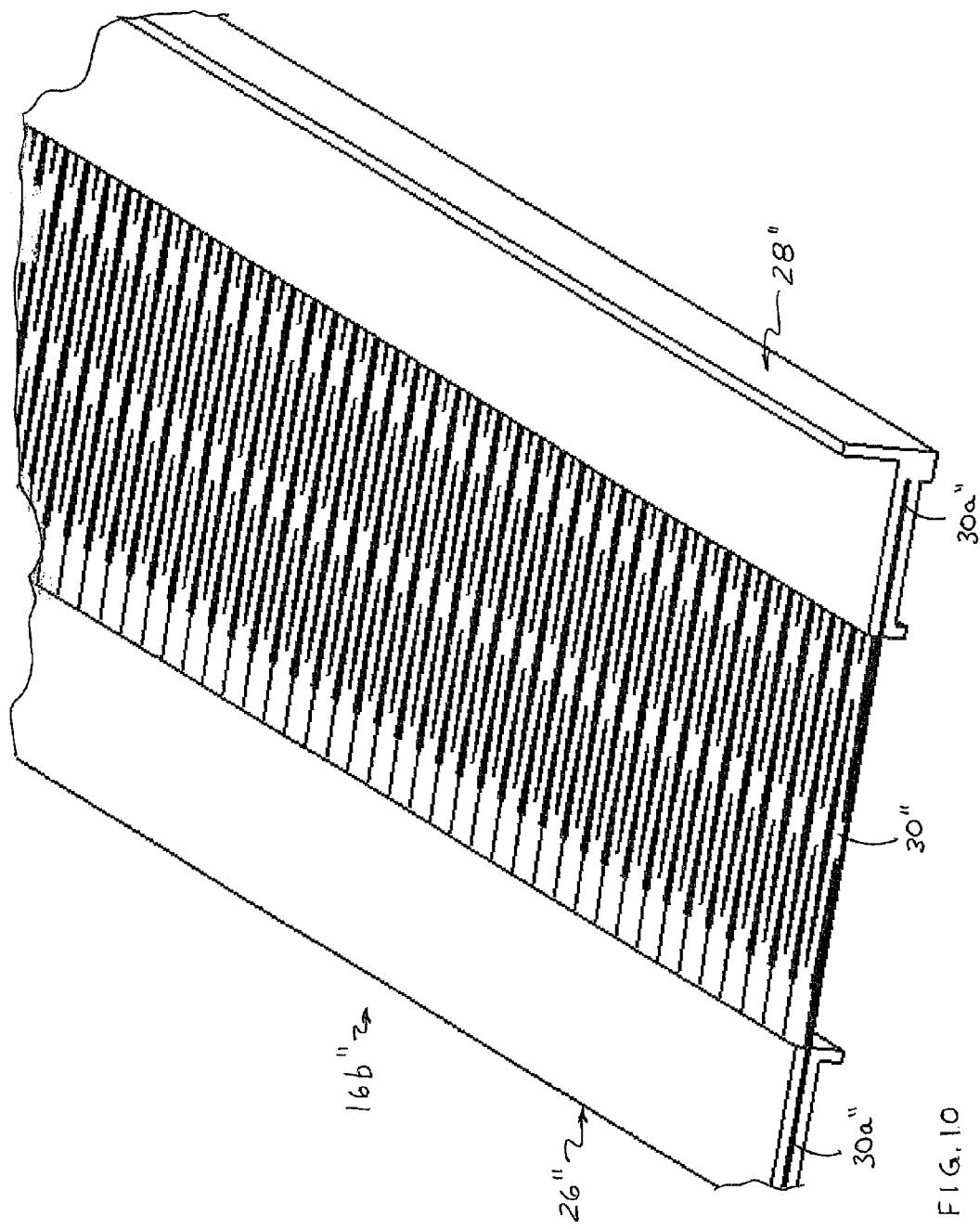
FIG. 10 is a perspective view of the stamped flexible element of FIG. 9, as joined with the window and vehicle engaging elements of the perimeter mounting element of FIG. 8, shown before the flexible element is bent to the desired shape.

Optionally, and with reference to FIGS. 8-10, a lower frame portion 16b'' may be substantially similar to lower frame portion 16b, discussed above, but may include a cut or serrated flexible element 30''. As shown in FIG. 9, the flexible element 30'' may be stamped or formed of a metallic material so as to have a plurality of apertures therethrough. The stamped or formed element may then be insert molded or otherwise secured to the window attaching elements 28'' and the sheet metal attaching elements 26'' while in its flat or planar form (such as shown in FIG. 10), and then may be bent to the final curved shape as shown in FIG. 8. Optionally, the flat ends or sides 30a'' of the flexible element 30'' may be insert molded in or attached to the attaching elements such as shown in FIG. 10, or the ends or sides of the flexible element may be bent or curved and insert molded in or attached to the attaching elements in the manner shown in FIG. 8, or may be otherwise attached to or insert molded in the attaching elements, depending on the particular application. The attaching means and the perforations and the material selected for the lower frame portion of the acoustic window assembly may be selected depending on the particular application and desired performance of the window assembly.

Figure 11A:
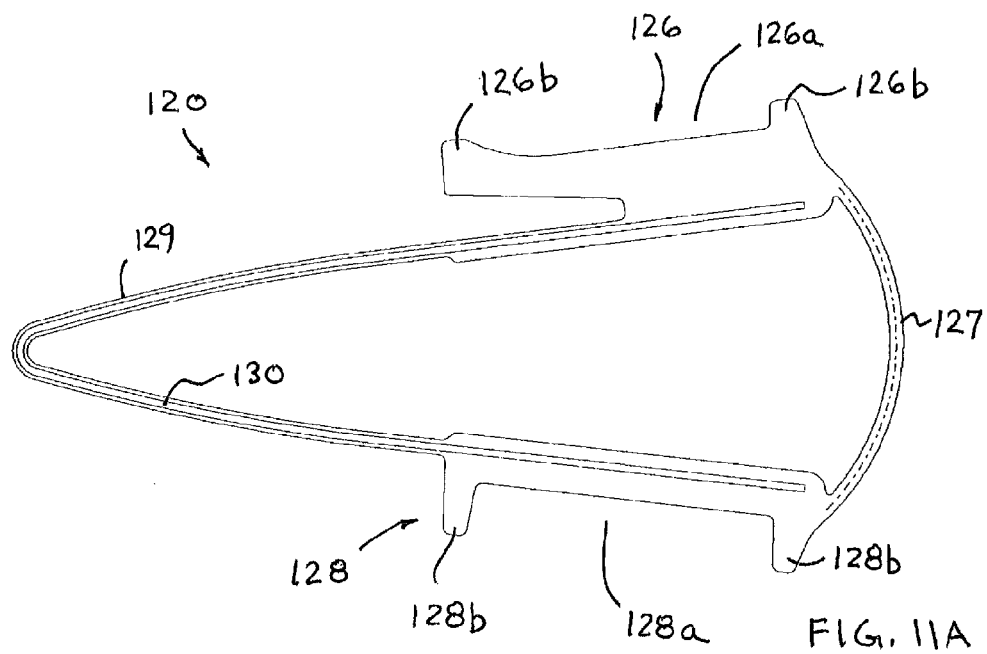
FIGS. 11A and B are sectional views of another sealing element in accordance with the present invention, shown in a non-compressed state and a compressed state.
Figure 11B:
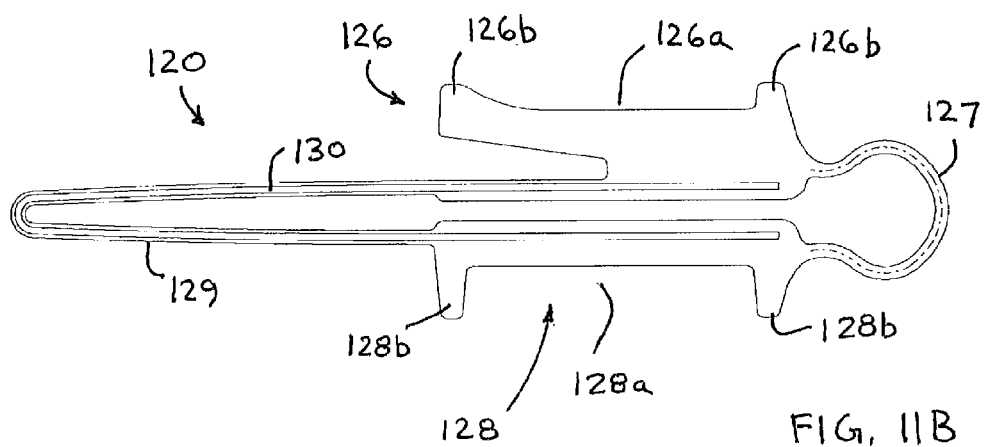
FIGS. 11C-N are sectional views of other flexible sealing elements in accordance with the present invention.
Figure 11C:
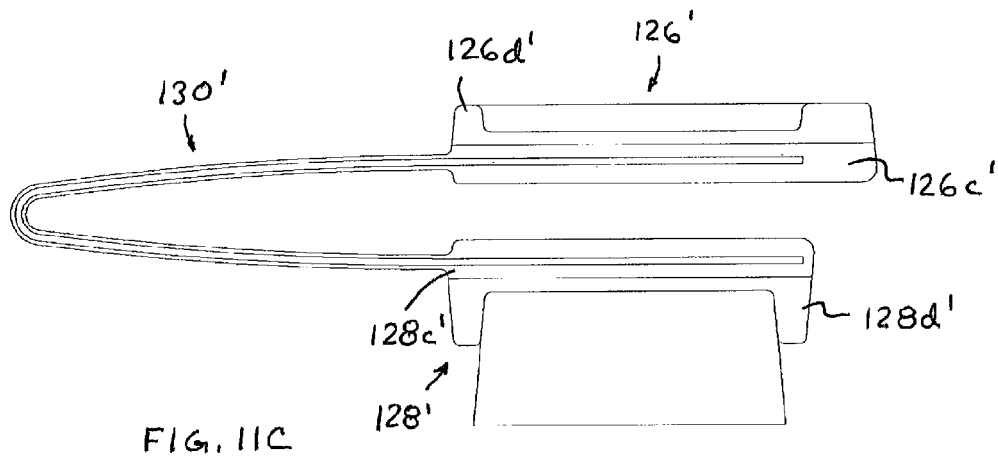
Figure 11D:
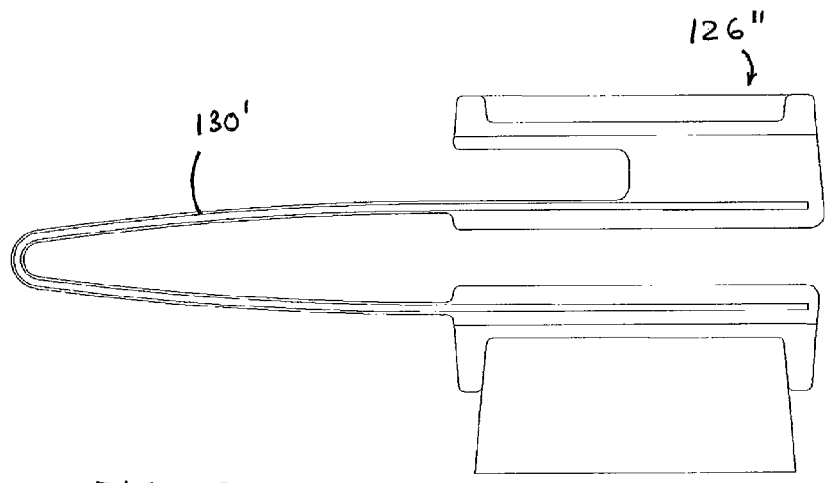
Figure 11E:
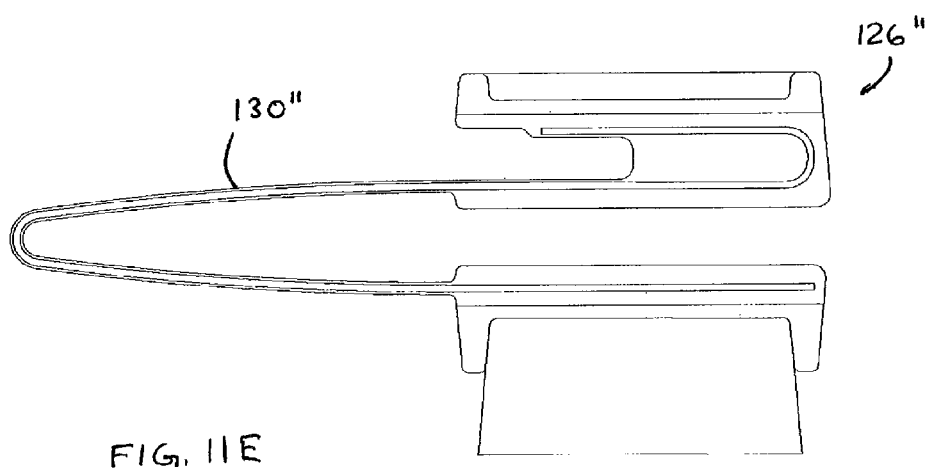

Optionally, other frame portions and flexible elements or flexible element designs or forms may be implemented, depending on the particular application. For example, and as shown in FIGS. 11A and 11B, a frame portion 120 may include a sheet metal attaching member or element 126 and a window panel attaching member or element 128, which are attached or connected together via a flexible member or element 130. The attaching elements 126, 128 may comprise elongated members, such as a plastic or polymeric molded or extruded member or the like, such as similar to the attaching elements 26, 28, discussed above. In the illustrated embodiment, attaching elements 126, 128 are joined by a flexible strip or element 127, which flexes with flexible element 130 as the frame portion is flexed between a non-compressed state (FIG. 11A) and a compressed state (FIG. 11B). Attachment elements 126, 128 may be molded over flexible element 130 so that flexible element 130 is substantially encased within an encapsulating portion or overmolded portion 129 of the unitarily molded or integrally molded attachment elements 126, 128 (such that the perimeter frame portion is generally unitarily formed).

The perimeter frame portion and attachment elements may otherwise be substantially similar to the frame portions and attachment elements discussed above, such that a detailed discussion of the perimeter frame portions and attachment elements need not be repeated herein. Attachment element 126 includes a channel 126a and a pair of extensions or legs or walls 126b along opposite sides of and defining the sidewalls of channel 126a, whereby the legs 126b may engage the sheet metal of the vehicle, while a suitable adhesive may be disposed along and within the channel 126a to bond or adhere or affix the sheet metal attaching element 126 to the vehicle sheet metal (with the legs establishing the desired gap or spacing for the adhesive disposed within the channel), and attachment element 128 includes a channel 128a and a pair of extensions or legs or walls 128b along opposite sides of and defining the sidewalls of channel 128a, whereby the legs 128b may engage the inner surface of the window panel, while a suitable adhesive may be disposed along and within the channel 128a to bond or adhere or affix the window panel attaching element 128 to the inner surface of the respective perimeter regions of the window panel. Flexible element 130 may comprise a curved or generally U-shaped metallic element that flexes to allow for relative movement between the attaching elements 126, 128 during vibration of the window panel.

Figure 11F:
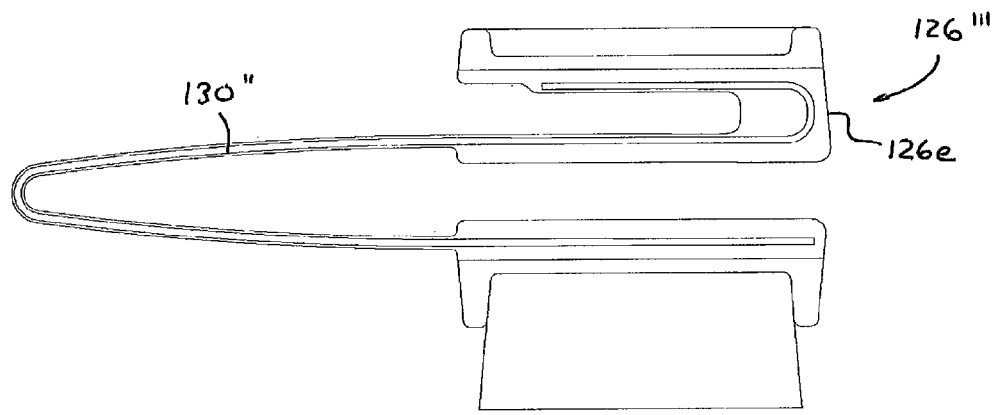
Figure 11G:
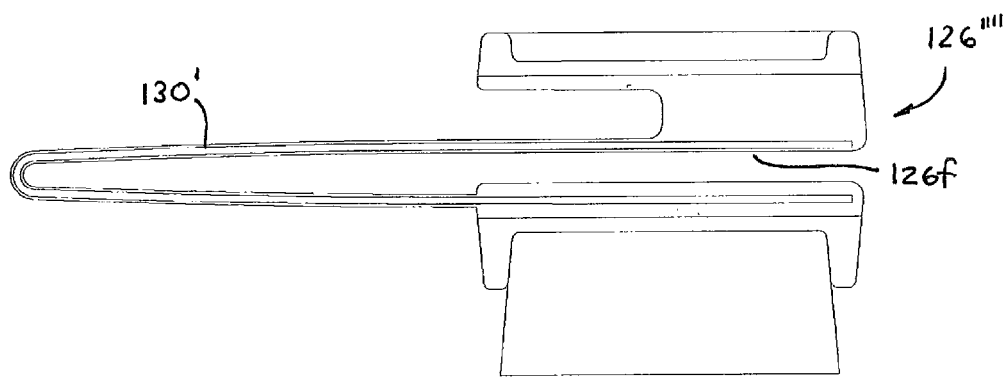
Figure 11H:
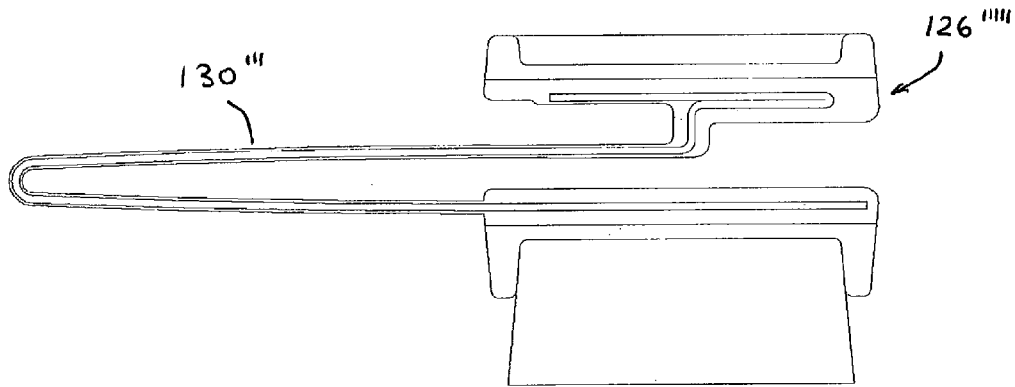
Figure 11:
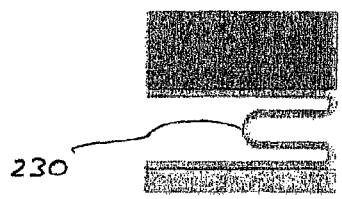
Figure 11:
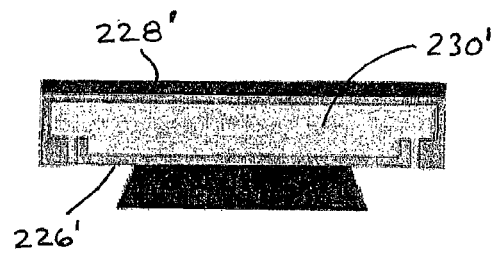
Figure 11:
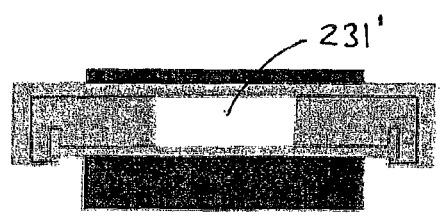
Figure 11:
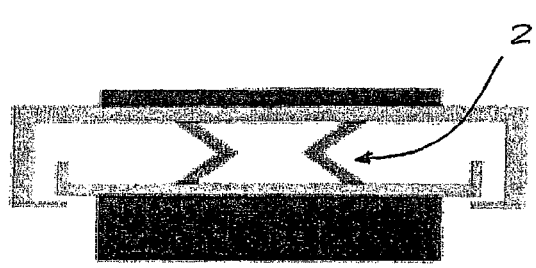
Figure 11:
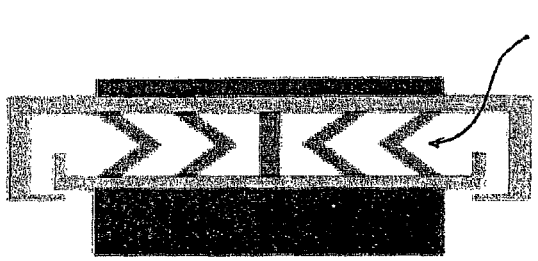
Figure 11:

Optionally, and with reference to FIGS. 11C-H, other forms of flexible elements and/or attachment elements may be implemented while remaining within the spirit and scope of the present invention. For example, the flexible element 130' (FIG. 11C) may be generally U-shaped and received within respective portions 126c', 128c' of the attachment elements 126', 128', with the flexible element receiving portions 126c', 128c' being attached to or molded with respective channel portions or strips 126d', 128d'. Optionally, for example, the attachment element 126" (FIG. 11D) may extend from the channel portion to space the flexible element 130' from the sheet metal and to allow additional flexing at the attachment element 126". Optionally, the flexible element 130" (FIG. 11E) may be formed with an additional bend or curvature in the attachment element 126". Optionally, the attachment element 126''' may include a narrowed neck portion 126e to enhance flexing of the attachment element, while the flexible element 130" may include an additional bend or curvature within attachment element 126" and through neck portion 126e, such as shown in FIG. 11F. Optionally, the flexible element 130' may be received in an attachment element 126"" (FIG. 11G) that may be generally similar to attachment element 126", discussed above, with a reduced amount of overmolded material at the junction 126f of the attachment element and flexible element. Optionally, an attachment element 126""' (FIG. 11H) may be formed to receive or overmold a flexible element 130''', which may have an additional bend or curvature to enhance the attachment of the flexible element at the attachment element.

Optionally, other frame portions and/or flexible elements or flexible element designs or forms may be implemented, depending on the particular application. For example, the flexible element may comprise various U-shaped forms or V-shaped forms or C-shaped forms or the like, or optionally, and with reference to FIG. 11I, the flexible element 230 may comprise a multi-curved element. Optionally, and with reference to FIG. 11J, the flexible element 230' may comprise a flexible or compressible or elastomeric material disposed between the window attaching element 228' and the sheet metal attaching element 226'. The flexible material 230' may be disposed substantially entirely between the attaching elements or may be partially disposed between the attaching elements with a space or void 231' (FIG. 11K) established between the attaching elements. Optionally, the flexible element or elements 230" (FIGS. 11L-11N) may comprise metallic or polymeric elements disposed or established between the attaching elements and bent or curved to allow for flexing of the flexible elements during vibration of the window panel relative to the vehicle body or sheet metal. Other support or frame configurations for vibratably attaching the window panel to the vehicle body or sheet metal may be implemented while remaining within the spirit and scope of the present invention. Optionally, the frame portions may utilize aspects of the frame portions described in PCT Application No. PCT/US2006/040100, filed Oct. 12, 2006, which is hereby incorporated herein by reference in its entirety.

The selected materials and configurations of the side frame portions 20 and lower frame portion 22 are selected to provide the desired degree of flexibility along the perimeter portions of the window panel so as to allow vibration and slight movement of the window panel relative to the vehicle body or sheet metal and without leakage occurring between the window panel and window side frame portions and between the window frame portion and the vehicle body or sheet metal or frame portion. The perimeter frame portions are configured to allow the appropriate amount of flexing or movement along the frame portions such that the range of allowed movement or stroke of the window panel is within the range of the movement or stroke of the actuating assembly so as to limit or substantially preclude the window panel from moving too much and contacting or fouling against the vehicle frame or the like.

The materials for the side frame portions and/or the attaching elements and/or the flexible inserts or elements along the side frame portions or along the window panel may be selected to provide a desired degree of resiliency or flexibility or softness (and the desired or appropriate range of motion of the window panel toward and away from the vehicle body or frame or sheet metal) along or partially or substantially along the side perimeter portions of the window panel to allow the window panel to vibrate in the desired manner. Optionally, other fasteners or posts or structures or the like may be provided at or attached to or adhered or taped to the side frame portions to limit or substantially preclude lateral movement of the window panel, while allowing flexibility and slight movement of the window panel in the inward and outward directions.

Optionally, the frame portions may comprise generally continuous elements that extend around or at least partially around or along the perimeter regions of the window such that the frame portions may comprise continuous rings or perimeter elements. Optionally, the main body portions or attachment elements of the frame may be extruded and then the extrusions may be disposed in a mold cavity, whereby the corner portions (such as between the opposed ends of adjacent frame portions) and end ramps of the frame portions may be molded at or to the extrusions. Thus, the frame portions may comprise discontinuous perimeter elements with the gaps between the discontinuous elements filled or spanned or at least partially spanned by the molded corner sections and/or end ramps. Optionally, for example, the perimeter frame portion may comprise three extruded elements disposed at respective perimeter portions or regions of the window, with separate elements or pieces provided at the corners and between adjacent extruded elements. Other frame and seal configurations may be implemented while remaining within the spirit and scope of the present invention.

Thus, various types of lower frames or frame portions or mounting portions may be implemented that provide the desired degree of flexibility along the side perimeter portions and lower perimeter portion of the window panel, without affecting the scope of the present invention. The frame portions thus allow for movement or vibration of the window panel in an inward and outward direction but substantially retain the window panel in place and seal the window panel relative to the vehicle frame. The frame portions are adhered or bonded or otherwise attached to the vehicle body or frame portion or sheet metal along an attaching surface (which may be defined as a recess or channel along the frame portion for receiving a bead of adhesive or the like therealong for adhering or bonding the window frame portion to the vehicle sheet metal) of the frame portions (while the upper or fixed frame portion is similarly attached to the vehicle frame portion or sheet metal at the upper or fixed perimeter portion of the window panel).

The frame portion or mounting portion of the window assembly of the present invention thus allows for the window panel to move in a hinging motion with the upper portion or roofline portion of the window panel (or other perimeter portion depending on the particular application of the window panel assembly) being in a generally fixed state, and with the lower portion of the window panel (and/or other perimeter portion depending on the particular application of the window panel assembly) moving in or out relative to the vehicle body or frame or sheet metal, and preferably moving with only two degrees of freedom since lateral movement of the window panel is limited or substantially precluded by the frame or mounting portions. The side frame portions (or other perimeter portion or portions depending on the particular application of the window panel assembly) may flex as the actuating assembly articulates in a motion generally normal to the window panel surface (at the lower region of the window panel where the actuating assembly is located), so as to allow the window panel to move and vibrate in the desired or appropriate manner in response to actuation of the actuating assembly.

Figure 12:
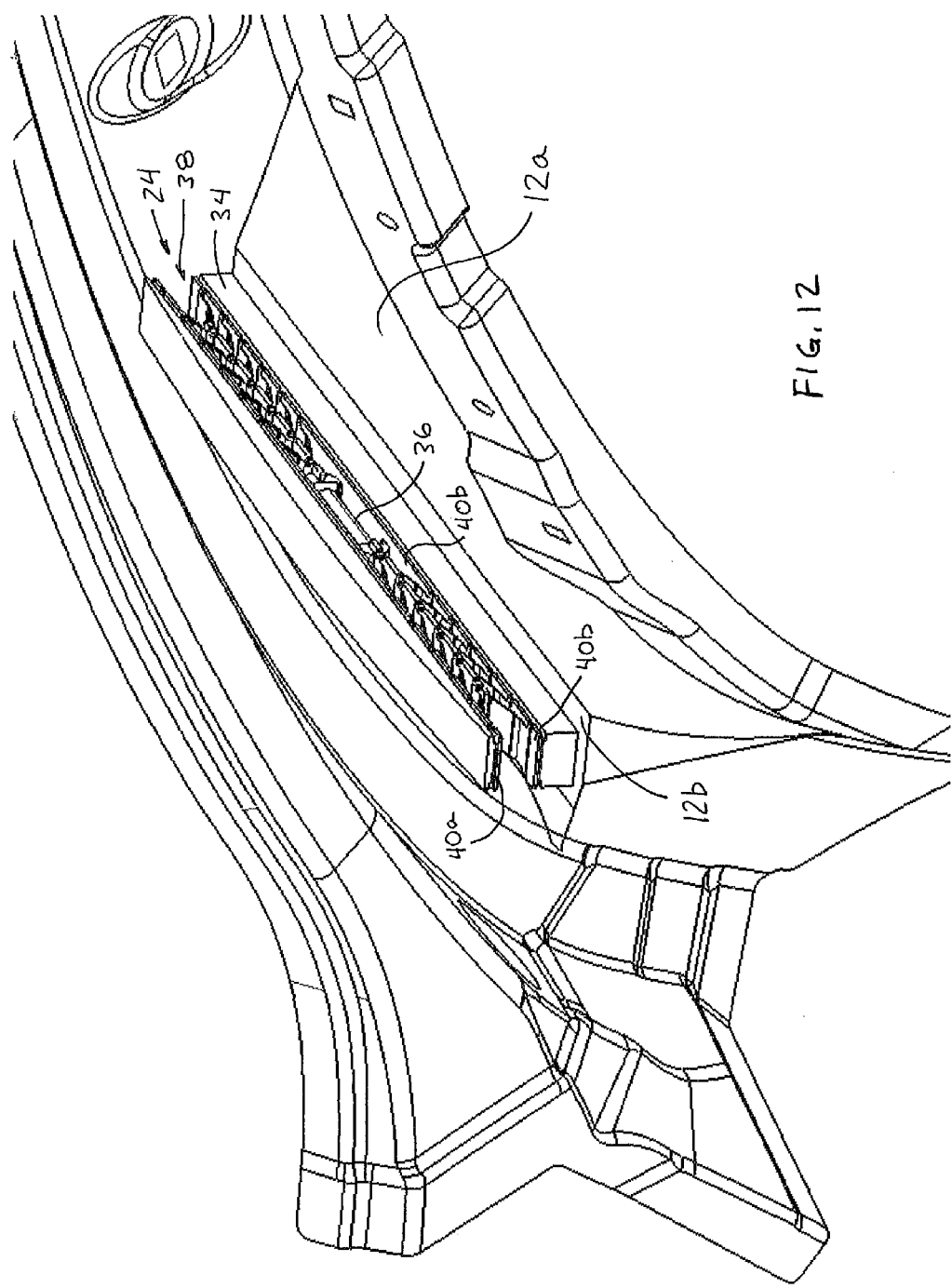
FIG. 12 is a perspective view of the actuating device and exciter of the present invention, shown mounted at a structural platform of a vehicle.
Figure 13:
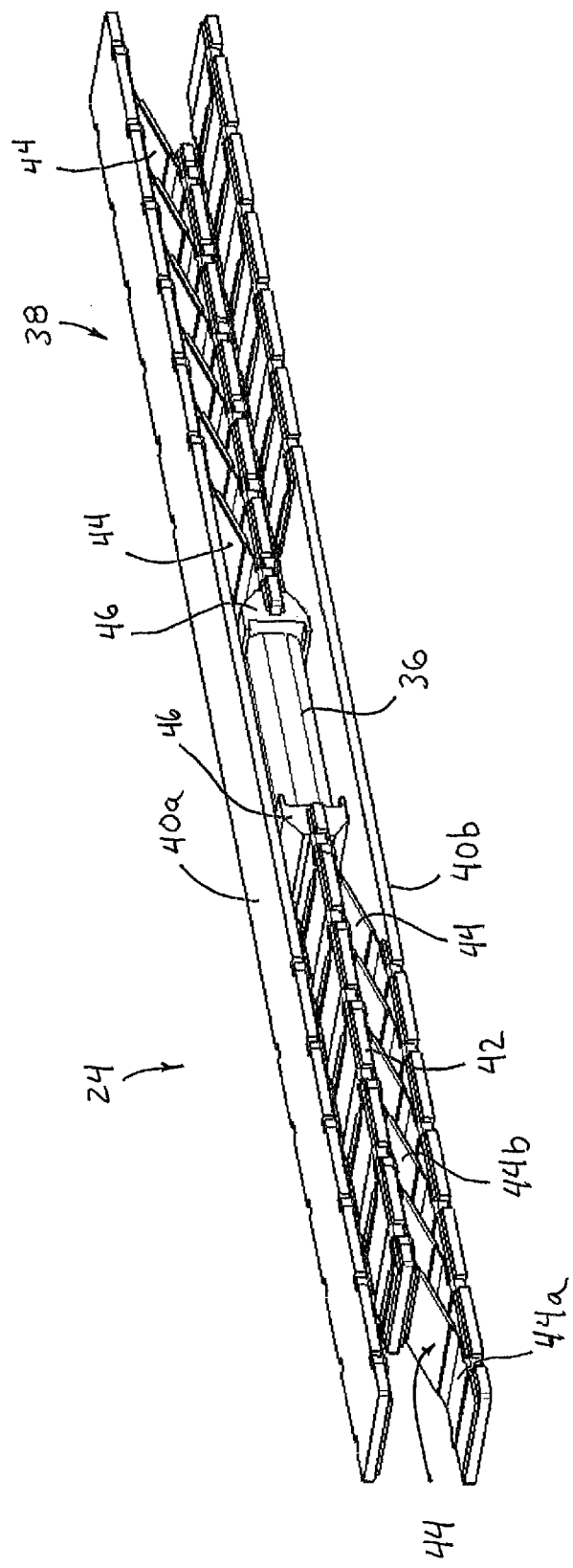
FIG. 13 is a perspective view of an actuating device and exciter suitable for use with the acoustic window assembly of the present invention.
Figure 14:
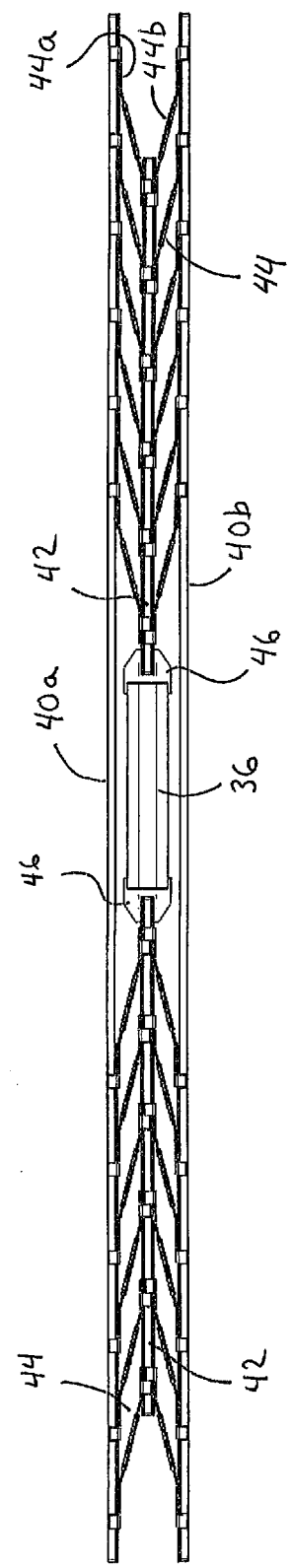
FIG. 14 is a side elevation of the actuating device and exciter of FIG. 13.

The actuating assembly 24 is located at an actuating region of the window panel and between a first perimeter region of the window panel (where a mounting portion or frame portion substantially fixedly mounts the respective first perimeter region of the window panel relative to the vehicle structure) and a second perimeter region of the window panel (where a mounting portion or frame portion mounts the respective second perimeter region of the window panel to the vehicle structure to allow for movement of the second perimeter region of the window panel toward and away from the vehicle structure). For example, the actuating assembly 24 may be located at a lower region of the window panel 14, and thus may be positioned at or near or on a parcel shelf or the like of the vehicle (such as a sedan or coupe or the like, but could otherwise be positioned at or in a rear door or tailgate or liftgate of a station wagon or van or minivan or SUV or the like), where the actuating assembly is not readily viewable and does not interfere or substantially interfere with a driver's rearward field of view through the rear window of the vehicle. As best shown in FIG. 12, actuating assembly 24 may be mounted to the vehicle frame portion 12a via a mounting block or rigid structure 34. In the illustrated embodiment, the mounting block 34 is a substantially rigid elongated member or block that mounts to a generally horizontal portion 12b (such as at a parcel shelf at the rear of the vehicle and at or near where the lower portion of the window panel meets or approaches the vehicle frame) of the vehicle frame portion, and preferably to a substantially rigid and non-flexible mounting or frame portion of the vehicle, such as a substantially rigid mounting structure or platform at the parcel shelf or other frame or body or vehicle structure at which the actuating assembly may be substantially fixedly mounted.

The mounting block and/or the frame portion of the vehicle may be configured or angled so as to angle the actuating assembly to be generally parallel to or generally along the inner surface of the window panel 14. The mounting block 34 thus functions to bridge the gap between the window panel and the parcel shelf or frame portion of the vehicle and to orient the actuating assembly at the desired or appropriate angle along the window panel. The mounting block may be attached to the sheet metal or frame portion or structure of the vehicle and an interior trim panel may partially or substantially encase or conceal the actuating assembly at the lower region of the rear window panel at the parcel shelf of the vehicle (or elsewhere depending on the particular vehicle application and/or window application of the acoustic window assembly), so that the actuating assembly is not readily viewable by a person viewing the window panel from either inside or outside of the vehicle cabin.

Although shown and described as being attached to a rigid structure or plate or block which is in turn attached to the vehicle structure to space the actuating assembly from the vehicle structure, it is envisioned that the actuating assembly may be attached directly to the vehicle structure or sheet metal without any spacing or mounting block. Preferably, the vehicle structure or sheet metal may include or provide a mounting area for the actuating assembly, such as a raised, substantially rigid or non-flexible platform or the like, whereby the actuating assembly may be adhered or bonded or otherwise secured directly to the vehicle structure. For example, a lower plate 40b of an exciter 38 (discussed below) may be bonded or adhered or otherwise attached/secured (such as via fasteners or the like through end extensions at opposite ends of the lower plate 40b) to the vehicle structure, whereby the upper plate 40a is bonded or adhered or attached to the interior surface of the window panel, such as discussed below. Optionally, the vehicle structure or sheet metal may be formed with a recess or sill or depression for receiving or partially receiving the actuating assembly, without affecting the scope of the present invention. The actuating assembly may be formed to correspond to the sheet metal form and may be adhered or bonded or otherwise attached directly to the sheet metal or vehicle structure (such as via the lower plate of the actuator being bonded or attached to the vehicle structure or sheet metal), or the actuating bracket may be attached via a bracket or mounting block as described above or via any other suitable attachment means for substantially fixedly or rigidly attaching the actuating bracket to the vehicle.

Thus, the upper plate of the exciter or actuating assembly thus may be attached to or affixed to or bonded to the interior surface of the window panel while the lower plate (or mounting block or bracket) is attached or affixed or bonded to the vehicle frame or sheet metal. For example, the upper plate of the exciter or actuating assembly (or a rigid or substantially rigid interface member or plate or element attached to the upper plate of the exciter or actuating assembly) may be bonded or adhered to the interior surface of the window panel via a suitable adhesive, such as, for example, a two component mixed urethane adhesive or other suitable adhesive or bonding or attaching material, while remaining within the spirit and scope of the present invention. Also, for example, the lower plate (such as a rigid or substantially rigid plate or elongated member) of the exciter or actuating assembly (or the mounting bracket of the exciter or actuating assembly) may be adhered or bonded or affixed to the vehicle sheet metal via any suitable adhesive or bonding material, such as a two component mixed urethane adhesive or other suitable adhesive or bonding or attaching material, while remaining within the spirit and scope of the present invention.

The actuating assembly 24 is operable to vibrate in a manner that imparts a non-bending vibratory movement that is substantially limited to motions that are generally normal to or transverse to the window panel at the location of the actuating assembly, such that the window panel is moved only inward and outward at the lower window panel portion by the actuating assembly. Movement of the lower perimeter portion of the window panel in this manner causes the window panel to move about or relative to the fixed upper perimeter portion in a hinge like motion about the fixed upper perimeter portion of the window panel. The stiffness of the plates of the exciter assembly and the stiffness of the glass or window panel allow for non-bending motion of the window panel in the cross-car or lateral direction, while the window panel may flex or the bonding material or sealing element at the upper perimeter portion of the window panel may flex to allow for the vibratory, hinge-like action relative to the upper portion of the vehicle body or frame or sheet metal.

In the illustrated embodiment, actuating assembly 24 comprises a piezoelectric actuating device or element 36 that is operable to move or actuate or excite a mechanical exciter device or element 38 that engages the interior surface of the window panel so as to impart the movement at the window panel. As shown in FIGS. 12-15, exciter device 38 receives piezoelectric actuating device 36 therein, whereby a pulse or vibration or motion imparted by piezoelectric actuating device 36 is received by exciter device, which in turn imparts a pulse or vibration or motion against the window panel 14.

Piezoelectric actuating device 36 may be any type of piezoelectric device, and may utilize aspects of the devices described in U.S. Pat. Nos. 6,904,154; 6,865,277; 6,839,444; and 6,522,755, and PCT Application No. PCT/US2006/040100, filed Oct. 12, 2006, which are all hereby incorporated herein by reference in their entireties. The piezoelectric actuating device may include a plurality of plates or discs that function to generate a pulse or stroke of an end plate or end face 36a of the device. In the illustrated embodiment, piezoelectric actuating device 36 comprises an elongated piezoelectrical stack and may be operable to generate a pulse or stroke at each of its end faces 36a of, for example, approximately 20 to 50 microns at each end or approximately 40 to 100 microns total displacement of the piezoelectric actuating device when the device is actuated. The piezoelectric actuating device may exert a force of, for example, approximately 2000 Newtons or about 1500 to 2500 Newtons at the end faces when the device is actuated. The piezoelectric actuating device pulses the end face, which imparts a force and movement at the exciter, while the actuating device provides a substantially equal and opposite force and movement at the opposite end or end face of the actuating device so that the forces and movements are pulsed at both ends of the piezoelectric actuating device. The end faces thus may move or pulse outwardly and inwardly together, such that an outward pulse or movement of one of the end faces occurs at substantially the same time as a similar outward pulse or movement of the other end face.

The piezoelectric actuating device is connected to a power source and is actuated and controlled to pulse or vibrate at a desired or appropriate amplitude and frequency. Such piezoelectric devices typically are high voltage (such as about 160 volts and up to about 200 volts), low current devices. Thus, the piezoelectric actuating device is preferably connected to a voltage step up converter or amplifier, which may step up or convert the input voltage (such as about 12 volts from the vehicle power source or battery) to a higher output voltage (such as about 160 volts or more or less depending on the desired or appropriate voltage for operation of the piezoelectric device), while stepping down or reducing the current that is applied to the actuating device. The amplifier thus may be connected to the vehicle power source and may provide a high voltage, low current power source for the piezoelectric actuating device, whereby the piezoelectric actuating device vibrates or pulses at the desired amplitude and frequency to actuate the exciter 38.

For example, the actuating device may function at a low frequency range (such as for a sub-woofer application), such as a frequency of less than about 200 Hz, such as a range of about 20 Hz to about 120 Hz or to about 180 Hz or thereabouts. Optionally, however, the acoustic window assembly may vibrate the window panel at other desired frequencies (such as frequencies above 200 Hz), and may be able to use the vibrating window panel as an additional low, medium or high range speaker that is capable of generating sound throughout a wide range of frequencies. The window assembly thus may provide the desired range of sound waves depending on the particular application and desired sound output of the acoustic window assembly. Optionally, the acoustic window assembly may be used to provide external sound generation (such as at a broader frequency range) for listening to music or the like from outside the vehicle, if desired, such as for picnics or "tailgating" functions and/or the like.

The exciter 38 is an elongated element or member that receives piezoelectric actuating device 36 at a generally central region of the exciter (however, the piezoelectric actuating device may be positioned elsewhere along the exciter, and/or may include two piezoelectric actuating devices, with one at each end or end region of the exciter, without affecting the scope of the present invention). Exciter 38 comprises an elongated, substantially rigid upper side member or upper plate 40a and an elongated, substantially rigid lower side member or lower plate 40b and a pair of generally central members or rods or ribs or plates 42 that extend between the plates 40a, 40b and that engage the respective end faces of the piezoelectric actuating device 36 (which may be received in or engage inner end portions or receptacles 46 at the inner ends of the central rods 42). Central rod 42 and plates 40a, 40b are interconnected via a plurality of angled or diagonal members or ribs 44, which, in the illustrated embodiment, angle outward and away from the piezoelectric actuating device and from the central rod 42 and to the respective one of the plates 40a, 40b. The exciter thus has a generally fish-bone shape of ribs extending outward at either end of the piezoelectric actuating device.

The central plates and upper/lower plates and ribs may comprise various materials, such as metallic materials or plastic or polymeric materials. Preferably, the materials and/ or thicknesses selected for the upper and lower plates provide substantial rigid plates to provide the desired non-bending vibratory motion of the plates and window panel during operation of the actuating device. For example, the plates may comprise a metallic material, such as, for example, 1080 or 4130 steel or other suitable metallic material, or engineered plastics or other suitable high strength plastic or polymeric materials. Optionally, the ribs may comprise a flexible material to allow for flexing during operation of the actuating device. For example, the ribs may comprise spring steel or stainless steel, such as, for example, 17-7 PH stainless steel or 302 stainless steel or 1080 steel or the like, or other suitable metallic material or suitable plastic or polymeric material). Optionally, for example, the plates or the ribs may comprise a NANOFLEX® material (commercially available from Sandvik Materials Technology), which may provide the desired strength while allowing for reduced mass and weight of the exciter assembly.

The inboard ends of the central plates 42 are engaged with or attached to the end faces of piezoelectric actuating device 36 (which may be received in receptacle elements 46 at the ends of the plates 42) so that movement of the end faces 36a imparts a corresponding longitudinal movement of the central plates 42. The receptacle ends 46 at the inboard ends of the plates 42 may be formed to correspond to the shape or form of the end faces of the piezoelectric actuating device, and may connect to or attach to the end faces (such as via a threaded type engagement or a snap type engagement or a ball and socket type engagement or the like) so that the longitudinal movement of the end faces is substantially translated to longitudinal movement of the central plates 42. The exciter functions to amplify the stroke of the piezoelectric actuating device and to divert the stroke toward and away from the window panel so as to function as a mechanical amplifying device or element that is responsive to the piezoelectric actuating device.

When mounted in the vehicle, the rigid lower plate 40b of exciter 38 is fixedly secured to mounting block 34, which is fixedly secured to the vehicle frame portion or sheet metal (or the rigid lower plate may mount directly to the vehicle body or frame or sheet metal), while the rigid upper plate 40a of exciter 38 is adhered to or secured to the interior surface of the window panel 14. Optionally, and desirably, the upper plate 40a and/or lower plate 40b of the exciter 38 may be formed to generally correspond with the shape of the window panel and/or the shape of the mounting bracket or vehicle sheet metal, respectively. For example, and as can be seen in FIG. 12, the upper plate (or an attaching element or interface element attached to the upper plate) may be formed to have a thicker cross section at a central region so as to provide a curved upper attaching surface for attaching or adhering or bonding to a curved portion or surface of the window panel. Optionally, the upper and lower plates or plate portions may also include raised ribs or protrusions or dimples or projections or the like at their attaching surfaces, such that the raised protrusions engage the inner surface of the window panel or the mounting platform or surface of the vehicle to establish or provide the desired bond layer thickness or adhesive layer thickness between the attaching surfaces of the exciter and the corresponding window panel or bracket or vehicle structure.

As discussed above, longitudinal movement of the end faces 36a of piezoelectric actuating device 36 imparts a corresponding longitudinal movement of the central plates 42 of exciter 38. Because the upper and lower plates 40a, 40b are substantially fixedly attached to the window panel and vehicle frame, respectively, such longitudinal movement of the central plates 42 causes the ribs 44 to flex and/or pivot at their attachment areas 44a and to move the upper and lower plates 40a, 40b toward and away from one another. For example, when the end faces 36a of the piezoelectric actuating device 36 move outward and away from the piezoelectric actuating device, the central plates are also moved outward and away from the piezoelectric actuating device. Such outward movement of the central plates 42 relative to the fixed plates 40a, 40b causes the attachment areas 44a of the ribs to flex and for the ribs 44 to exert a force against the respective plates 40a, 40b to move the upper plate 40a outward away from the lower plate 40b so as to exert an outward force and motion against the window panel 14. Movement of the end faces 36a of the piezoelectric actuating device 36 in the inward longitudinal direction imparts a similar but opposite movement of the central plates 42 and upper/lower plates 40a, 40b of the exciter 38. Ribs 44 thus pivot and/or flex to move the upper/lower plates 40a, 40b toward and away from the central plate 42 and toward and away from one another as the piezoelectric actuating device pulses to move the central plates inward and outward along the longitudinal axis of the exciter.

In the illustrated embodiment, and as shown in FIG. 16, each rib 44 comprises a stamped or formed metallic rib having a generally central portion 44b and opposite end or attaching portions 44a. The end portions 44a are bent relative to the central portion 44b, such that the end portions may be generally parallel to one another and parallel to the central rod or plate 42 and the respective upper or lower plate 40a, 40b, with the central portion 44b of the rib 44 being at an angle therebetween. The central portion 44b of rib 44 may comprise a substantially rigid or non-flexing portion, while the bend area at the junction of the central portion 44b and the end portions 44a may flex during operation of the actuating assembly to allow for translation of a lateral or generally horizontal movement of the rod or plate 42 to a generally vertical movement of the upper or lower plate 40a, 40b. In order to stiffen the central portion 44b of the rib 44, the central portion 44b may have additional material or structure formed or established thereat. For example, and as shown in FIG. 16, the central portion 44b may include an additional layer or layers 44c of the metallic material folded or overlayed over and/or around the central portion 44b (such as, for example, by stamping a rib element and folding one or more wings of the central portion over one or both of the surfaces of the central portion) to strengthen/stiffen the central portion of the rib 44.

Figure 15:
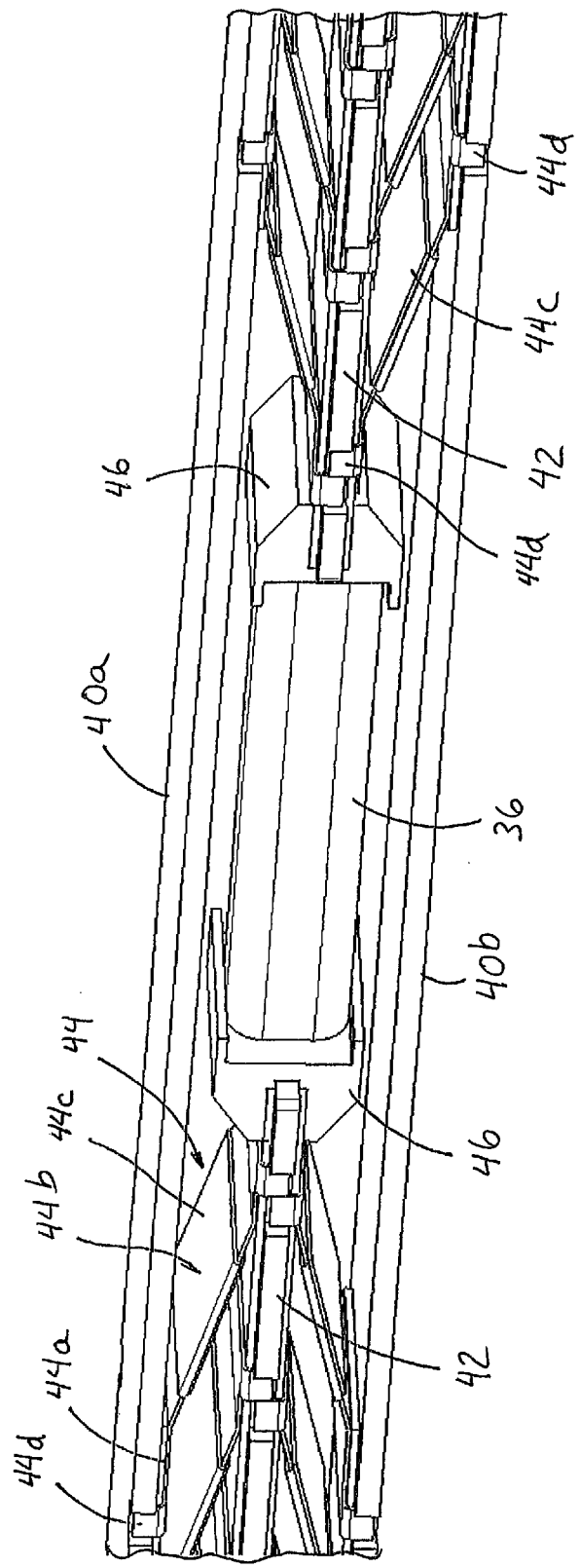
FIG. 15 is an enlarged perspective view of the actuating device at the central portion of the exciter of FIGS. 13 and 14.

In the illustrated embodiment, the end portions 44a of the rib 44 include tabs 44d extending laterally outward therefrom. Tabs 44d are bent relative to the respective end portion 44a to assist in locating and attaching the rib 44 to the central rod or plate 42 and the upper or lower plate 40a, 40b. For example, and as can be seen in FIG. 15, the tabs 44d may be received in correspondingly shaped or formed notches along the side edges of the central plate 42 and respective upper/lower plate 40a, 40b. Optionally, the ribs may also or otherwise be attached to the respective plates via other suitable attaching means, such as welding or soldering or adhering or bonding or the like, while remaining within the spirit and scope of the present invention.

By receiving the tabs 44d in the notches, longitudinal movement of the ribs 44 relative to the plates 40a, 40b, 42 is substantially precluded during operation of the actuating assembly. Thus, longitudinal movement of the central plate 42 moves the end portions of the ribs that are attached to the central plate to move longitudinally, which (due to the fixed attachment of the upper plate to the window panel and the lower plate to the vehicle) imparts a generally transverse movement of the other end portions of the ribs and of the respective upper and lower plates. The bend joints or junctions of the end portions and center portions of the ribs flex to allow the ribs to impart such a transverse force and movement without detaching from either of the upper/lower plates 40a, 40b and the central plate or rod 42.

Figure 17A:
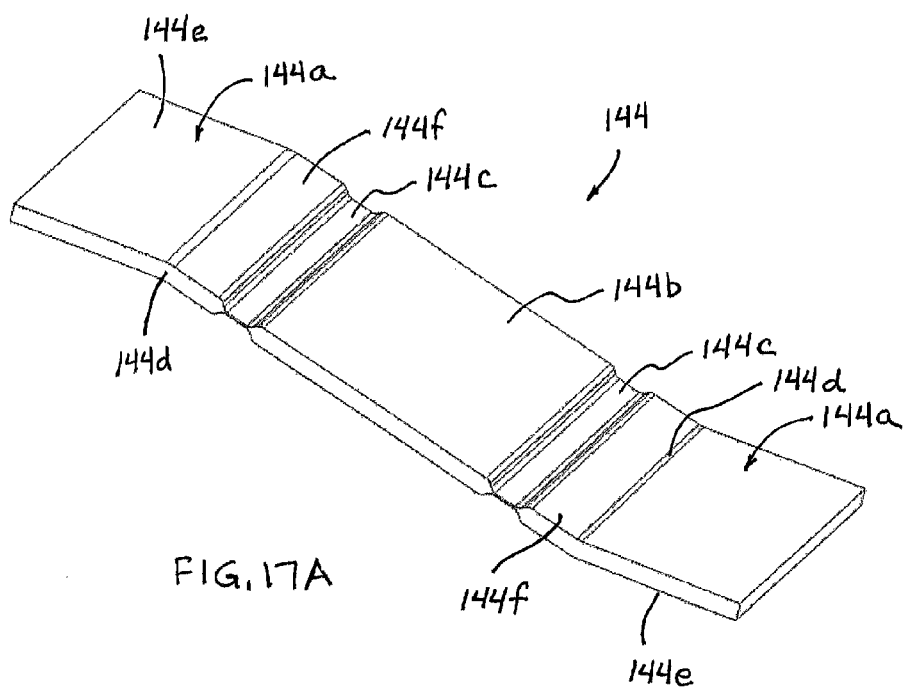
FIG. 17A is an enlarged perspective view of another rib element suitable for the exciter of the window assembly of the present invention.
Figure 17B:
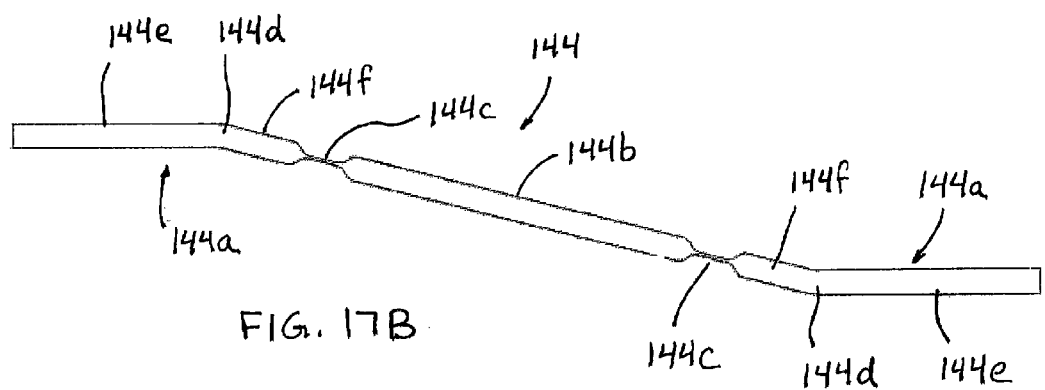
FIG. 17B is a side elevation of the rib element of FIG. 17A.

Optionally, other rib shapes or forms or diagonals may be implemented while remaining within the spirit and scope of the present invention. For example, and with reference to FIGS. 17A and 17B, a rib or diagonal element 144 may comprise a formed metallic rib having a generally central portion 144b and opposite end or attaching portions 144a. The end portions 144a are bent relative to the central portion 144b, such that the end portions may be generally parallel to one another and parallel to the central rod or plate and the respective upper or lower plate of the exciter, with the central portion 144b of the rib 144 being at an angle therebetween. The central portion 144b of rib 144 may comprise a substantially rigid or non-flexing portion, while a bend or flex area 144c at or near the junction of the central portion 144b and the end portions 144a may flex during operation of the actuating assembly to allow for translation of a lateral or generally horizontal movement of the rod or plate to a generally vertical movement of the upper or lower plate.

In the illustrated embodiment, the rib 144 is formed so that the bend or flex areas 144c have a reduced thickness as compared to the central portion 144b and end portions 144a of the rib 144. The thin or narrowed sections that create the bend or flex zones are disposed or established inward of or remote from the bend or transition 144d between the planar portion 144e of the end portion 144a that is mounted to the upper or lower plate or beam and the angled portion 144f of the end portion that is generally at the angle of or aligned with the angular or angled central portion or section 144b of the rib. The bend or flex zones are thus at the body of the diagonal central section 144b. Such a configuration enhances the manufacturing of the ribs, and allows the manufacturer to optionally utilize chemical milling and/or photo etching processes to create the rib with the narrowed bend or flex zones or portions. Optionally, any suitable forming means may be implemented to form the ribs, such as chemical milling or photo etching with a forming operation, or stamping and fine blanking with coining to form the bend zones, or the like, while remaining within the spirit and scope of the present invention.

For example, the ribs may be formed from a sheet of material and the narrowed flex zones may be established via a photo etching process or processes. Such photo etching or photo chemical machining (also referred to as photo fabrication, chemical blanking or photo chemical milling) is known in the production of precision parts such as small parts for electronic products, and may be provided by Microphoto, Inc. of Roseville, Mich. The photo etching process typically is used to cut out or form small parts in detailed patterns. The process typically includes making an outline of the desired patterned product on a photo tool and laminating one or both sides of a product plate with a photo-resistant material. The product is then exposed on the laminated product plate so that the product outline or profile is established on the plate. An etching process is performed which functions to dissolve (such as via a suitable etching fluid or chemical or the like) the residue material (the material around the product outline and not part of the final product) so that, upon completion of the etching process, the product is formed to its desired patterned shape.

In the application of such a photo etching process to the formation of the ribs for use in the actuating assembly of the present invention, the narrowed flex zones of the ribs are formed by the chemical etching from each side of a flat plate that is to be formed or etched to the desired shape of the ribs. The flex zones are demarcated or established on the plate so that those zones (and not the other sections of the ribs) are etched by the etching process. The etching step or process is then limited to a predetermined time period that results in the etching process dissolving the part material at the flex zones so as to reduce the thickness of the part at the flex zones a desired or predetermined amount. Such a process can be highly accurate and repeatable to reduce or remove or dissolve a desired or appropriate or predetermined amount of material at the flex zones and thus to leave a desired or appropriate or predetermined thickness of the material to achieve the desired or appropriate or predetermined flexibility of the ribs at the flex zones. Also, the etching process (such as a separate etching process either before or after the forming or etching of the flex zones) may be used to cut or etch or form the individual ribs from a plate of the metallic material. After the ribs are formed or shaped and have the narrowed flex zones established thereon, the ribs may be mechanically bent or formed to have the desired bends at the junction of the center section and the end sections of the ribs.

Thus, the photo etching process may form the ribs and the narrowed flex zones without any mechanical cutting of the ribs or plate material. Such a process thus provides enhanced accuracy in forming the ribs and flex zones without any burrs or imperfections or external stresses that may otherwise result from a stamping or cutting or grinding operation or the like. The ribs thus may be readily formed with the narrowed flex sections or zones in a highly accurate and repeatable manner.

Thus, and as can be seen with reference to FIG. 1, the piezoelectric actuating device 36 generates a stroke or pulse generally along the window panel at which it is positioned. The ribs and plates of the exciter are configured so that the pulse of the piezoelectric actuating device (of a distance of about 40 to 75 microns) may, for example, be transformed into a pulse of the upper plate 40a of about 0.1 to about 0.3 mm of displacement or up to about 0.5 mm of displacement, while the force exerted by the piezoelectric actuating device may be, for example, about 1500 to 2500 Newtons, which may be converted or transformed to a force of about 250 Newtons or about 100 to 300 Newtons or thereabouts exerted by the substantially rigid upper plate 40a at the window surface. The exciter 38 thus receives the pulse from the piezoelectric actuating device 36 and imparts a corresponding and amplified pulse or stroke or movement in a direction that is generally normal to the pulse or stroke of the piezoelectric actuating device 36. The generally lateral or cross car pulse of the piezoelectric actuating device is thus converted into an outward and inward pulse at the lower portion of the window panel to cause the window panel to move outward and inward about the generally fixed upper perimeter portion of the window panel. The exciter thus takes the generally horizontal force and stroke of the piezoelectric actuating device and redirects it and amplifies the stroke to a generally vertical or partially vertical stroke at the window panel while reducing the force output of the actuating device to a reduced generally vertical or partially vertical force at the window panel, so as to cause the window panel to move inward and outward or vibrate at the desired frequency as dictated by the audio system and the piezoelectric actuating device.

The upper and/or lower mounting or attaching or interface members or plates of the exciter assembly are substantially rigid or stiff and substantially non-flexible, such as having a flexibility of, for example, about $1 \times 10^{-7}$ mm/N or thereabouts. Optionally, the mechanical exciter assembly may be coated or impregnated with an adhesive or other suitable coating material to enhance the stiffness of the components or elements and to environmentally protect the components or elements and the assembly, and to fill in any microcracks or the like in the individual components or elements or assembly.

Figure 18B:
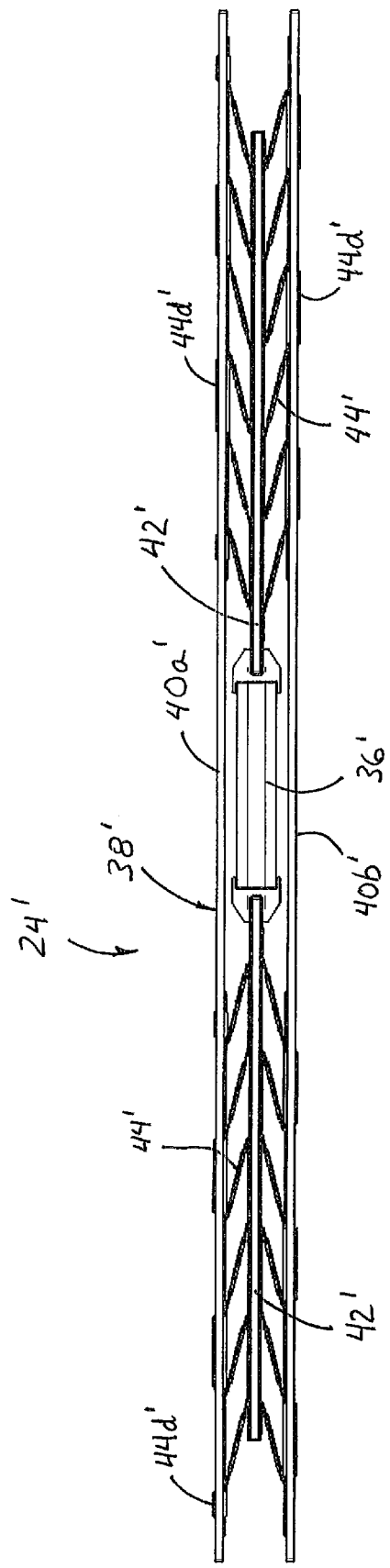
FIG. 18B is a side elevation of the actuating device and exciter of FIG. 18A.

Optionally, other forms or types of exciters or force/pulse transfer devices may be implemented in conjunction with the actuating device without affecting the scope of the present invention. For example, and as shown in FIGS. 18A-19, an actuating assembly 24' may include an exciter 38' having an upper plate 40a', a lower plate 40W, a pair of generally central plates or rods or members 42' and a plurality of ribs 44' pivotally connected to the central plate 42' and upper/lower plates 40a', 40b'. A piezoelectric actuating device 36' is operable to impart a longitudinal vibratory motion of the central plate 42', which in turn imparts a transverse vibratory motion of the upper/lower plates 40a', 40b' via flexing of the ribs 44', such as in a similar manner as described above.

In the illustrated embodiment, and as best shown in FIG. 20, the ribs 44' are formed from a single or unitary stamping or element 45' that defines or provides a plurality of central rib portions 44b' and mounting portions 44a' at opposite ends of each central rib portion 44b'. The mounting portions 44a' are bent relative to the central portion 44b', such that the mounting portions may be generally parallel to one another and parallel to the central plate 42' and the respective upper or lower plate 40a', 40b', with the central rib portions 44b' being at an angle therebetween. The central rib portions 44b' may comprise a substantially rigid or non-flexing portion, and may include additional material or structures or flaps 44c' folded over or established at the central rib portions such as in a similar manner as described above, while the bend area at the junction of the central rib portions 44b' and the mounting portions 44a' may flex during operation of the actuating assembly to allow for translation of a lateral or generally horizontal movement of the central plate 42' to a generally vertical movement of the upper or lower plate 40a, 40b', such as discussed above.

In the illustrated embodiment, the mounting portions 44a' include tabs 44d' extending therefrom that are bent relative to the respective end portion 44a' to assist in locating and attaching the rib 44' to the central plate 42' and the upper or lower plate 40a', 40b'. For example, and as can be seen in FIG. 19, the tabs 44d' may be wrapped around the side edges of the central plate 42' and respective upper/lower plate 40a', 40b'. As can also be seen in FIG. 19, the rib elements 45' may be staggered such that the tabs 44d' of one element are longitudinally offset from the tabs 44d' of the other element, while the ribs 44' are generally aligned along the central plate 42'. The tabs 44d' may be wrapped around the side edges of the central plate 42' and upper/lower plate 40a', 40b', or may be inserted through apertures or received in channels or notches formed along the plates 40a', 40b', 42' and may be bent along the opposite surface of the respective plate, such as shown in FIG. 18A, and may be secured thereat to limit or substantially preclude longitudinal movement of the rib element relative to the respective plates of the exciter assembly or device.

Optionally, the ribs may also or otherwise be attached to the respective plates via other suitable attaching means, such as welding or soldering or adhering or bonding or the like, while remaining within the spirit and scope of the present invention. Optionally, for example, and with reference to FIG. 21, a rib element 45" may be formed to provide a plurality of rib portions 44" along and between the central plate and one of the upper and lower plates. As can be seen in FIG. 21, rib element 45" defines or provides a plurality of central rib portions 44b" and mounting portions 44a" at opposite ends of each central rib portion 44b". The mounting portions 44a" are bent relative to the central portion 44b", such that the mounting portions may be generally parallel to one another and parallel to the central plate 42" and the respective upper or lower plate 40a", 40b", with the central rib portions 44b" being at an angle therebetween. The central rib portions 44b" may comprise a substantially rigid or non-flexing portion, and may include additional material or structures or flaps 44c" folded over or established at the central rib portions such as in a similar manner as described above, while the bend area at the junction of the central rib portions 44b" and the mounting portions 44a" may flex during operation of the actuating assembly to allow for translation of a lateral or generally horizontal movement of the central plate to a generally vertical movement of the upper or lower plate, such as discussed above. In the illustrated embodiment, the mounting portions 44a" of the rib element 45" provide substantially planar mounting portions that may engage the opposed surfaces of the respective plates, and that may be secured or retained along the respective plates to limit longitudinal movement of the rib element relative to the plates, such as via welding or soldering or otherwise fastening or attaching or securing the rib element to the plates.

Optionally, other forms of actuating assemblies and/or exciters may be implemented to provide a non-flexing vibratory force or vibrational force at the inner surface of the window panel while remaining with the spirit and scope of the present invention. For example, an exciter may not include a fishbone configuration of ribs and plates, but may include a flexible element or elements that are affixed to an upper plate and a lower plate and that flex to move the upper plate toward and away from the lower plate in response to the actuating device. Such a configuration may provide enhanced assembly and manufacturing processes by reducing welds and crimps and the like during the assembly process of the exciter device or assembly.

Figure 22:
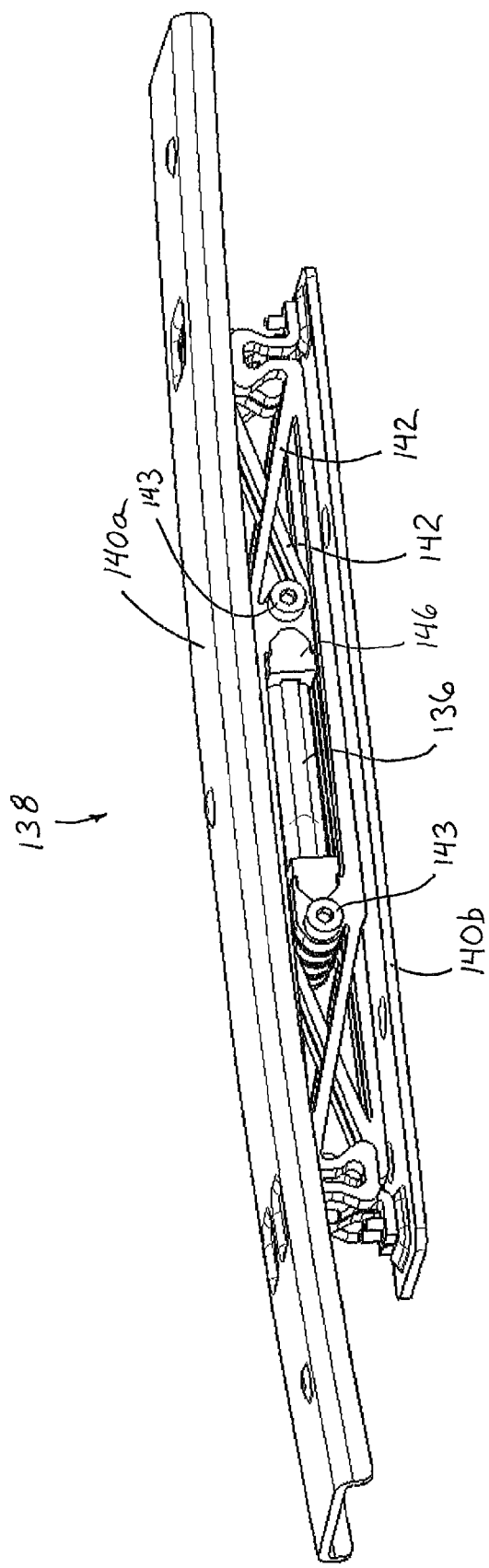
FIG. 22 is a perspective view of another actuating device and exciter suitable for use with the acoustic window assembly of the present invention.
Figure 23:
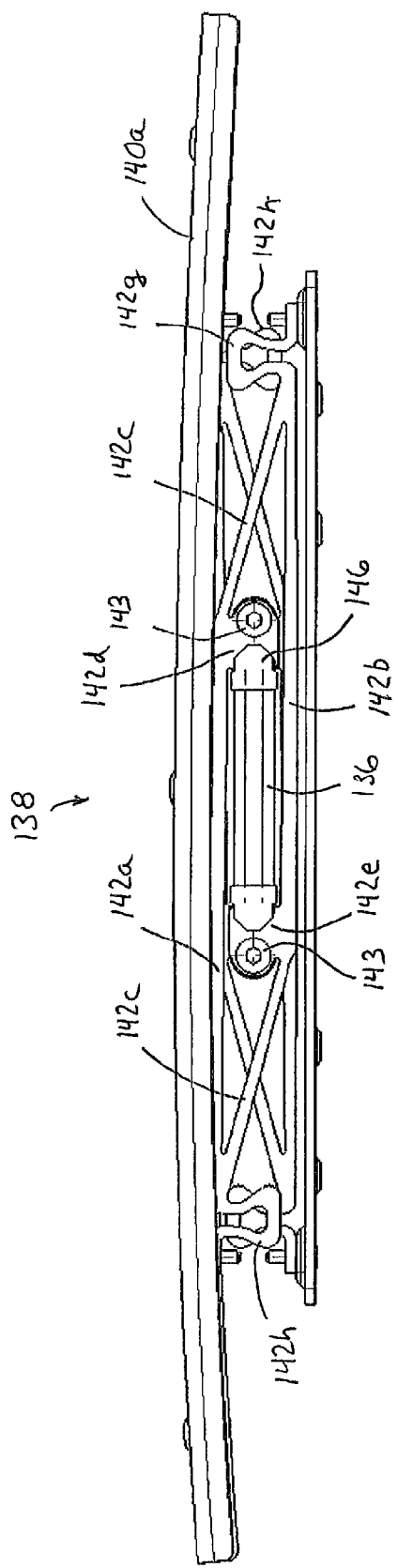
FIG. 23 is a side elevation of the actuating device and exciter of FIG. 22.
Figure 24:
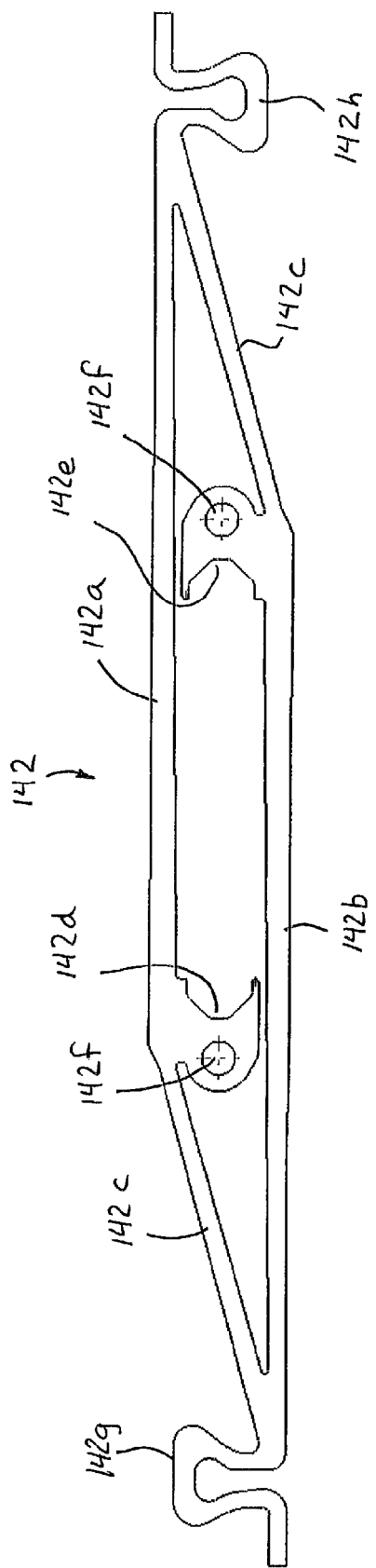
FIG. 24 is a side elevation of a stamped rib structure suitable for the exciter of FIGS. 22 and 23.
Figure 25:
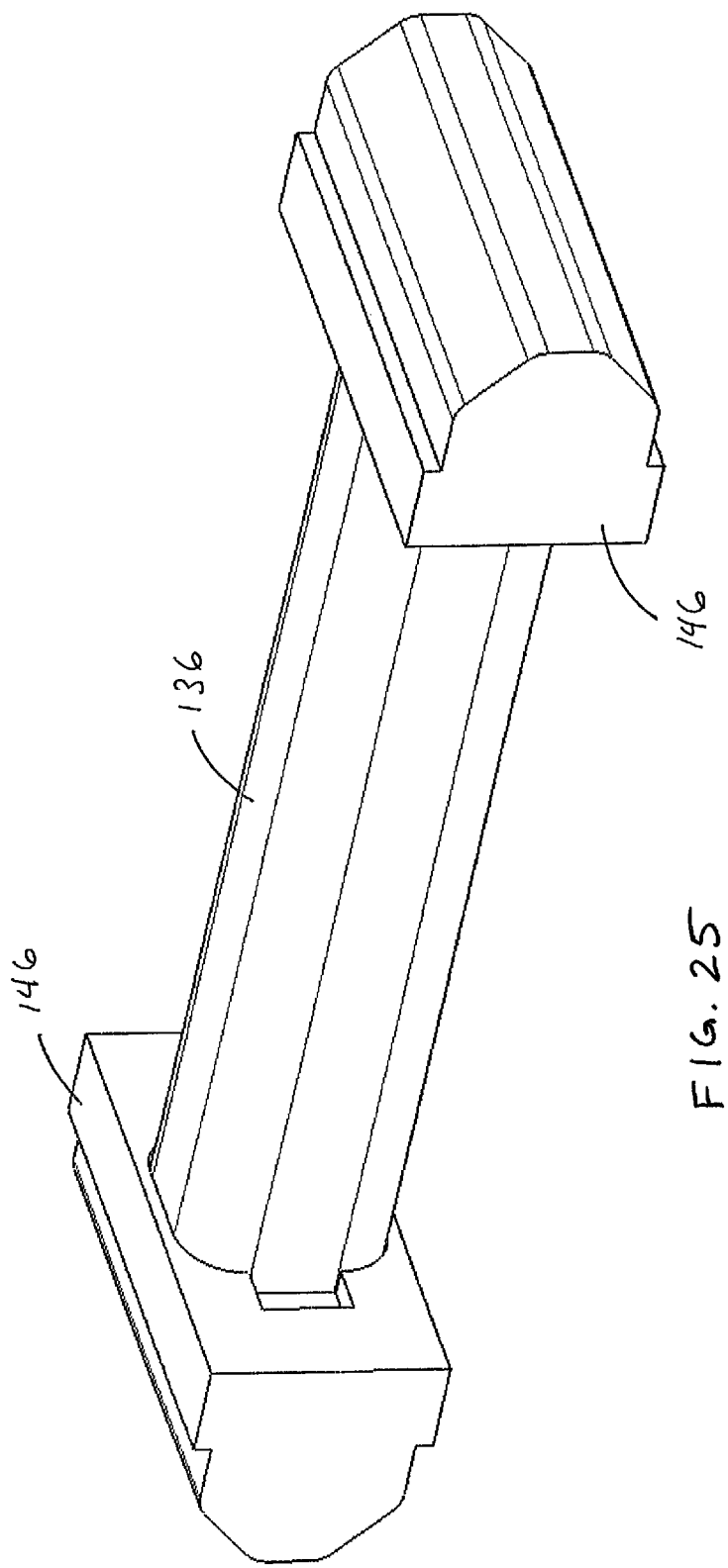
FIG. 25 is an enlarged perspective view of the actuating device and mounting ends for mounting the actuating device at a central portion of the exciter of FIGS. 22 and 23.
Figure 26:
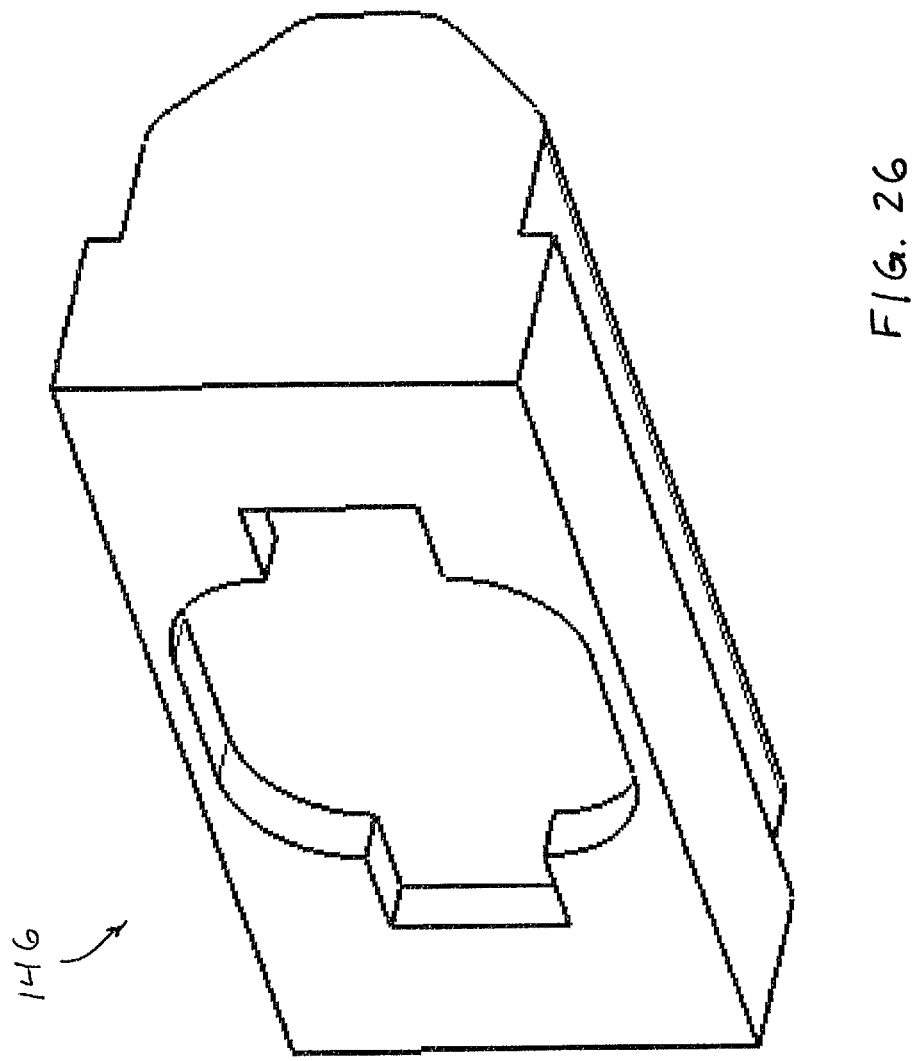
FIG. 26 is an enlarged perspective view of a mounting end suitable for mounting the actuator to the exciter of FIGS. 22 and 23.

For example, and with reference to FIGS. 22-24, an exciter assembly 138 comprises an elongated, substantially rigid upper member or upper plate 140a and an elongated, substantially rigid base or lower member or lower plate 140b and a plurality of flexible elements or plates 142 that extend between the plates 140a, 140b and that engage the respective end faces 136a of the piezoelectric actuating device 136. In the illustrated embodiment, the flexible elements 142 comprise stamped or extruded forms that are arranged side-by-side across the base or lower plate 140b of the exciter assembly 138, with one end of each form or element being attached to the lower plate 140b and the other end of each form or element being attached to the upper plate 140a.

In the illustrated embodiment, and as best shown in FIG. 24, each flexible element 142 is a generally parallelogram-shaped form or element that has an upper portion 142a, a lower portion 142b and angled side portions 142c. The flexible element 142 includes opposite receiving portions 142d, 142e at a central region thereof for receiving the opposite ends of the actuating device 136 therein. As can be seen in FIG. 24, one receiving portion 142d is formed with the upper portion 142a, while the other receiving portion 142e is formed with the lower portion 142b. The flexible element also includes an aperture 142f at each of the receiving portions 142d, 142e. A flexible or compressible/expandable mounting element or portion 142g, 142h is formed at each end of the flexible element 142 for mounting to one of the upper/lower plates 140a, 140b. For example, and with reference to FIG. 24, the left end mounting element 142g is secured to the lower plate 140b (such as via a suitable fastener or pin or post or the like), while the right end mounting element 142h is secured to the upper plate 140a (such as via a suitable fastener or pin or post or the like).

When the exciter assembly is assembled, the flexible elements (such as four similarly formed flexible elements or more or less depending on the particular application) are arranged in an alternating fashion next to one another (such as with the laterally outboard flexible elements being arranged in one manner and the inboard flexible elements being arranged in the other or opposite manner or otherwise alternatingly arranged as desired), as can be seen in FIG. 22, such that one end of one element is attached to the base or lower plate 140b, while the corresponding end of an adjacent element is attached to the upper plate 140a. The flexible elements 142 may be pinned or joined or connected together via a pin 143 inserted through the apertures 142f at each of the receiving portions 142d, 142e. When assembled together, the receiving portions of the flexible elements define or form a receiving pocket for receiving a respective end of the actuating device 136 therein. In the illustrated embodiment, the actuating device 136 may have an engaging element or portion 146 at each end that is formed to be received in the receiving pocket of the respective receiving portions to substantially retain the ends of the actuating device relative to the flexible elements.

Figure 27:
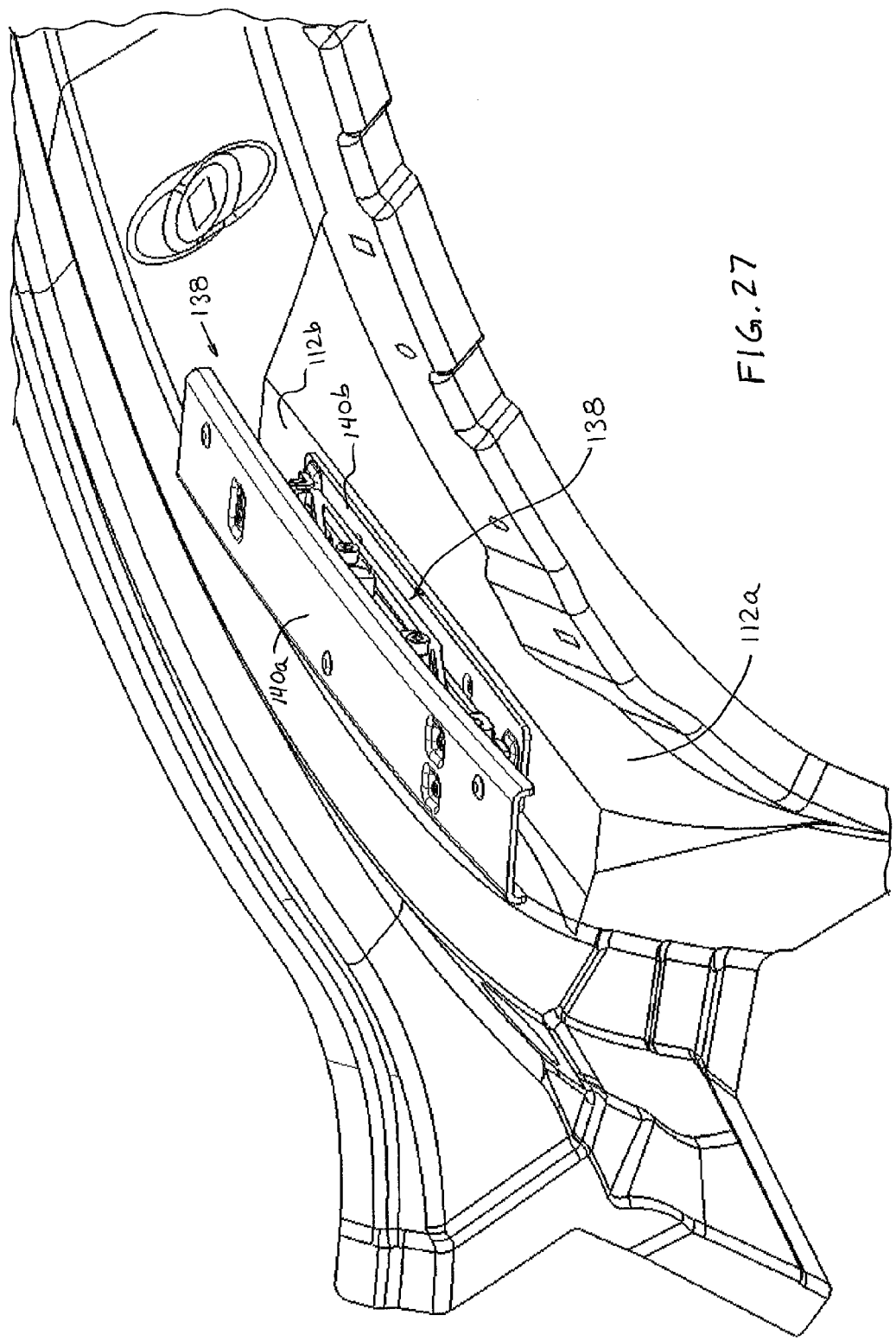
FIG. 27 is a perspective view of the actuating device and exciter of FIGS. 22 and 23, shown mounted at a structural platform of a vehicle.

Thus, the flexible elements may be arranged between the upper and lower plates and may flex in response to the pulsation of the actuating device to cause a relative motion of the upper plate toward and away from the lower plate or base of the exciter. During operation of the actuating device, the actuating device pulses or vibrates via extension and retraction of the ends along the longitudinal axis of the upper and lower plates 140a, 140b. Such extension of the actuating device causes the upper element or portion 142a to move away from the lower element or portion 142b of the flexible element to thus vibrate or pulse the upper plate 140a relative to the lower plate 140b. As can be seen with reference to FIG. 24, movement of receiving portion 142d toward the left side of FIG. 24 pulls at mounting element 142h, which flexes to allow for such movement, while movement of receiving portion 142e toward the right side of FIG. 24 similarly pulls at mounting element 142g, which flexes to allow form such movement. As the parallelogram form or shape is moved in this manner, the upper and lower portions 142a, 142b move toward and away from each other to vibrate or pulse the upper plate 140a relative to lower plate 140b. Because of the alternating arrangement of the flexible elements across the exciter assembly, the pulsing motion or action is substantially uniform across the upper plate to provide a substantially uniform vibration of the upper plate (and thus of the window panel) relative to the lower plate or base (and thus the vehicle body or frame or sheet metal), without movement in the longitudinal direction along the upper and lower plates. As can be seen in FIG. 27, the vehicle body or frame or sheet metal 112a may be formed to provide a platform or mounting structure or surface 112b for attaching the lower plate or base 140b of exciter assembly 138, and whereby the platform or mounting structure or surface may be substantially rigid to limit vibration or movement or flexing of the lower plate 140b of exciter assembly 138 relative to the vehicle body or frame or sheet metal, such as in a similar manner as discussed above.

Figure 28:
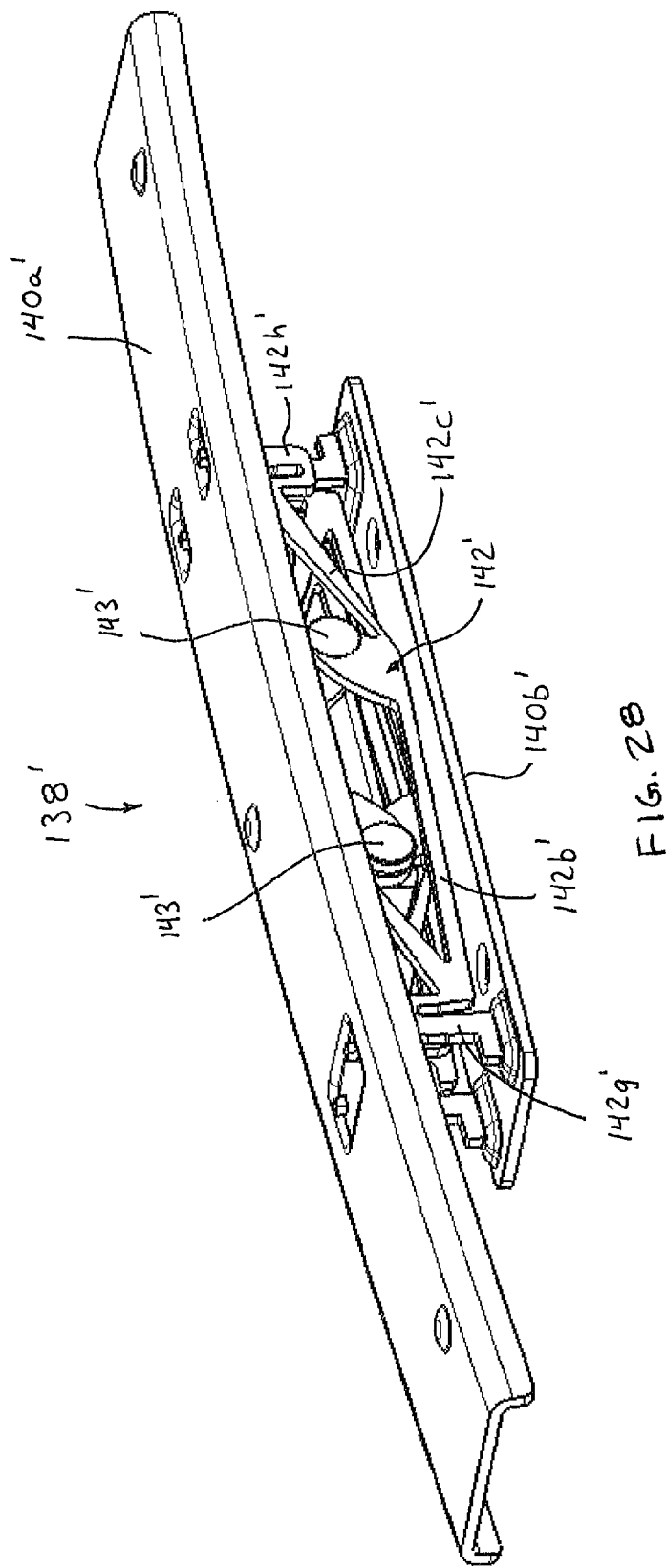
FIG. 28 is a perspective view of another actuating device and exciter suitable for use with the acoustic window assembly of the present invention.
Figure 29:
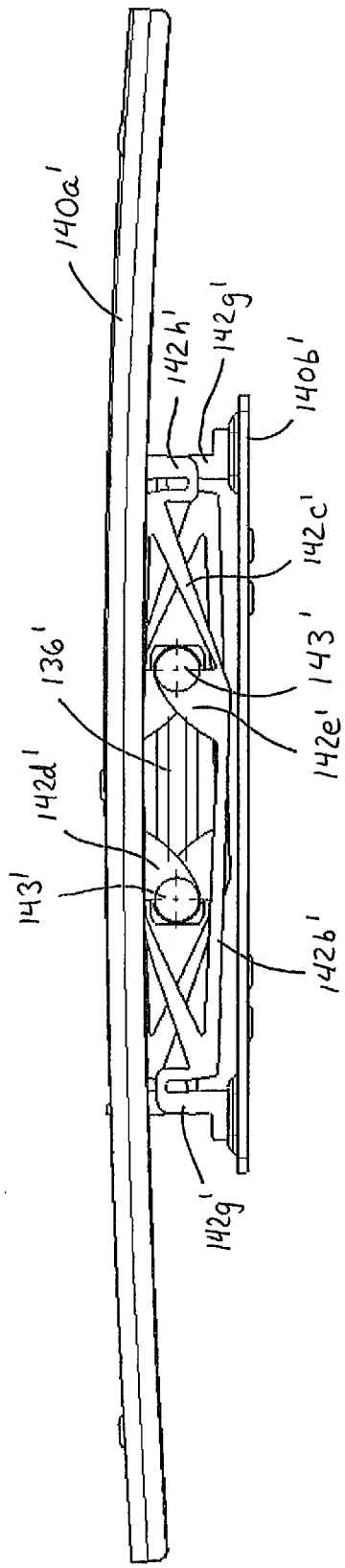
FIG. 29 is a side elevation of the actuating device and exciter of FIG. 28.

Optionally, other flexible element configurations and shapes may be implemented that may convert a longitudinal pulsation and force to a movement and force that is generally normal to the longitudinal direction. For example, and with reference to FIGS. 28-30, an exciter assembly 138' comprises an elongated, substantially rigid upper side member or upper plate 140a' and an elongated, substantially rigid lower side member or lower plate 140b' and a plurality of flexible elements or plates 142' that extend between the plates 140a', 140b' and that engage the respective end faces of the piezoelectric actuating device 136'. Similar to flexible elements 142, discussed above, the flexible elements 142' comprise stamped or extruded forms (such as a parallelogram form or shape) that are arranged side-by-side across the base or lower plate 140b' of the exciter assembly 138', with one end of each form or element being attached to the lower plate 140b' and the other end of each form or element being attached to the upper plate 140a'. Also similar to exciter assembly 136, discussed above, the flexible elements 142' (such as four similarly formed flexible elements or more or less depending on the particular application) may be arranged in an alternating manner across the base or lower plate and the upper plate of the exciter assembly 136' are arranged in an alternating fashion next to one another (such as with the laterally outboard flexible elements being arranged in one manner and the inboard flexible elements being arranged in the other or opposite manner).

Figure 30:
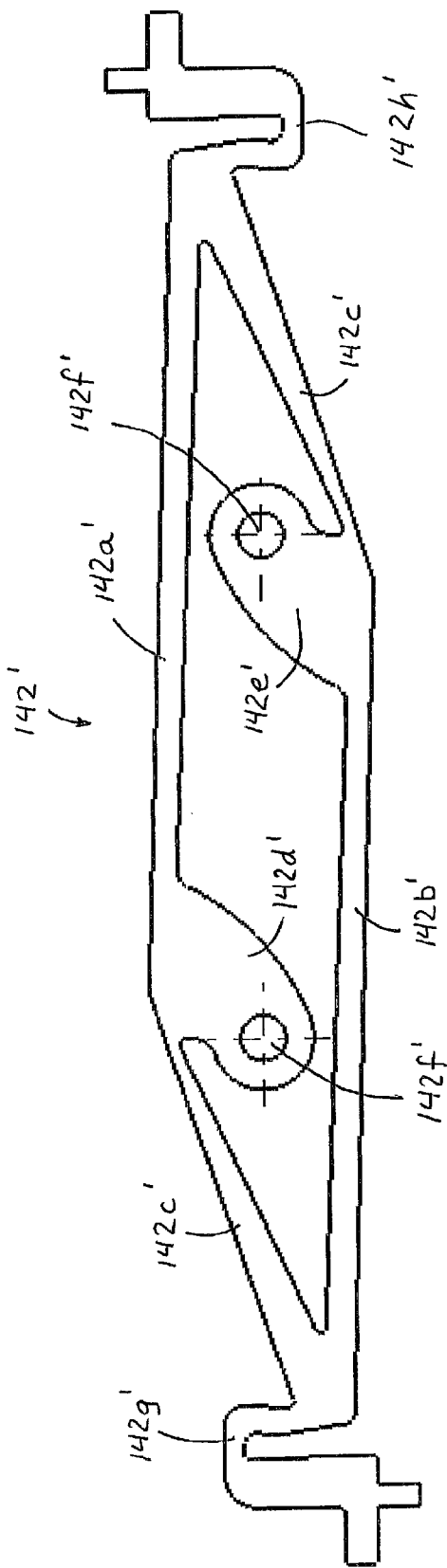
FIG. 30 is a side elevation of a stamped rib structure suitable for the exciter of FIGS. 28 and 29.

In the illustrated embodiment, each flexible element 142' includes an upper portion 142a', a lower portion 142b' and angled side portions 142c'. The flexible element 142' includes opposite actuator attaching portions 142d', 142e' at a central region thereof for attaching to the opposite ends of the actuating device 136 of the actuating assembly 124'. As can be seen in FIG. 30, one attaching portion 142d' is formed with the upper portion 142a', while the other attaching portion 142e' is formed with the lower portion 142b'. The flexible element also includes an aperture 142f at each of the receiving portions 142d', 142e' for receiving a pin 143' (FIGS. 28 and 29) therethrough to join the flexible elements together and to join or retain the ends of the actuating device relative to the flexible elements. A flexible or compressible/expandable mounting element or portion 142g', 142h' is formed at each end of the flexible element 142' for mounting to one of the upper/lower plates 140a', 140b'. For example, and with reference to FIG. 30, the left end mounting element 142g' is secured to the lower plate 140b' (such as via a suitable fastener or pin or post or the like), while the right end mounting element 142h' is secured to the upper plate 140a' (such as via a suitable fastener or pin or post or the like). The actuating assembly 124' and exciter assembly 138' may be otherwise substantially similar in assembly and operation as actuating assembly 124 and exciter assembly 138, discussed above, such that a detailed discussion of the actuating assemblies and exciter assemblies need not be included herein.

Figure 31:
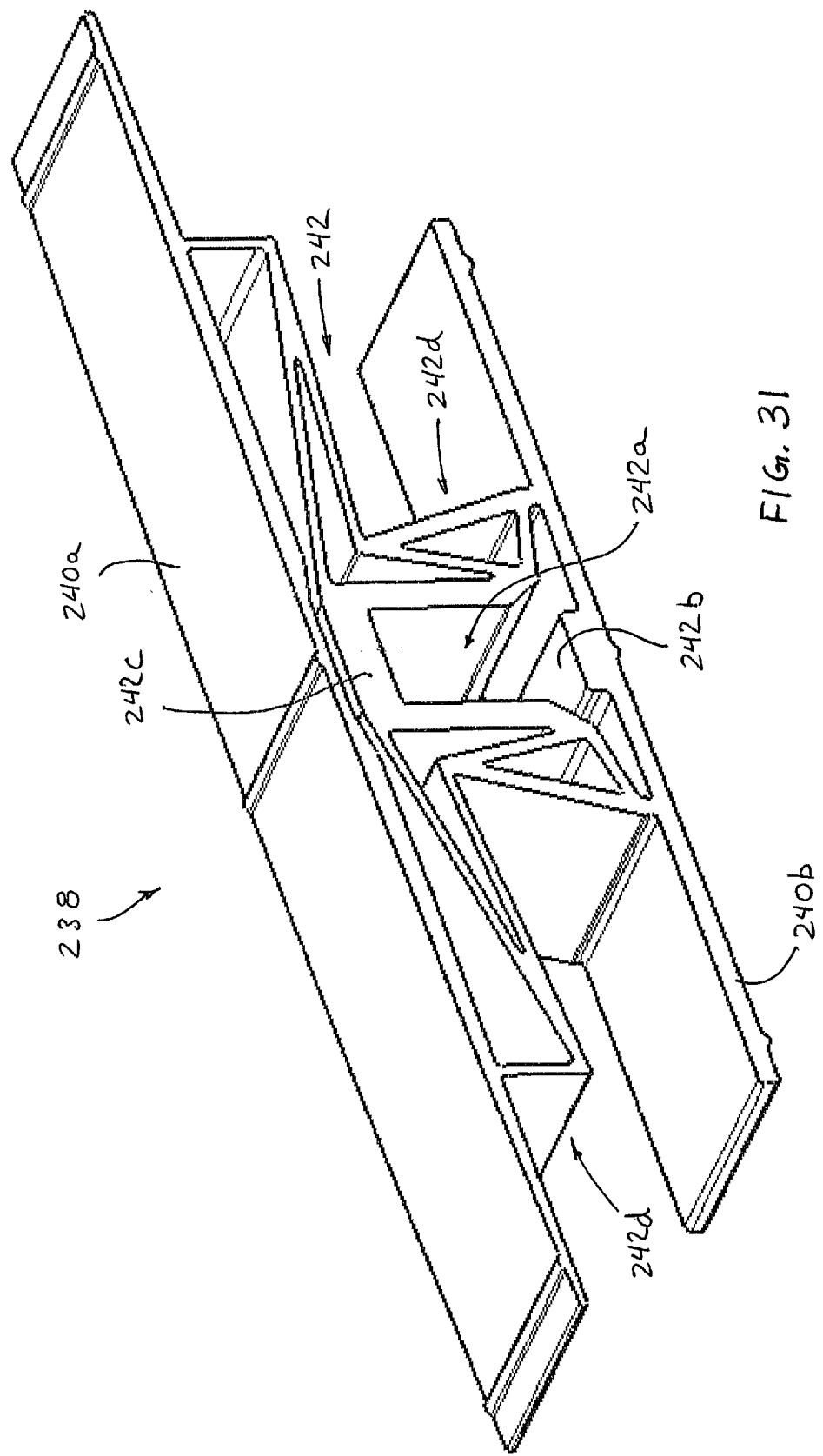
FIG. 31 is a perspective view of another actuating device and exciter suitable for use with the acoustic window assembly of the present invention.
Figure 32:
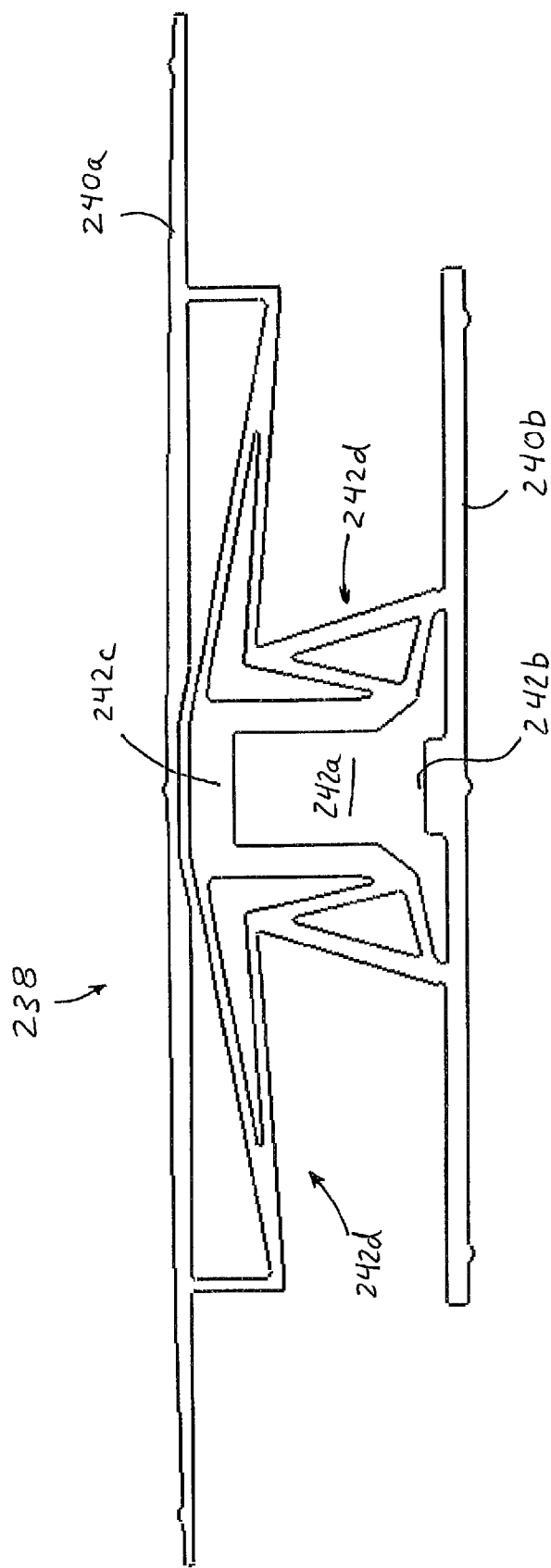
FIG. 32 is a side elevation of the actuating device and exciter of FIG. 31.

Optionally, other forms of exciter assemblies may be implemented, including exciter assemblies that convert the vibrational forces provided by an actuating device that is arranged generally normal to the upper and lower plates or members of the exciter assembly. For example, and with reference to FIGS. 31 and 32, an exciter assembly 238 may include an upper or window panel engaging plate or member 240a and a base or lower plate 240b, with a flexible element 242 disposed therebetween and formed unitarily therewith. In the illustrated embodiment, flexible element 242 includes a receiving portion 242a that receives an actuating device (not shown in FIGS. 31 and 32) therein such that one end of the actuating device engages and acts against a base actuating portion 242b and the other end of the actuating device engages and acts against an opposite actuating portion 242c. Flexible element or portion 242 further includes ribs or arms or structures 242d that extend between the upper and lower plates or members and that extend from the actuating portion 242c. As can be seen with reference to FIG. 32, extension of the actuating device causes actuating portion 242c to be moved away from actuating portion 242b, which, in turn causes flexing of the flexible arms to impart a greater stroke at the upper plate 240a than the stroke of the actuating device. Various structures or arrangements, of flexible arms or elements or ribs may be utilized to provide an increase or amplification of the stroke of the actuating device while providing a reduction in the force output of the upper plate at the window panel as compared to the force output by the actuating device, while remaining within the spirit and scope of the present invention.

Optionally, the actuating device and exciter assembly may include a preloading element to preload or bias the engaging elements of the actuating device (such as engaging elements 146 of the actuating device 136) inward or toward one another so as to apply a force toward each end of the actuating device. In the illustrated embodiment, the biasing element or preloading element comprises a curved spring element or biasing element 150 (FIG. 33) that is attached or affixed to a respective side of each of the engaging elements 146. For example, the biasing element 150 may be adhesively affixed to the engaging elements or mechanically affixed to the engaging elements or otherwise affixed or attached to the sides of the engaging elements. Thus, the upper and lower plates and engaging elements and biasing elements function to substantially encompass or contain or "box-in" the actuating device to assist in securing the actuating device in the appropriate orientation (with its actuating forces being longitudinally directed along and generally parallel to the upper and lower plates) during operation of the actuating device.

Figure 33:
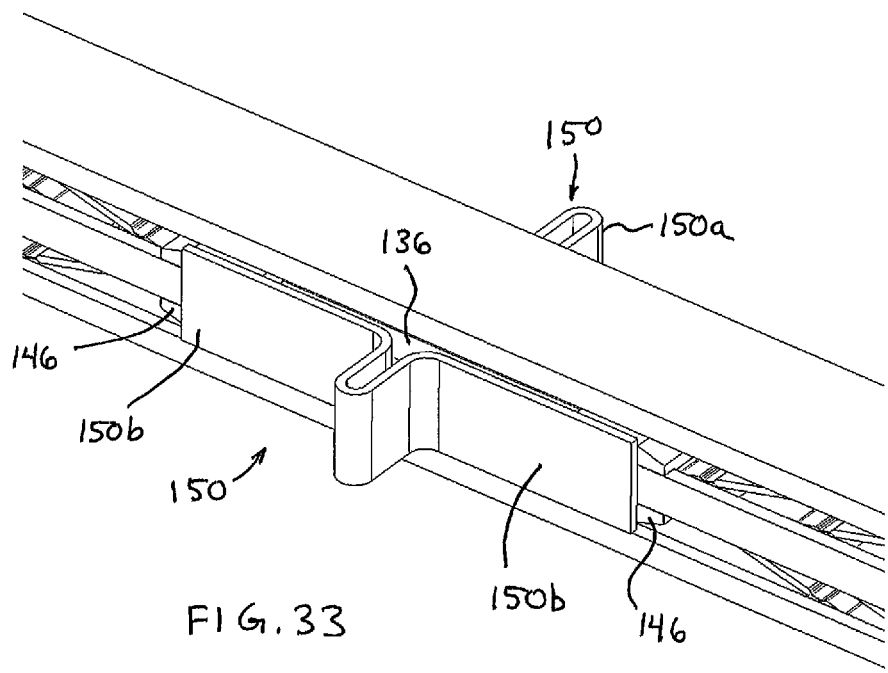
FIG. 33 is a perspective view of another actuating device and exciter suitable for use with the acoustic window assembly of the present invention, shown with a biasing element along the actuator.

The biasing element may be configured such that when it is affixed to the engaging elements at the actuating device 136, the biasing element 150 urges the engaging elements 146 toward one another and toward and into engagement with the ends of the actuating device. For example, the biasing element may initially be extended or stretched (such as by inserting a spacer or shim within the curved portion 150a of the biasing element) when its attaching ends 150b are affixed to the engaging elements 146, whereby removal of the spacer or shim (such as after the adhesive cures or after the attaching ends are otherwise secured to the engaging elements) allows the biasing element to flex inward and pull at the engaging elements to preload the actuating device. Optionally, one biasing element may be implemented along a selected side of the exciter assembly, but it is desirable that a second biasing element (such as shown in FIG. 33) be similarly mounted to or affixed to the engaging elements at the other side of the actuating device to provide balanced biasing of the engaging elements toward one another.

Figure 34:
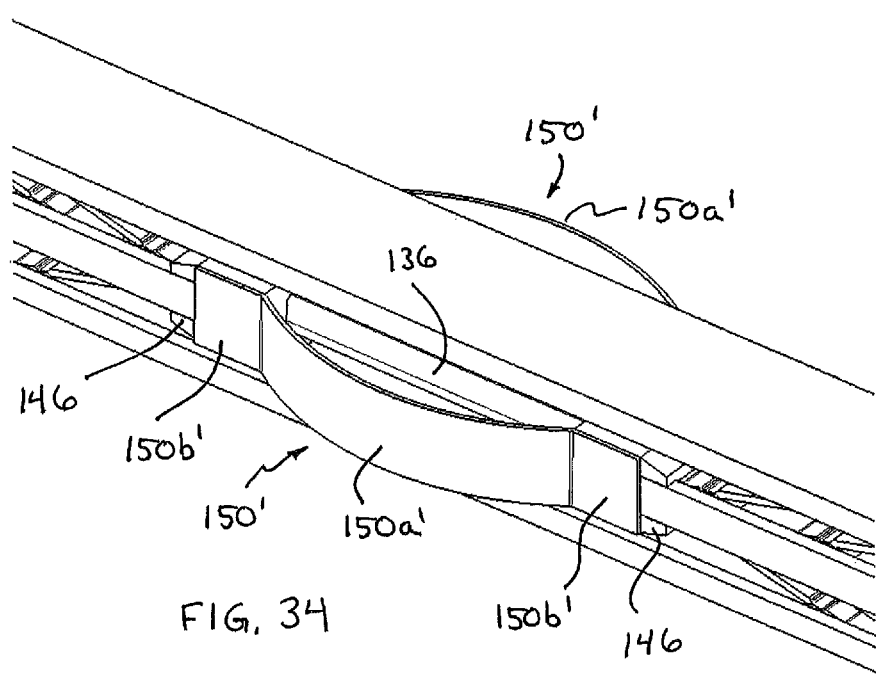
FIG. 34 is a perspective view of another actuating device and exciter suitable for use with the acoustic window assembly of the present invention, shown with a spring element along the actuator.

Although shown and described as having a small curved portion 150a and elongated mounting portions or attaching ends 150b, other configurations of biasing elements may be implemented depending on the particular application of the window system. For example, and with reference to FIG. 34, a biasing element 150' may comprise opposite mounting portions or attaching ends 150b' and an arcuate-shaped central portion 150a' extending substantially along the length of the actuating device. Other sized or shaped spring elements or curved portions of a biasing element may be suitable for biasing or preloading the actuating device, while remaining within the spirit and scope of the present invention.

The biasing element or spring is intended to insure a preload on the piezo actuating device throughout the functional cycle of the actuating device and to provide longitudinal stiffness and structural rigidity to the piezo actuating device assembly. The biasing elements thus maintain compression on the actuating device at the ends of the actuating device during the range of extension and refraction of the actuating device. The biasing elements and engaging elements and upper and lower attachment plates or elements generally surround the actuating device to assist in maintaining longitudinal alignment of the actuating device during operation of the actuating device. The actuating device, which may otherwise generally float between the engaging elements, is thus retained generally in its longitudinal orientation during operation, and any tilting of the actuating device during operation may be limited or substantially precluded by the presence of the engaging elements and biasing elements (so that the forces exerted by the actuating device during operation of the actuating device are directed longitudinally along the exciter assembly and not angled or canted or misaligned due to tilting of the actuating device).

Figure 35:
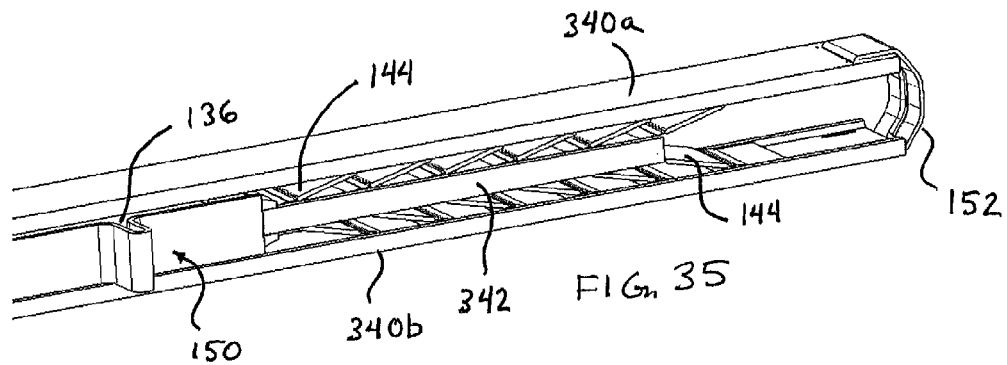
FIGS. 35-38 are perspective views of other actuating devices and exciter assemblies suitable for use with the acoustic window assembly in accordance with the present invention.

Optionally, the exciter assembly may include a spring element or biasing element or tensioning element at the end or ends of the exciter assembly distal from the actuating device, to bias or urge the exciter assembly toward its compressed state. For example, and as shown in FIG. 35, a biasing element 152 may be disposed at the ends of the upper plate 340a and lower plate 340b of an exciter assembly 310 to urge the upper and lower plates toward one another, whereby actuation of the actuating device 136 pushes against the center plate or rod 342 to expand or separate the upper and lower plates (via the diagonals or ribs 144), such as in a similar manner as discussed above. In the illustrated embodiment, the biasing element 152 comprises an arcuate metallic element that is attached to the ends of the upper and lower plates.

Figure 36:
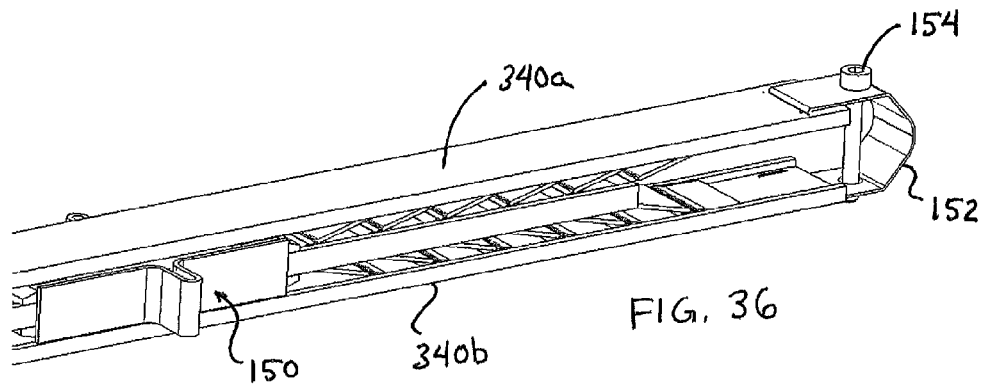

Optionally, the degree of tension of the biasing element and/or the degree of movement of the upper plate relative to the lower plate may be selectively set or adjusted to achieve the desired functionality of the actuating assembly. For example, and with reference to FIG. 36, the biasing element 152 may include a threaded fastener or adjuster 154 therethrough. The threaded fastener 154 may be rotated to adjust the range of motion of the upper plate 340a relative to the lower plate 340b and/or to adjust the degree of tension applied by the biasing element 152.

The springs or biasing elements on either end of the exciter assembly may limit or inhibit rocking of the exciter assembly (where one side or end may be moving upward while the other side or end is moving downward). Desirably, the exciter assembly functions with the upper and lower beams or plates remaining parallel or substantially parallel throughout the operating cycle. Allowing for tightening or adjusting of the biasing elements or springs allows for inducing a pre-load into the piezoelectric actuator (such as in a similar manner as biasing element 150, discussed above). For example, as the springs are tightened, the exciter will exert more load back into the piezoelectric actuator, and as the springs are loosened, the preload will be relieved. This may allow for enhanced tuning or adjustment of the preload level in the exciter assembly depending on the particular application of the actuator assembly.

Figure 37:
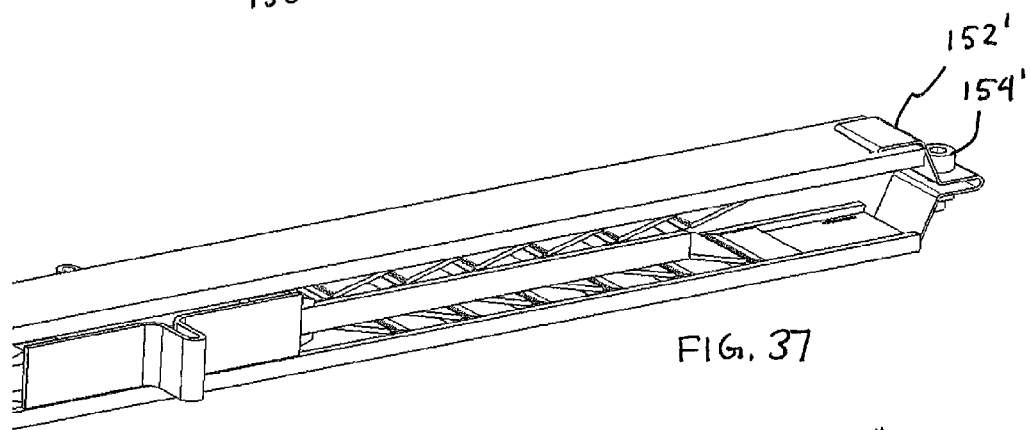
Figure 38:
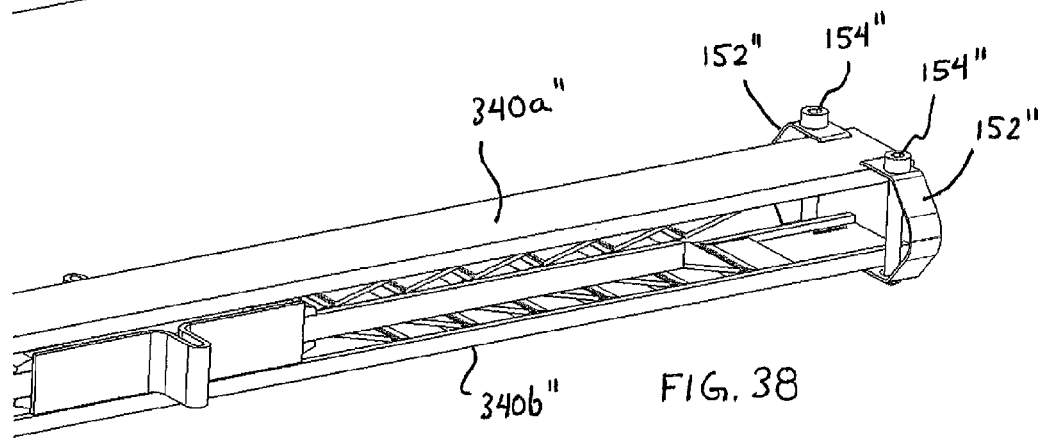

Optionally, it is envisioned that other forms of biasing elements may be implemented along or at the ends of the upper and lower plates. For example, a biasing element 152' may have an adjuster 154' as shown in FIG. 37. Optionally two or more biasing elements 152" (FIG. 38) may be disposed at respective ends of the upper and lower plates 340a", 340b", with each biasing element 152" having a respective adjuster 154". As shown in FIG. 38, the biasing element or elements may be disposed along the upper and lower plates inboard of the outer ends of the plates. Other biasing element and/or adjuster configurations may be implemented while remaining within the spirit and scope of the present invention.

Although shown and described as having a piezoelectric actuator that pushes against the center rod to impart a movement of the upper plate away from the lower plate (via movement and/or flexing of the diagonal ribs), it is envisioned that the actuating assembly may otherwise impart movement of the upper plate away from and toward the lower plate, while remaining within the spirit and scope of the present invention. For example, and with reference to FIGS. 39A and 39B, an exciter device 438 includes an upper plate 440*a*, a lower plate 440*b* and a center rod or plate 442 interconnected by a plurality of ribs 444 (such as ribs similar to ribs 144 discussed above). The center plates 442 may attach to or extend from a central actuating housing or support structure 445 that substantially supports and/or encompasses the actuating device (such as a piezoelectric actuator or the like).

In the illustrated embodiment, the ribs 444 are arranged in a generally opposite direction as ribs 144 (discussed above) are arranged, so that the upper plate is moved away from the lower plate when the actuating device is retracted and is moved toward the lower plate when the actuating device is extended. The exciter device may otherwise be substantially similar to the exciter devices discussed above (and optionally may include one or more biasing elements at the side or sides or ends of the upper and lower plates, such as discussed above), such that a detailed description of the exciter devices and actuating assemblies need not be repeated herein.

Thus, the exciter assemblies of the present invention provide a rigid interface element or member disposed at and secured or adhered or bonded to the window panel to provide a substantially uniform vibratory force at the window panel. The exciter assembly is formed to provide an increased stroke as compared to the stroke of the actuating device. Optionally, the exciter assembly may translate or convert a longitudinal force and stroke along a longitudinal axis of the exciter assembly to a generally transverse force and stroke in a direction generally transverse to the longitudinal axis of the exciter assembly, and thus generally normal to the plane or surface of the window panel at the location at which the upper member or plate is secured to the inner surface of the window panel. Thus, the exciter assembly of the present invention is configured to provide a substantially uniform vibratory motion and force at the inner surface of a perimeter region of a window panel in response to a pulsation output of an actuating device, such as a piezoelectric actuating device or the like.

In the illustrated embodiments, the actuating assemblies are configured for attaching to a lower perimeter portion or region of a rear window or backlite of a vehicle so as to vibrate the rear window or backlite at the desired frequencies. Optionally, the actuating assembly may be adapted or configured for application at one or more other windows of a vehicle, such as, for example, a side window or side fixed window of the vehicle or a sunroof or moonroof of the vehicle or a rear window of a station wagon or van or minivan or SUV or the like (where the window and actuating assembly may be part of a rear door or liftgate or tailgate of the vehicle) or a windshield of the vehicle, while remaining within the spirit and scope of the present invention. Optionally, it is envisioned that aspects of the present invention may be utilized for other vehicle panels and/or may be utilized on non-vehicular glass or window panel applications or non-vehicular panel applications.

Optionally, the window assembly may be installed in the vehicle as a module or unit (including the window panel and actuating assembly and perimeter frame/seal portions) or the acoustical window assembly or system may be delivered to a vehicle assembly plant as components where the components may be assembled at the assembly plant or facility. Optionally, for example, the actuating assemblies (including the actuating device and exciter device or assembly) and the perimeter frame or seal may be mounted to a carrier that may be installed into the vehicle as a separate part during one assembly process, and with the window panel being installed as a separate assembly process, such as, for example, with the window panel being installed in a similar manner as currently done with conventional windows.

Figure 40:
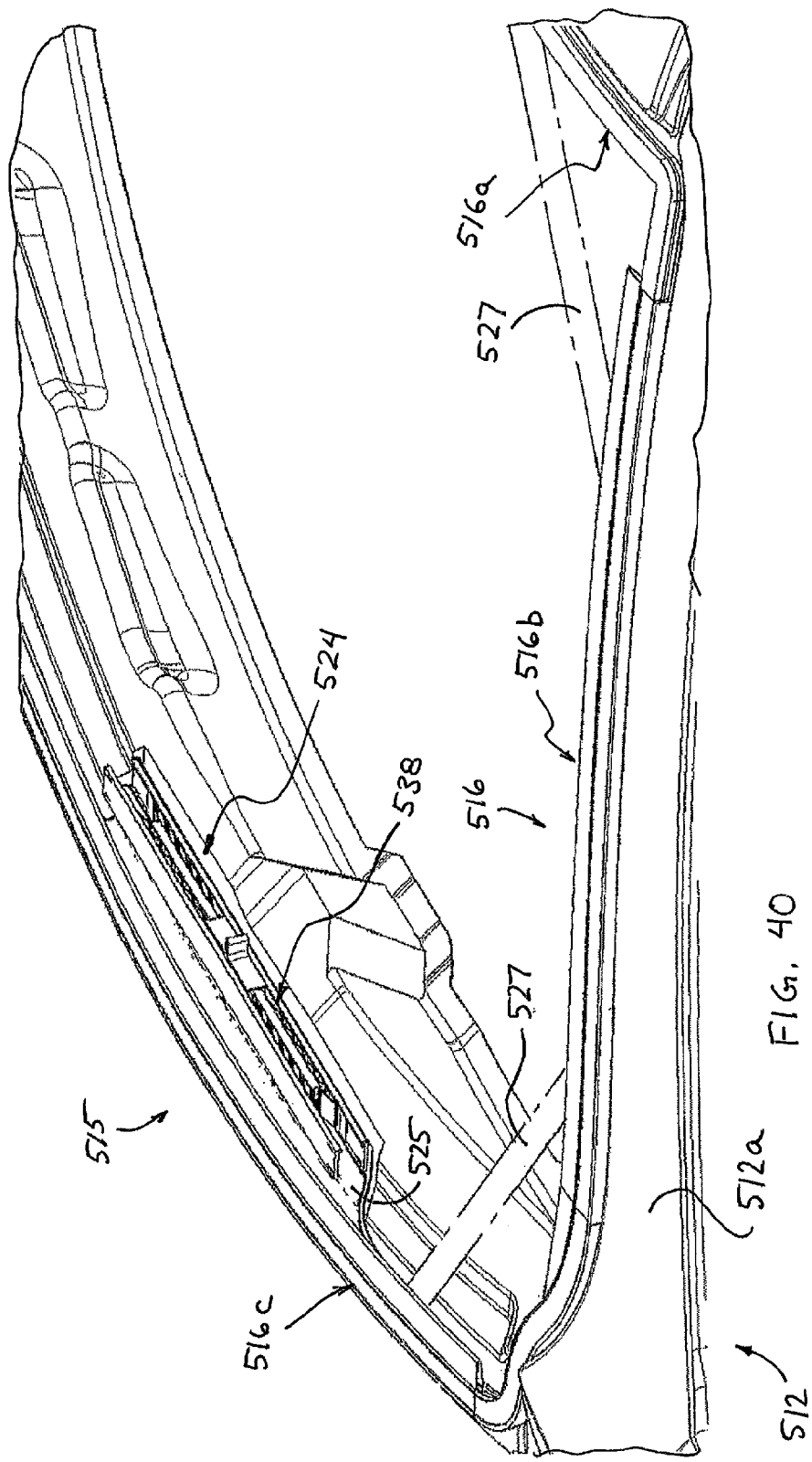
FIG. 40 is a perspective view of an actuating assembly and seal module that is mountable to the sheet metal or frame of a vehicle, such as for a windshield of the vehicle.
Figure 41:
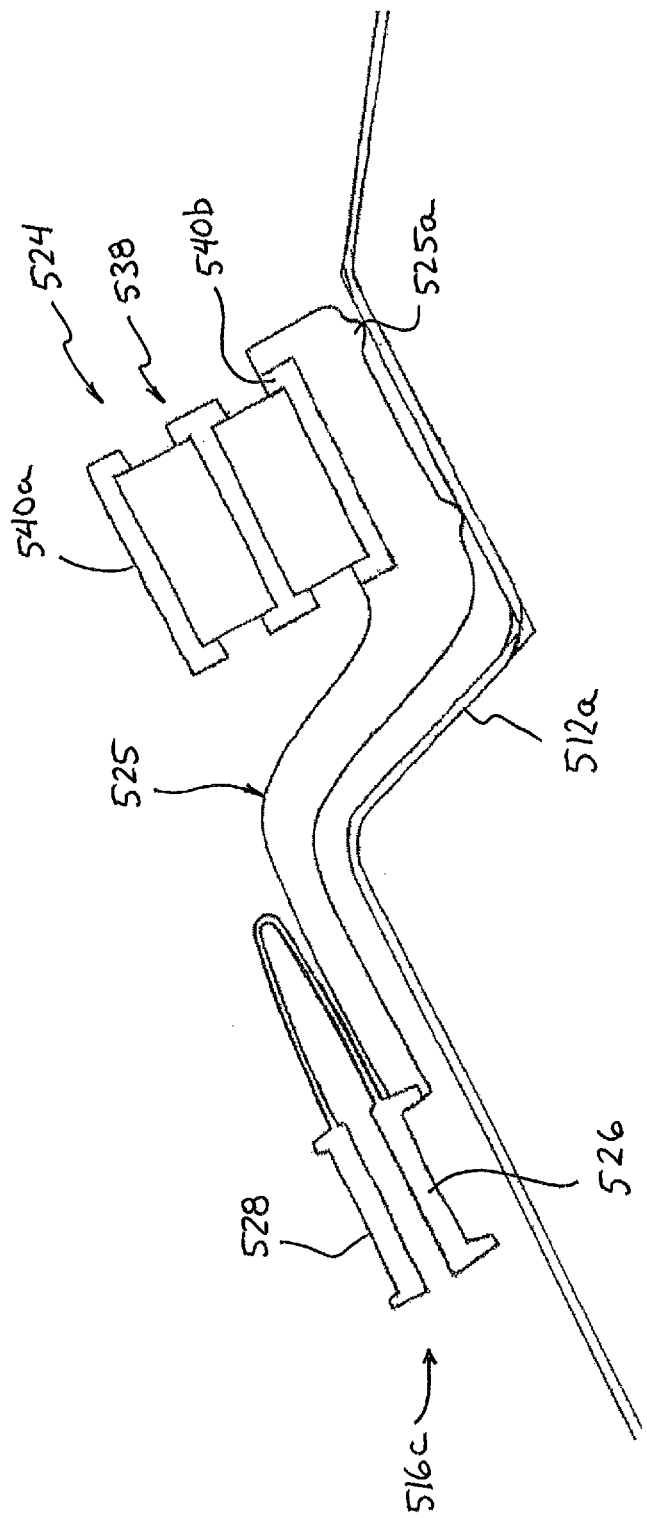
FIG. 41 is a side elevation of a portion of the actuating assembly and seal module of FIG. 40.

For example, and with reference to FIGS. 40-42, an acoustic windshield assembly 510 may include a modular actuating assembly or device 515 that is mountable or attachable to the vehicle frame or structure 512*a* of a vehicle 512, such as a frame or structure 512*a* at a forward end of the vehicle cabin for supporting the windshield 514 of the vehicle 512. The modular actuating assembly 515 includes a frame portion 516, one or more actuating assemblies 524 and a carrier element or support element 525 that mounts the actuating assembly or assemblies 524 to or at the frame portion 516. Frame portion 516 includes an upper frame portion or mounting portion 516*a* for generally fixedly mounting the upper perimeter portion of the window panel or windshield to the vehicle sheet metal and a pair of side frame portions or mounting portions 516*b* and a lower frame portion or mounting portion 516*c* for movably or vibratably mounting the side and lower portions of the window panel or windshield to the vehicle sheet metal.

In the illustrated embodiment, the carrier element 525 is disposed along the lower frame portion 516*c* and locates the actuating assembly 524 (including the exciter assembly 538 and actuating device or piezoelectric actuator) at or near the lower perimeter region of the windshield and at a location at or near the dashboard that is not readily viewable by a person viewing the windshield of the vehicle. The carrier element may be adhered to or bonded to or otherwise affixed to the mounting portion 526 (FIG. 41) of the lower frame portion 516*c* or may be integrally molded with the mounting portion of the lower frame portion 516*c*. As shown in FIG. 41, the carrier element 525 may extend from the frame portion 516*c* and may be adhered or mounted to the vehicle structure 512*a*, and may include one or more projections or stand-offs 525*a* for spacing a bonding surface of the carrier element a desired or appropriate distance from the vehicle structure for enhancing the bond between the adhesive and the frame portion and vehicle structure. The lower plate 540*b* of exciter assembly 538 may be attached to or received in or otherwise affixed relative to the carrier element 525 to secure the exciter assembly to the carrier element and thus to the vehicle structure when the carrier element is mounted to the vehicle structure.

The modular actuating device 515 thus is attachable or mountable to a vehicle frame or sheet metal or structure. After the modular actuating device 515 is secured to the vehicle structure, the window panel or windshield 514 (as shown in FIG. 42) may be adhered to or bonded to or mounted to the outer attachment elements 528 of the frame portion 516 and the outer or upper plate or plates 540*a* of the exciter assembly 538 to seal the windshield to the vehicle and to the actuating device 515. The exciter assembly and actuating device and frame portions may otherwise be substantially similar to those described above such that a detailed discussion of the exciter assemblies and actuating devices and frame portions need not be repeated herein.

Thus, the modular actuating device 515 may be readily attached or adhered or fastened to the vehicle frame or sheet metal at the automobile assembly plant, such as by dispensing a bead of adhesive at the vehicle structure and/or at the mounting portions 526 of the frame portions and at the carrier element 525 and affixing the frame portion 516 and carrier element 525 to the vehicle structure. Optionally, the modular actuating device 515 may include reinforcement elements 527, such as cross members or corner members or the like, for providing enhanced structural rigidity to the assembly or device prior to and during installation of the modular actuating device 515 at the vehicle structure. The reinforcement elements 527 may be molded with the frame portions or attached thereto, and may be readily removed from the frame portions after the modular actuating device is installed or attached to the vehicle structure. After the modular device is adhered or attached to the vehicle structure and the reinforcement elements have been removed from the module, the window or windshield may be attached or adhered to the frame portions and exciter assembly, such as in a similar manner as described above.

For applications at the vehicle windshield, it is preferred to limit outward movement of the windshield to meet impact requirements for vehicles. Thus, an impact limiting element or outward movement element may be implemented at the windshield (such as at the lower portion or lower corners of the windshield) to allow for movement or pulsing or vibrating of the windshield while limiting outward movement of the windshield when the windshield is impacted by an object moving forwardly with respect to the vehicle. Such an impact limiting element may be attached to either the windshield or the vehicle frame or sheet metal and movably attached to the other of the windshield or vehicle frame or sheet metal so as to allow for relative movement between the windshield and vehicle frame while limiting outward movement of the windshield relative to the vehicle frame, such as by utilizing aspects of the elements described in PCT Application No. PCT/US2006/040100, filed Oct. 12, 2006, which is hereby incorporated herein by reference in its entirety.

Thus, the present invention provides an acoustical window assembly for a vehicle, and may be implemented at a front windshield or rear window or fixed side window or fixed side door window or sunroof or moonroof of the vehicle. The acoustical window assembly and actuating device is operable to vibrate the window panel of the window to produce audible sound so as to replace or supplement one or more speakers of the vehicle. The acoustical window assembly of the present invention may be operable to achieve high Sound Pressure Levels (SPL) for relatively low acoustic strength with a reduced stroke or travel of the window panel during operation of the actuating device. For example, the present invention, when implemented and tested on an exemplary vehicle windshield, has been unexpectedly found to be capable of achieving an SPL of about 110 dB at about 30-120 Hz and, for an acoustic windshield (given an area of about 0.6 m2), may be capable of achieving such an SPL with a stroke of about 300-400 µm or thereabouts. Such a small degree of stroke or travel of the window panel is not readily discernible to a person viewing the window panel or windshield during operation of the sound system of the vehicle. Also, the functionality and sound quality of the window assembly is not substantially adversely effected by contact of an object or person's hand or the like against the vibrating window panel or windshield.

Accordingly, the actuating assembly of the acoustic window assembly of the present invention utilizes a mechanical exciter or amplifying device to excite or vibrate the window panel in the desired direction and at a desired force and degree of vibration in response to the output of the piezoelectric actuating device. The mechanical exciter provides a substantially rigid interface member or plate that acts against the window panel along a portion or region of the window panel and at a lower region of the window panel so that the actuating assembly may be located at a region where it is not readily viewable by a person viewing the window panel from inside or outside of the vehicle cabin.

Thus, the present invention provides for use of the existing large, double-curved glass (or other suitable materials) substrates or surfaces (such as a curved windshield or rear backlite or side window or the like) in a vehicle as loudspeaker membranes. The actuating assembly functions to excite or vibrate the panel with an actuator using a piezo-ceramic driver mounted at the rim (or belt-line) of the window panel. Installation of the actuating device thus may require a reduced volume or small volume compared to other known systems for low frequency sound production. Also, a high efficiency can be achieved by the use of the piezo material and the good vibro-acoustic coupling achieved by the acoustic window assembly of the present invention.

The performance of the acoustic window assembly of the present invention is not so highly dependent on the precise location of the actuating assembly at the vehicle window panel, such that elongated actuators may be set in the general or desired position along the window panels. The present invention thus enables the acoustic window assemblies to be manufactured in production quantities without requiring testing of each individual window assembly to determine if the actuating assembly is attached to the window panel at a precise location requirement (such as a central region of the panel as is typically required for prior art vibrating panels). The size and spacing of the actuating assembly and mechanical exciter are selected so as to provide the desired degree of force and stroke at the window panel so as to provide the desired or appropriate frequency of vibration of the window panel as dictated or driven by the audio system of the vehicle, without moving the window panel beyond the limitations or constraints of the window frame portion and/or the vehicle frame.

Therefore, the present invention provides an acoustic window assembly for a vehicle that substantially uniformly vibrates the window panel (with substantially non-flexing or non-bending vibration via the substantially rigid interface members or elements or plates) while substantially sealing the window panel at the vehicle. The present invention provides an enhanced acoustical device for a vehicle sound system that utilizes a glass panel or window panel of a vehicle and thus does not interfere with the interior space of the vehicle cabin and/or other space at the cabin that may be utilized for other vehicle components or the like. The actuating assembly of the acoustic window assembly of the present invention includes an actuating device, such as a piezoelectric actuating device or the like, and a mechanical exciter, which engages the window panel and transfers the pulse of the actuating device along a region of the window panel (and via a substantially rigid interface member or plate to limit or substantially preclude non-uniform forces and vibrations at the window panel) to spread out the forces and movements/pulses at the window panel.

Because the acoustic window assembly of the present invention utilizes the existing window panel of the vehicle and may replace or supplement one or more speakers and/or subwoofers of a vehicle sound system, the acoustic window assembly may achieve a reduction in the weight of the vehicle, since the addition of the actuator assembly is more than offset by the reduction or removal of one or more speakers and/or subwoofers of the sound system. The acoustic window assembly of the present invention thus may provide a weight reduction and may require reduced space, and may require reduced power to operate, while providing enhanced performance of the acoustic window assembly and enhanced sealing of the window panel at the vehicle.

Changes and modifications to the specifically described embodiments may be carried out without departing from the principles of the present invention, which is intended to be limited only by the scope of the appended claims as interpreted according to the principles of patent law.

The invention claimed is:

1. A window assembly for a vehicle, said window assembly comprising:
   a window panel, said window panel having a first perimeter region and a second perimeter region, said window panel having an innermost surface and an outermost surface, said innermost surface facing a cabin of the vehicle and said outermost surface exposed at the exterior of the vehicle when said window panel is mounted to a vehicle structure;
   a first mounting portion for mounting said first perimeter region of said window panel to the vehicle structure, said first mounting portion substantially fixedly mounting said first perimeter region of said window panel relative to the vehicle structure;
   a second mounting portion for mounting said second perimeter region of said window panel to the vehicle structure, said second mounting portion including a flexible element to allow for movement of said second perimeter region of said window panel toward and away from the vehicle structure, wherein said flexible element comprises at least one elongated generally U-shaped flexible element attached at said innermost surface and disposed between said innermost surface of said window panel and the vehicle structure; and
   an actuating assembly, said actuating assembly being positioned at an actuating region of said window panel generally at or proximate said second perimeter region, said actuating assembly having a substantially rigid interface element engaging said actuating region of said window panel, said actuating assembly being operable to vibrate said window panel via vibration of said substantially rigid interface element relative to the vehicle structure.

2. The window assembly of claim 1, wherein said vibration of said window panel generates audible sounds when said actuating assembly is operated.

3. The window assembly of claim 2, wherein said window panel is vibrated at a frequency between about 20 Hz and 200 Hz when said actuating assembly is operated.

4. The window assembly of claim 1, wherein said actuating region is between said first perimeter region and said second perimeter region of said window panel.

5. The window assembly of claim 1, wherein said actuating region is spaced from said first perimeter region of said window panel.

6. The window assembly of claim 1, wherein said second mounting portion comprises a window attaching element for attaching to said innermost surface at said second perimeter region of said window panel and a vehicle attaching element for attaching to the vehicle structure, said flexible element being disposed between said window attaching element and said vehicle attaching element to allow movement of said window attaching element in a direction toward and away from said vehicle attaching element while limiting movement of said window attaching element in a direction along said vehicle attaching element.

7. The window assembly of claim 6, wherein said flexible element comprises a generally U-shaped metallic element extending along and between said attaching elements, with one leg of said generally U-shaped metallic element attached at said window attaching element and the other leg of said generally U-shaped metallic element attached at said vehicle attaching element.

8. The window assembly of claim 1, wherein said window panel comprises one of a rear window of a vehicle, a windshield of a vehicle, a side window of a vehicle, a side door window of a vehicle, a liftgate window of a vehicle, a moonroof of a vehicle and a sunroof of a vehicle.

9. The window assembly of claim 1, wherein said window panel comprises one of a rear window of a vehicle, a rear liftgate window of a vehicle, a windshield of a vehicle, a side window of a vehicle, and a side door window of a vehicle, and wherein said first perimeter region of said window panel comprises an upper perimeter region of said window panel and wherein said actuating assembly is disposed at or near a lower perimeter region of said window panel.

10. The window assembly of claim 1, wherein said actuating assembly comprises a piezoelectric actuator that is operable to vibrate said actuating region of said window panel.

11. The window assembly of claim 10, wherein said piezoelectric actuator is operable to excite an exciter device that converts the vibration of said piezoelectric actuator to a desired vibration or movement at said window panel.

12. The window assembly of claim 11, wherein said exciter device comprises said substantially rigid interface element and a substantially rigid mounting element for substantially fixedly securing a base portion of said exciter device to the vehicle structure.

13. The window assembly of claim 12, wherein said piezoelectric actuator is oriented to impart movement in a direction generally along a surface of said actuating region of said window panel and said exciter device imparts movement in a direction generally normal to said surface of said actuating region of said window panel in response to actuation of said piezoelectric actuator.

14. The window assembly of claim 13, wherein said exciter device comprises a plurality of ribs arranged diagonally between a movable rod and said substantially rigid interface element and said substantially rigid mounting element.

15. The window assembly of claim 14, wherein said ribs comprise narrowed sections to facilitate flexing of said ribs during operation of said piezoelectric actuator.

16. The window assembly of claim 15, wherein said ribs have end sections generally parallel to said movable rod and said substantially rigid interface element and said substantially rigid mounting element, and wherein said ribs have bend portions at a junction between said end sections and a center section that is diagonal to said movable rod and said substantially rigid interface element and said substantially rigid mounting element, and wherein said narrowed sections are established at said center section and remote from said bend portions.

17. The window assembly of claim 16, wherein said narrowed sections are established via at least one of (a) chemical milling and (b) photo etching.

18. The window assembly of claim 11, wherein said exciter device includes at least one biasing element that exerts a preload force at opposite ends of said piezoelectric actuator.

19. The window assembly of claim 1, wherein said generally U-shaped flexible element is disposed at said innermost surface of said window panel and does not overlap said outermost surface of said window panel.

20. The window assembly of claim 1, wherein a first leg of said generally U-shaped flexible element is attached at said innermost surface of said window panel and a second leg of said generally U-shaped flexible element is attached at the vehicle structure.

* * * * *